United States Patent [19]
Pike et al.

[11] Patent Number: 5,089,782
[45] Date of Patent: Feb. 18, 1992

[54] VECTOR NETWORK ANALYZER FOR SWEPT FREQUENCY HARMONIC AND MIXER CONVERSION LOSS MEASUREMENTS USING EITHER AN INTERNAL OR EXTERNAL SIGNAL SOURCE

[75] Inventors: William T. Pike; David D. Sharrit; Barry A. Brown, all of Santa Rosa, Calif.

[73] Assignee: Hewlett-Packard Company, Palo Alto, Calif.

[21] Appl. No.: 547,891

[22] Filed: Jul. 2, 1990

Related U.S. Application Data

[63] Continuation of Ser. No. 327,284, Mar. 22, 1989, abandoned.

[51] Int. Cl.$^5$ .................................. G01R 27/28
[52] U.S. Cl. ........................ 324/623; 324/620; 324/615; 324/612
[58] Field of Search ............... 324/612, 613, 615, 616, 324/620, 623, 650, 624

[56] References Cited

U.S. PATENT DOCUMENTS

| | | | |
|---|---|---|---|
| 3,371,273 | 2/1968 | Alford | 324/57 R |
| 3,624,494 | 11/1971 | Turan | 324/653 |
| 3,859,607 | 1/1975 | Brazelton | 324/57 SS X |
| 3,990,004 | 11/1976 | Newton | 324/615 X |

*Primary Examiner*—Jack B. Harvey
*Attorney, Agent, or Firm*—William C. Milks, III

[57] ABSTRACT

A vector network analyzer for performing swept frequency measurements on non-linear RF devices, using either an internal or external signal source. This simplifies and speeds linear and non-linear amplifier and mixer measurements, such as impedance, amplifier gain, and mixer conversion loss, on the one hand, and measurement of harmonics, on the other hand.

20 Claims, 58 Drawing Sheets

FIG 3B

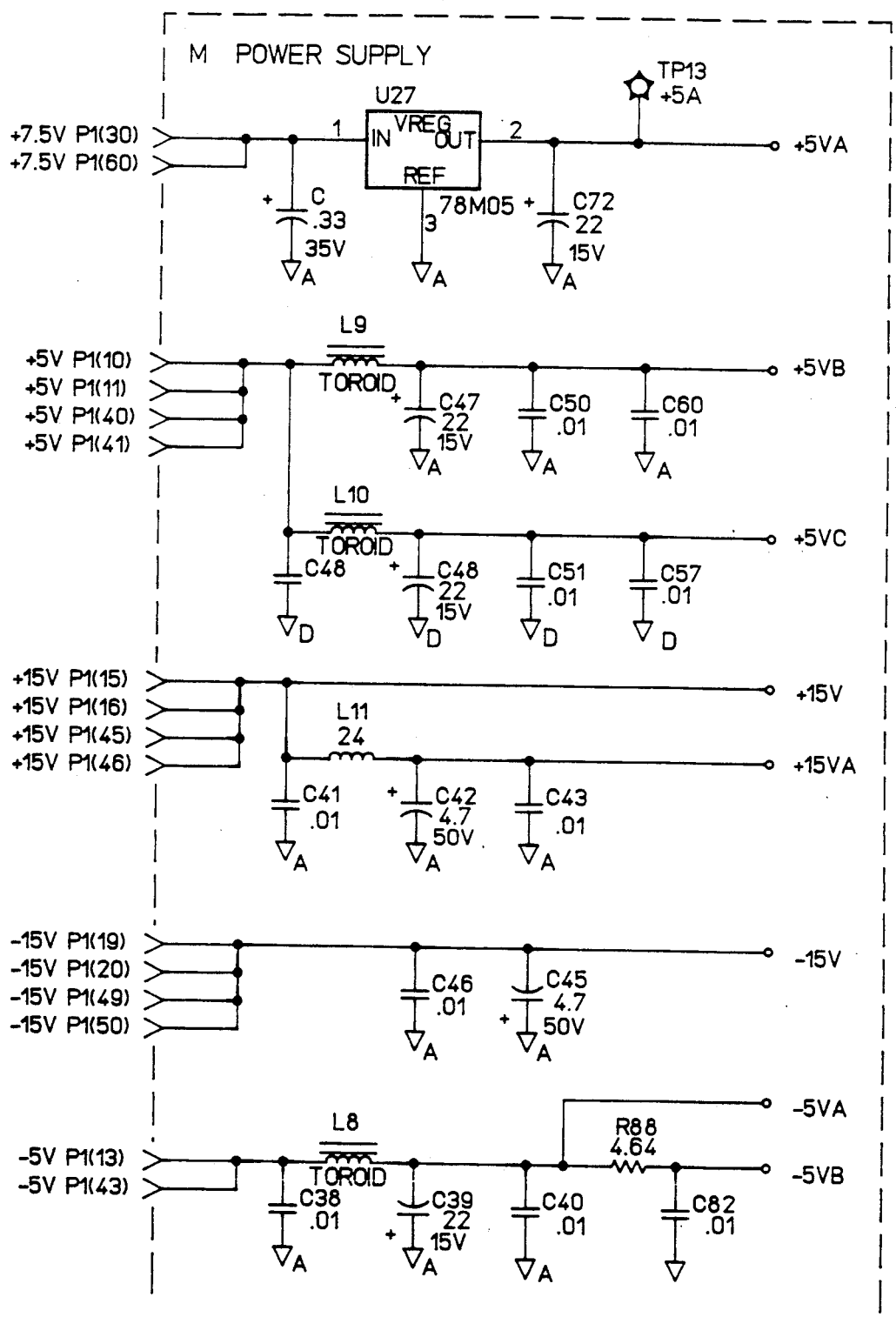
FIG 3B.11

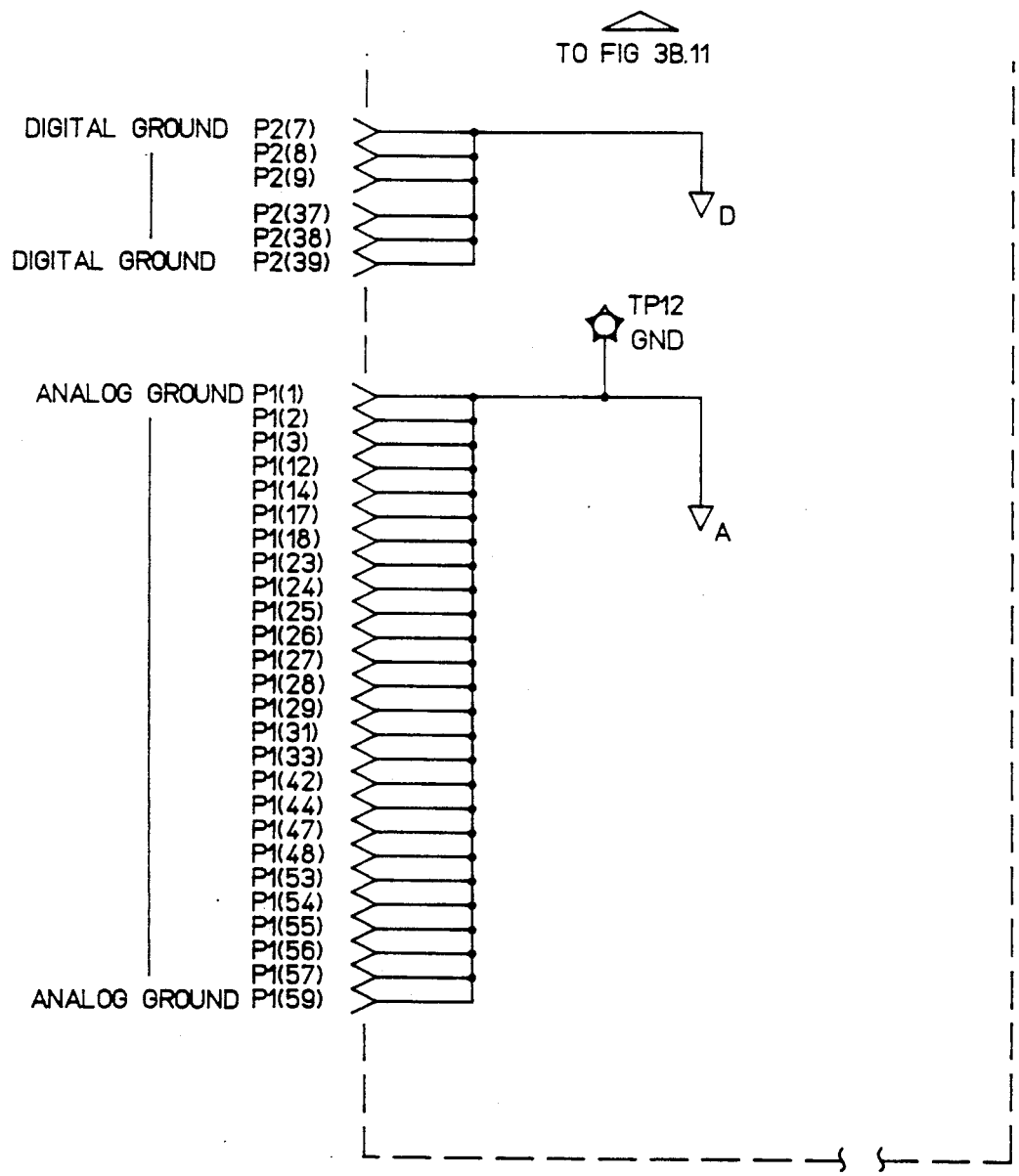
FIG 3B.12

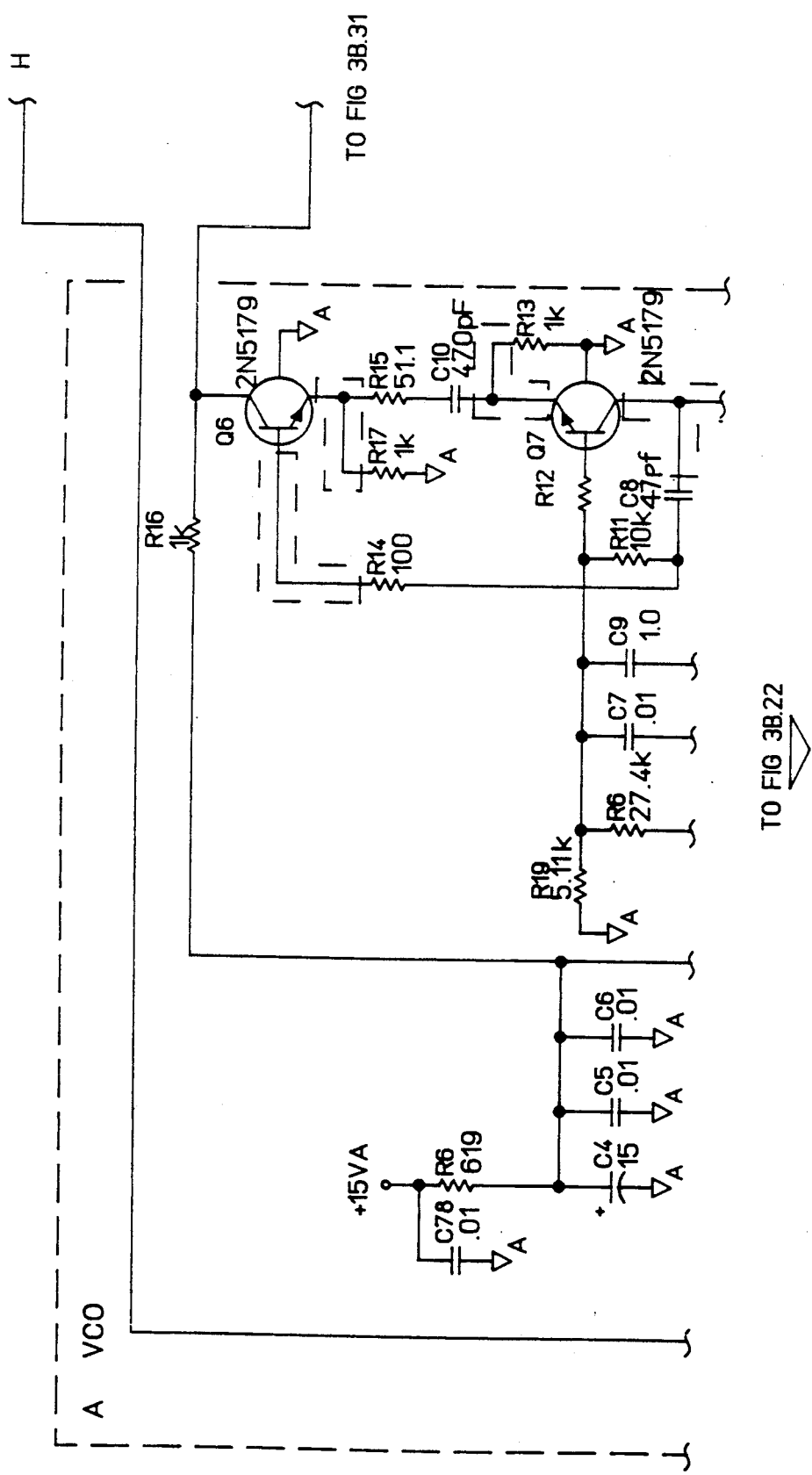
FIG 3B.21

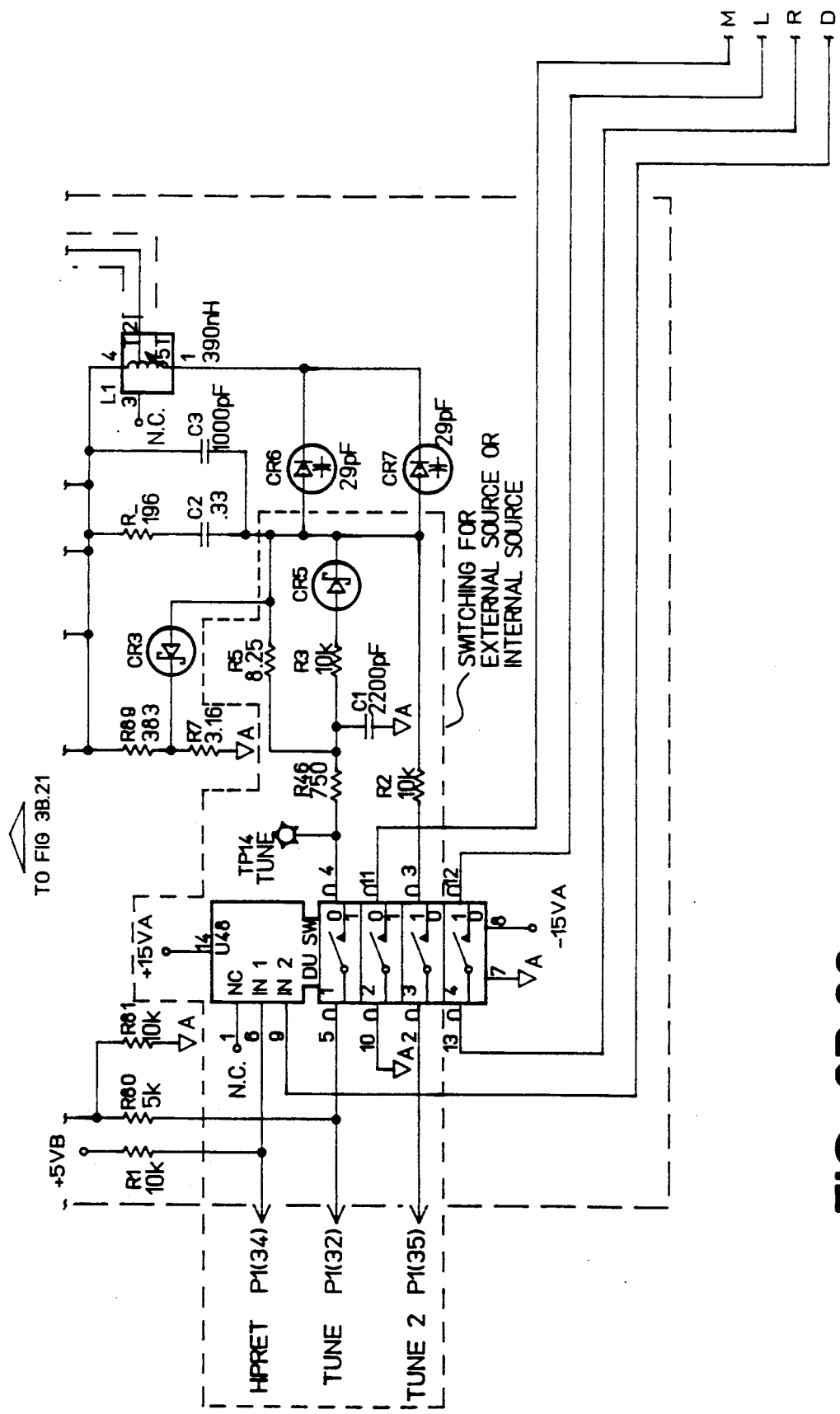
FIG 3B.22

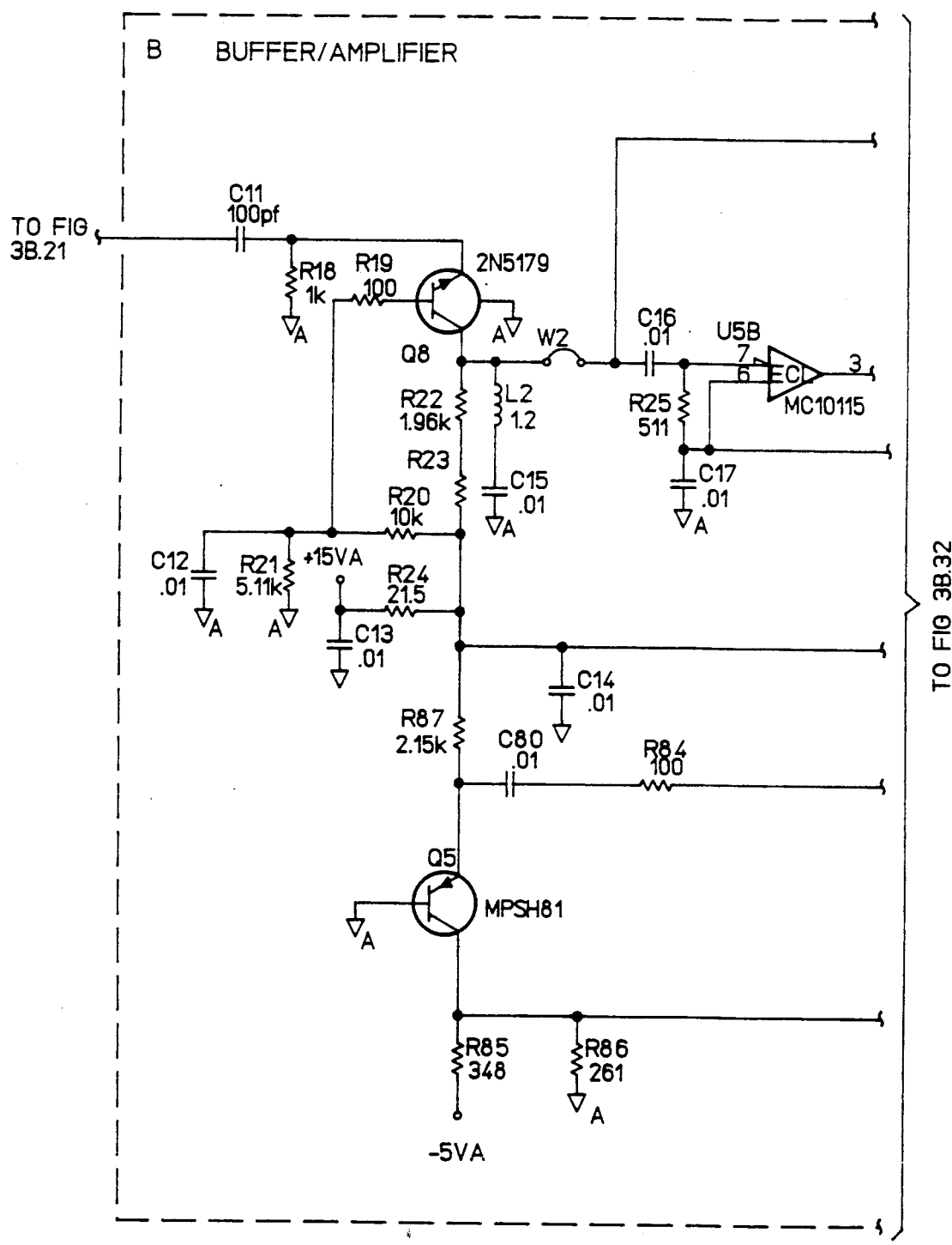
FIG 3B.31

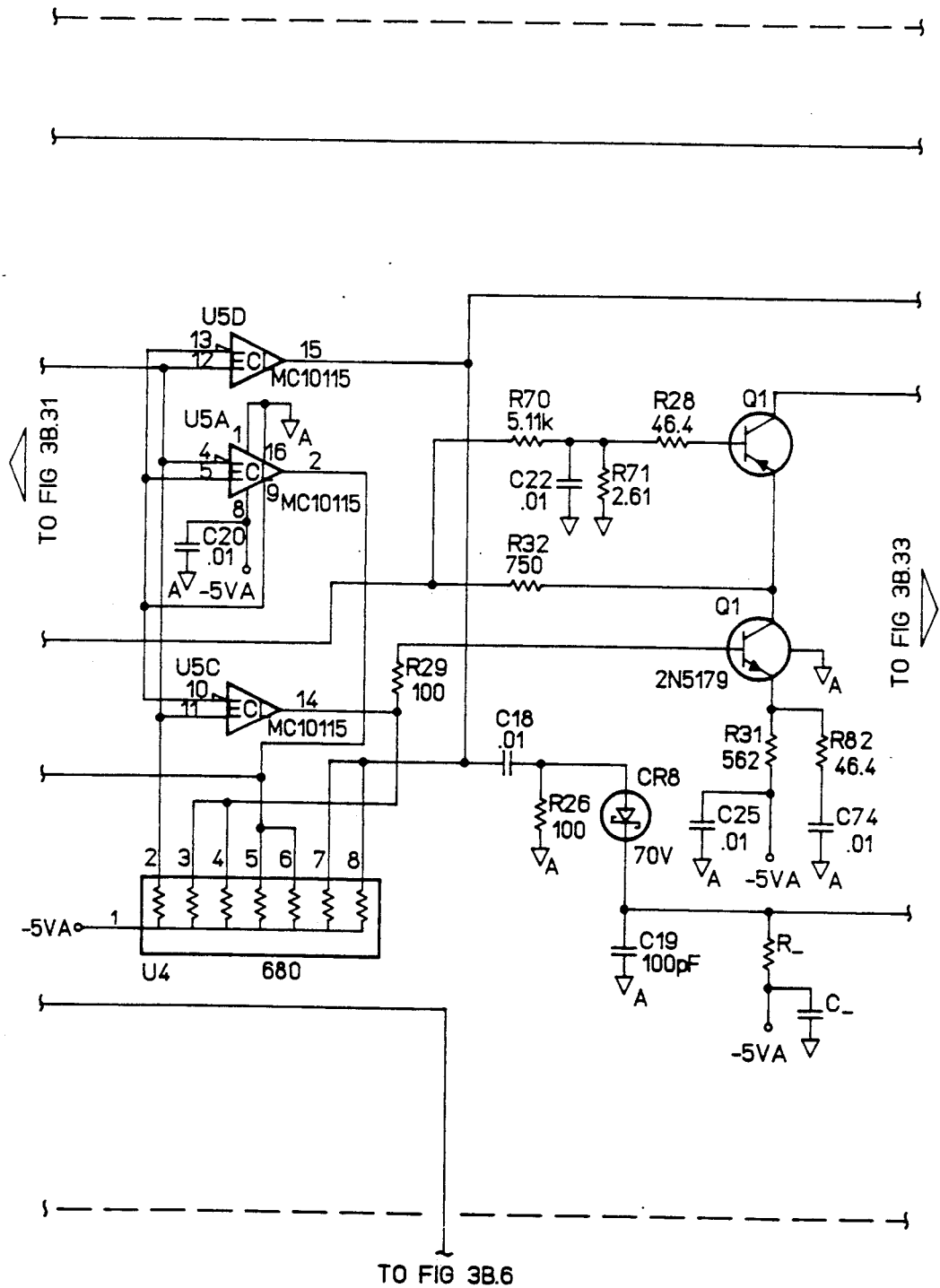
FIG 3B.32

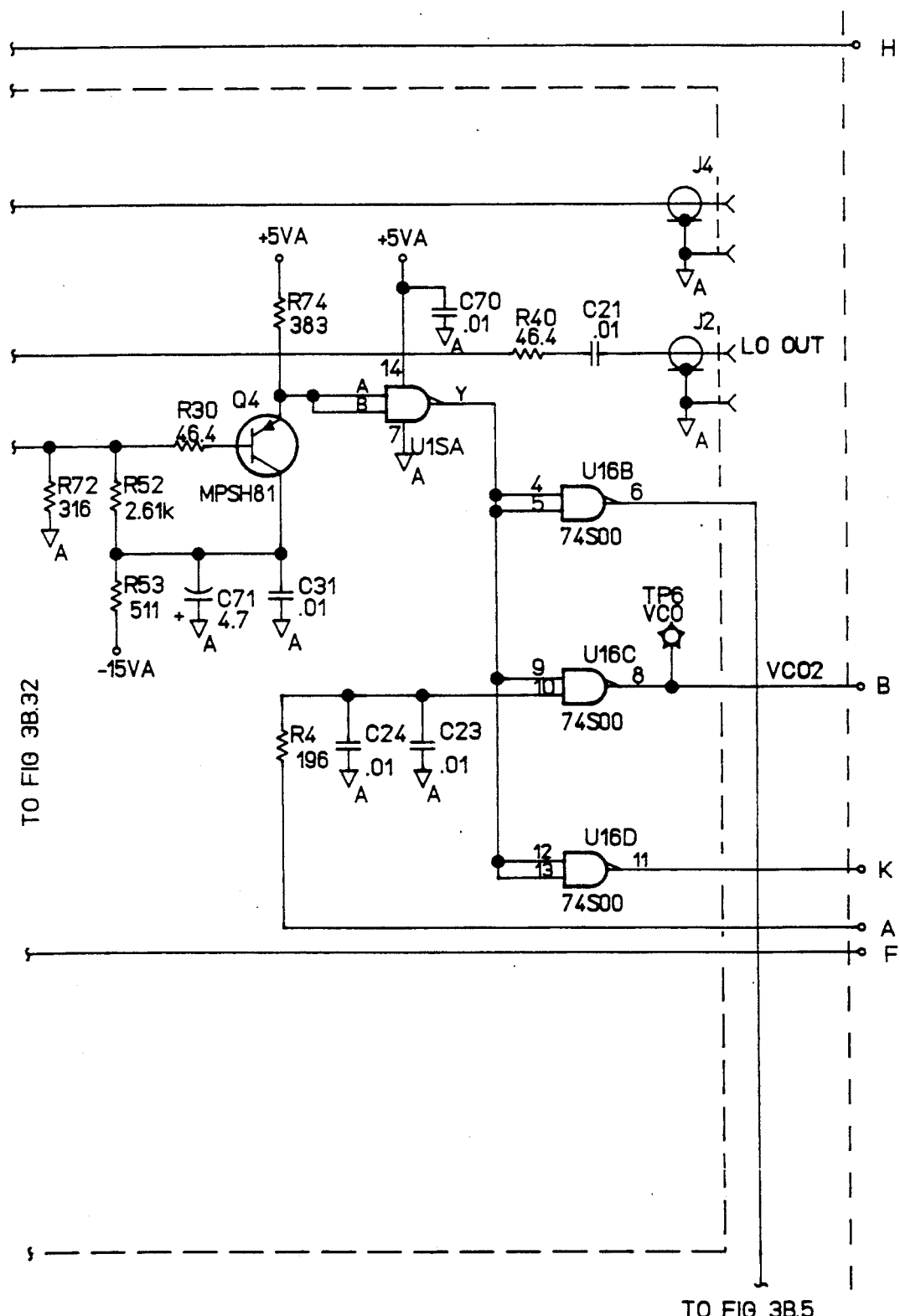
FIG 3B.33

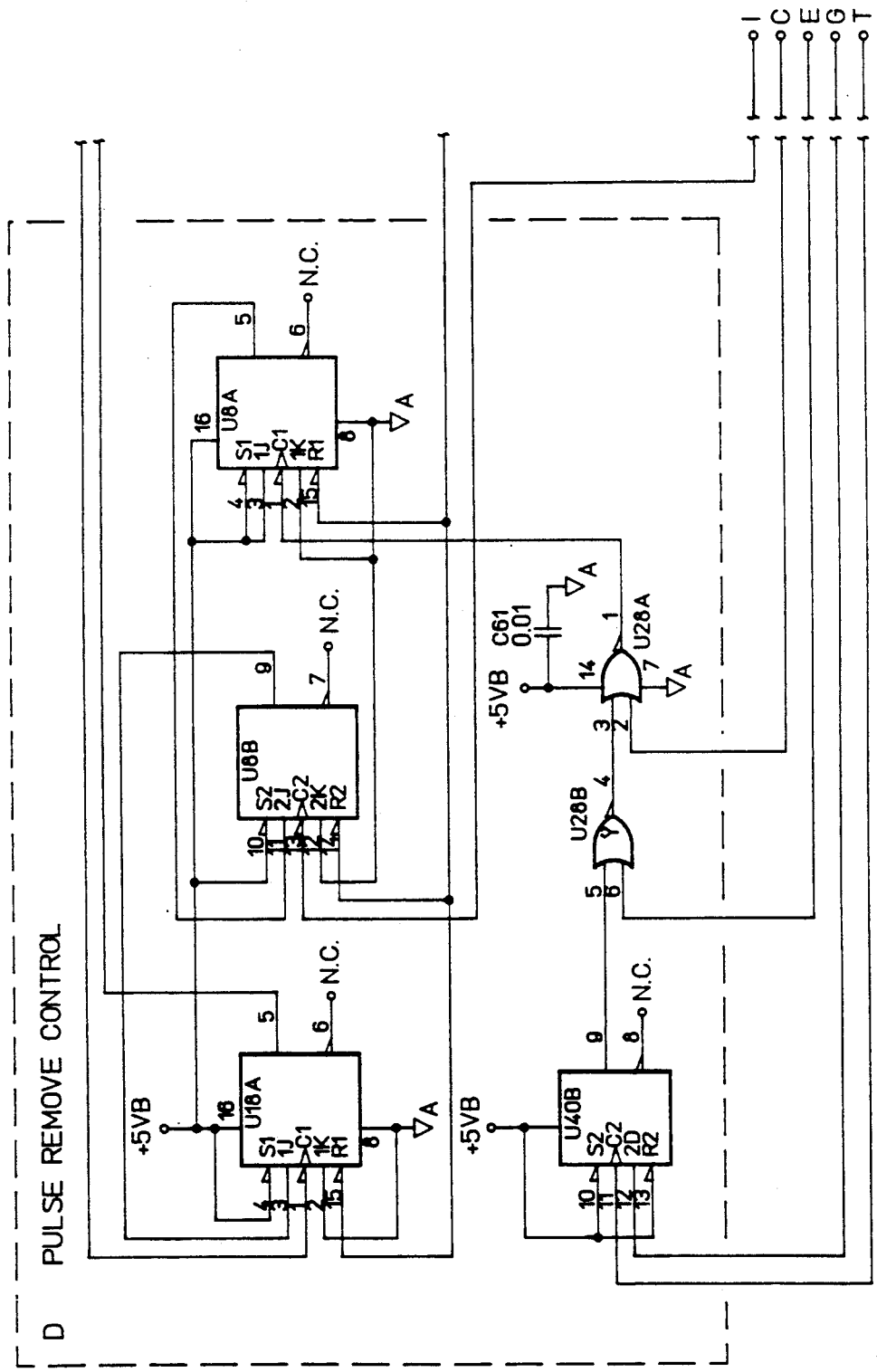
FIG 3B.4

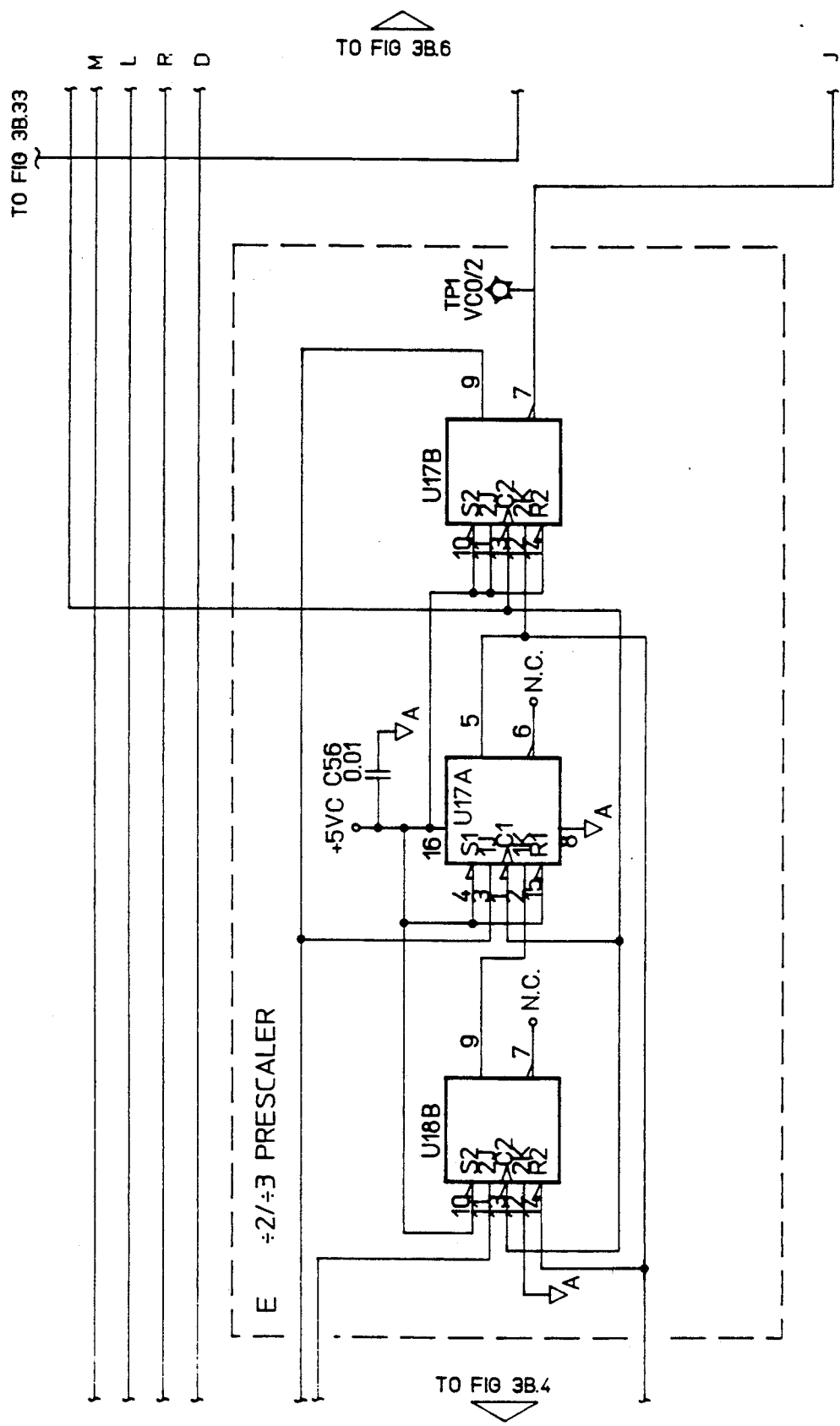
FIG 3B.5

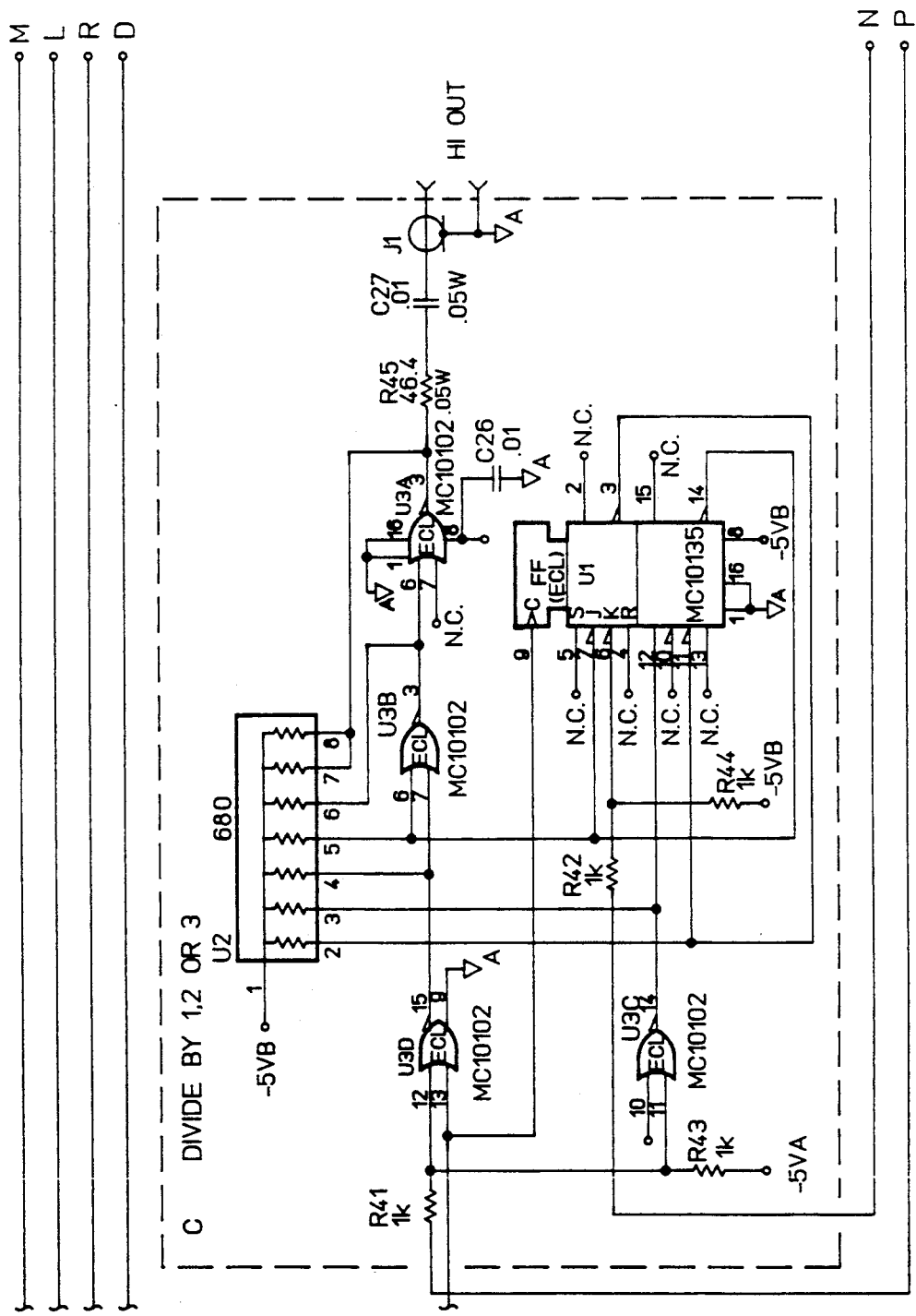
FIG 3B.6

NOTES: UNLESS OTHERWISE SPECIFIED.
1. ALL RESISTOR VALUES ARE IN OHMS.
2. ALL CAPACITOR VALUES ARE IN MICROFARADS.
3. ALL INDUCTOR VALUES ARE IN MICROHENRIES.
| REFERENCE DESIGNATORS ||
| LAST USED | NOT USED |
|---|---|
| C82 | C30, C44, C69, C75, C76, C79 |
| CR10 | CR1, CR2, CR4, CR9 |
| J4 | |
| L16 | L3, L5, L6, L12 |
| Q10 | |
| R89 | R33, R34, R35, R36, R37, R38, R39, R49, R50, R51, R54, R59, R61, R64, R65, R67, R68, R69, R73, R83 |
| TP14 | |
| U48 | |
| P2 | |
| W2 | W1 |
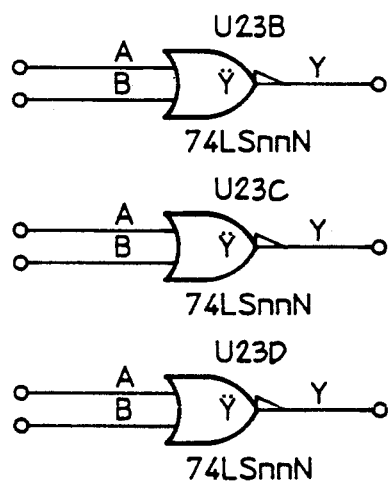
FIG 3B.7

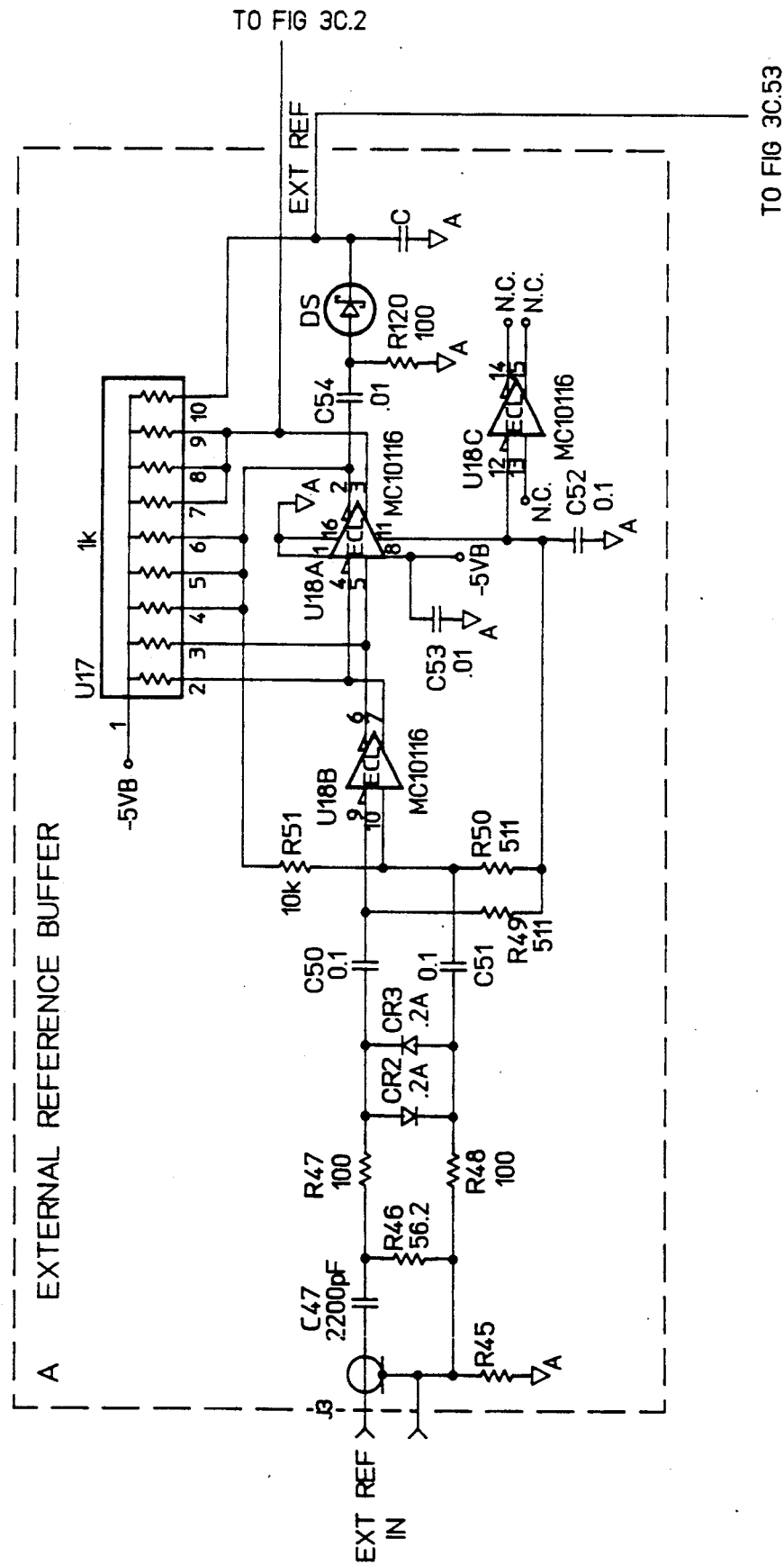
FIG 3C.1

FIG 3C.2

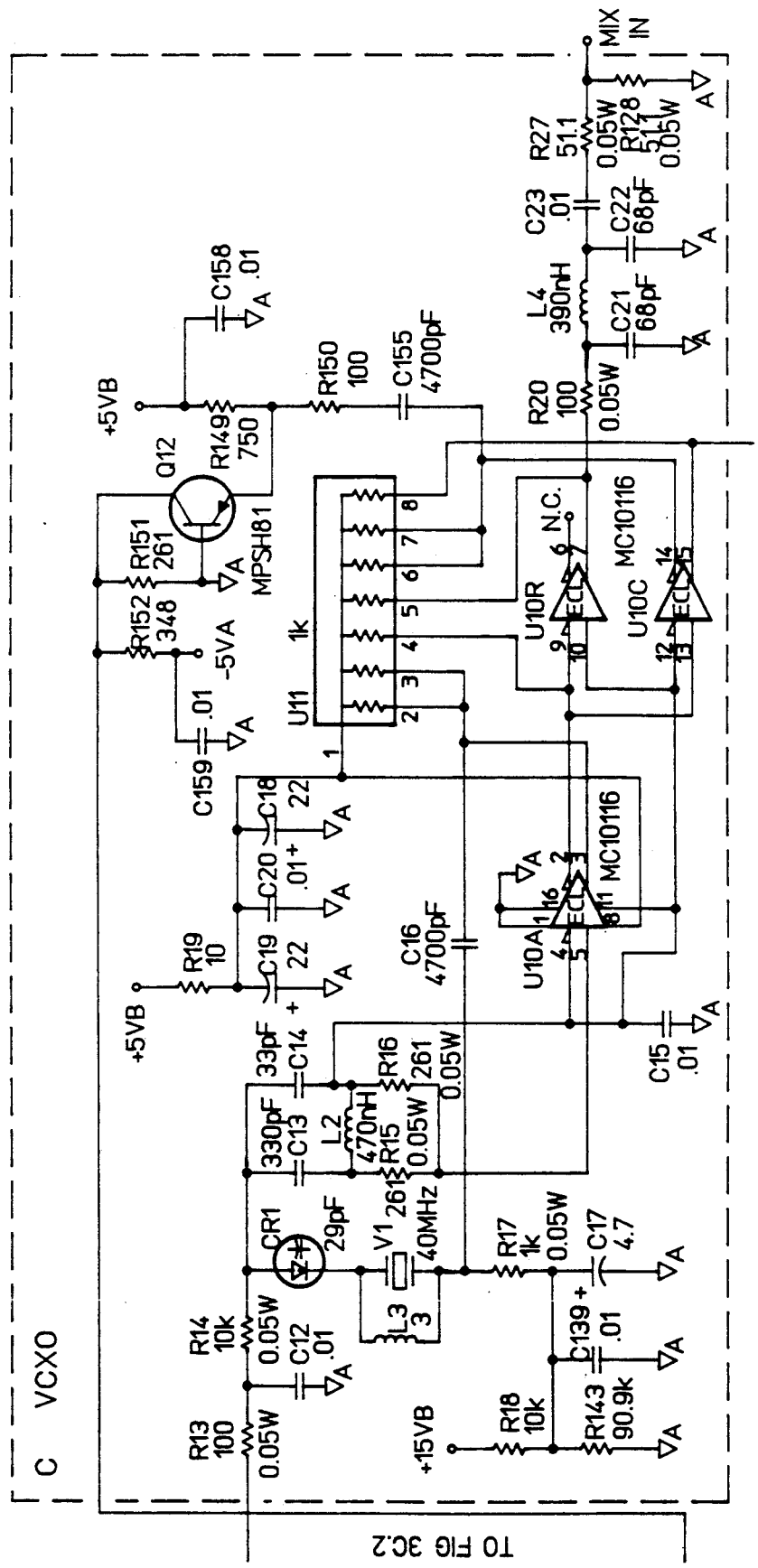
FIG 3C.3

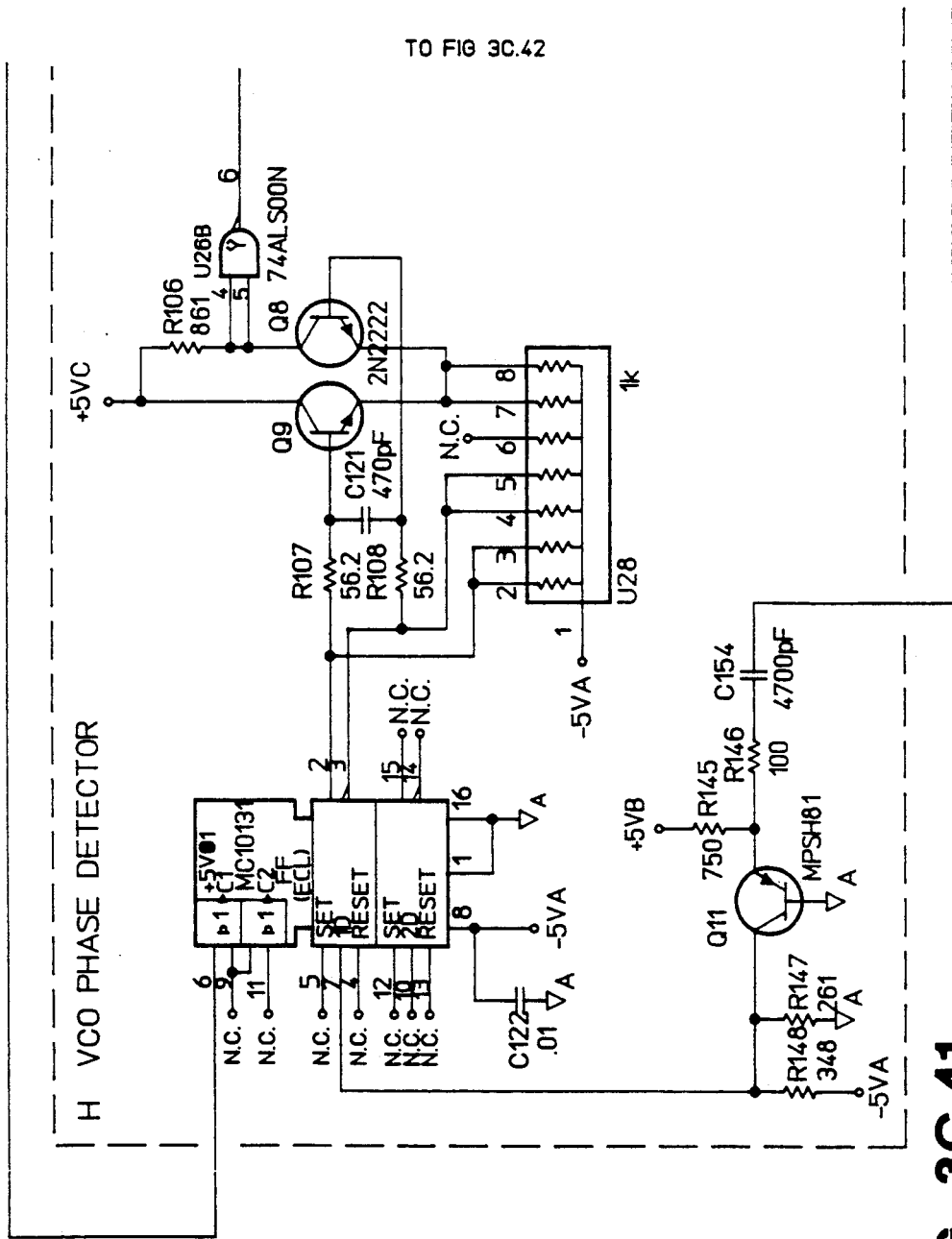
FIG 3C.41

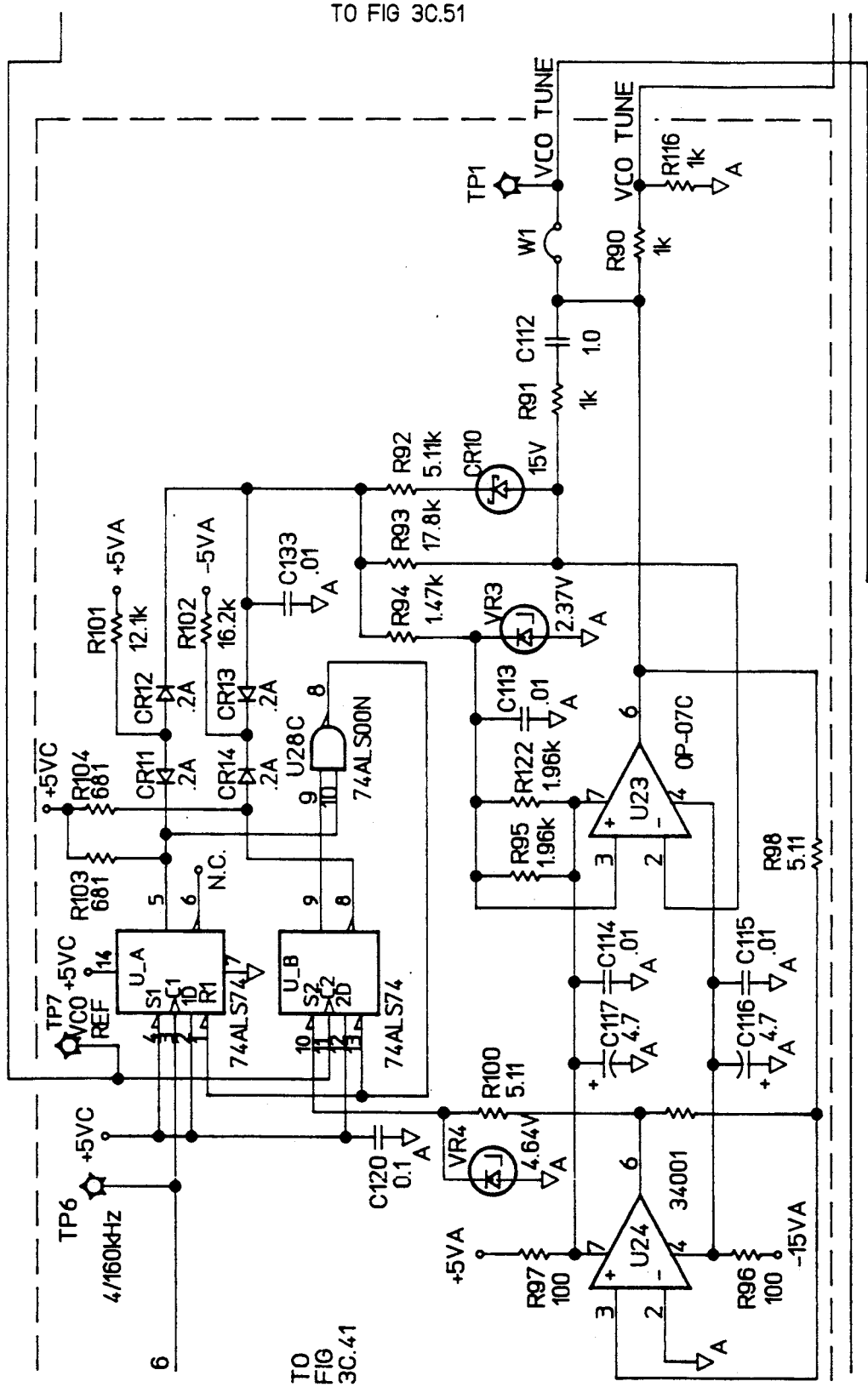
FIG 3C.42

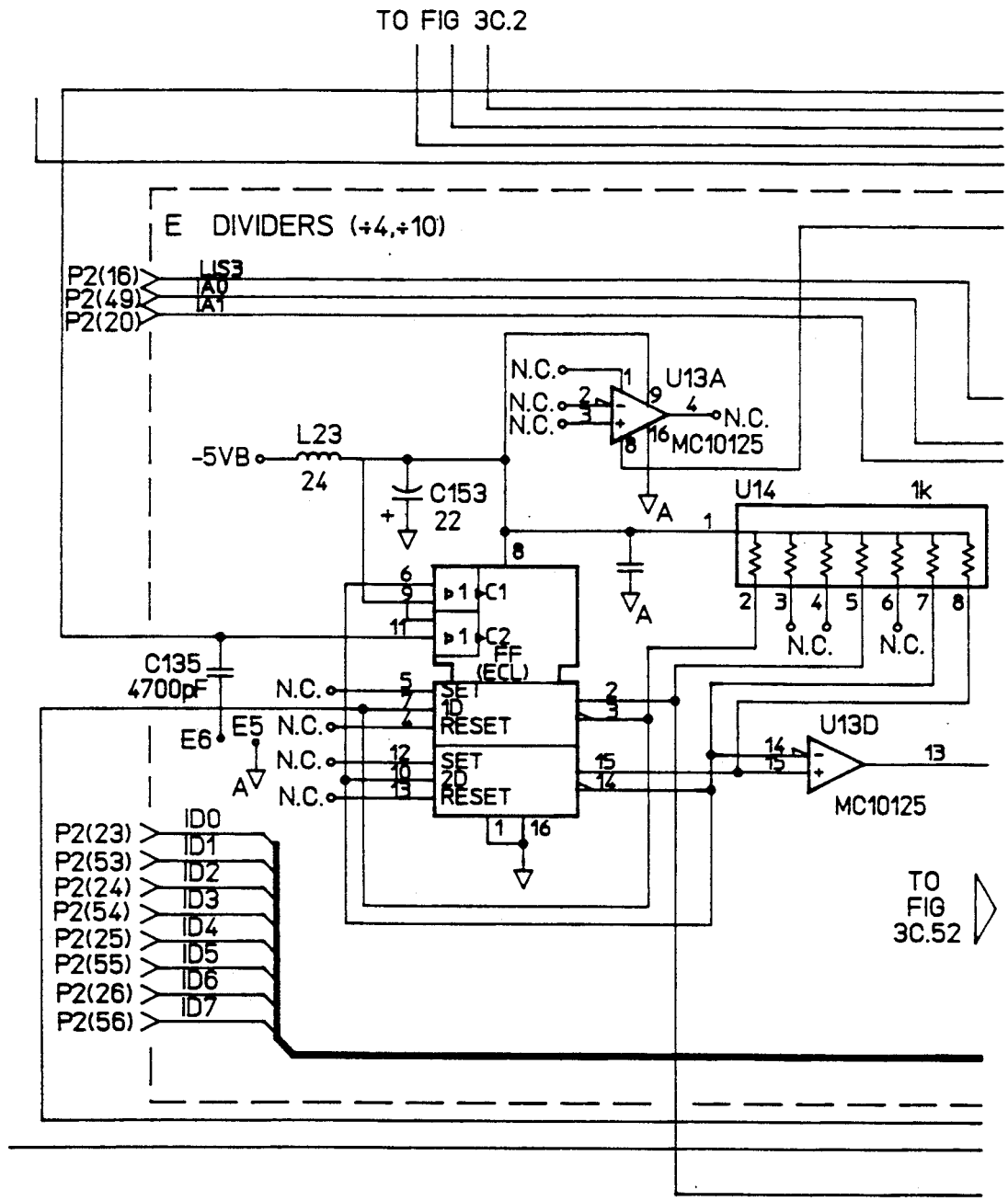
FIG 3C.51

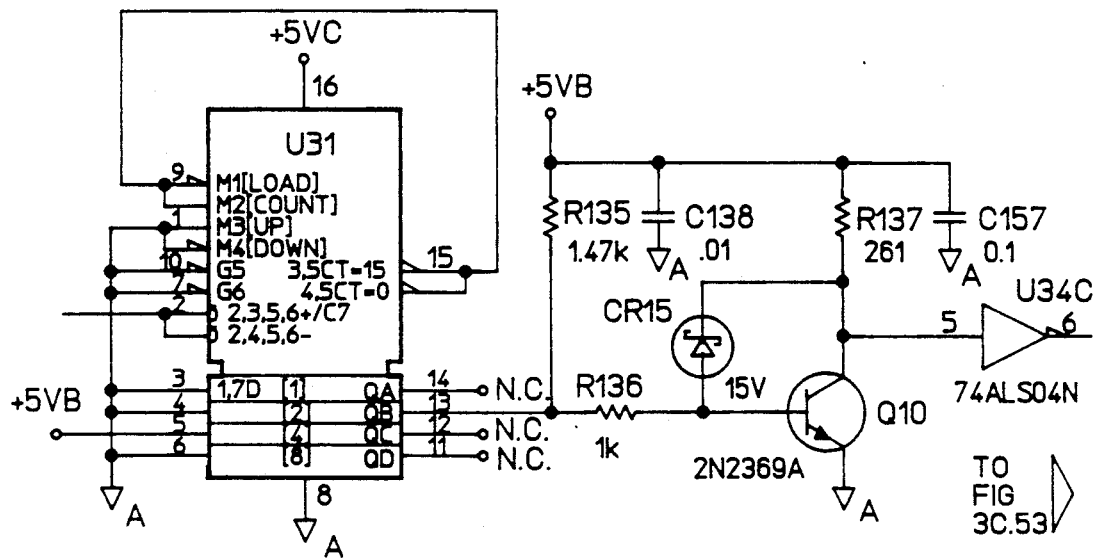
FIG 3C.52

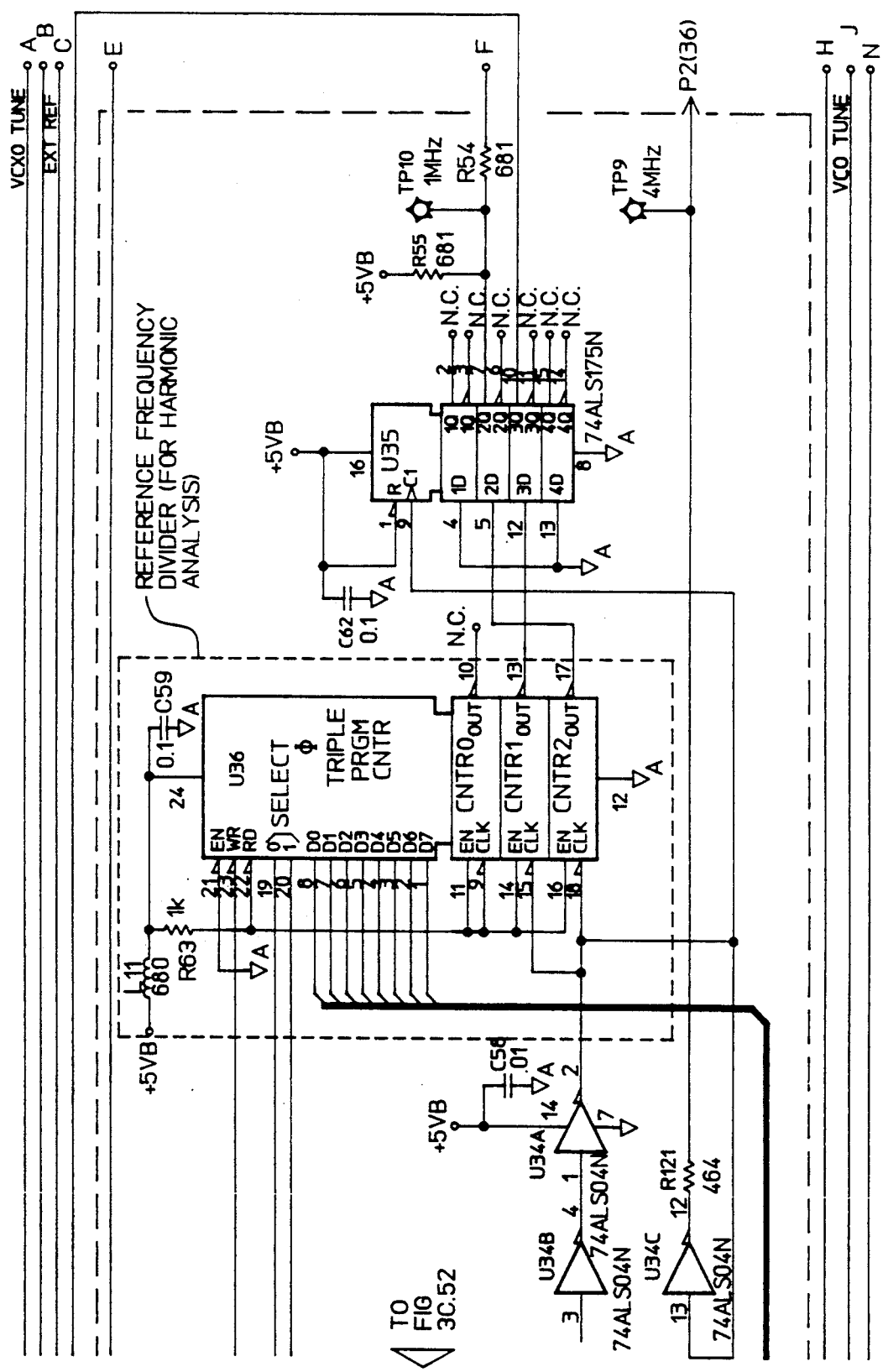
FIG 3C.53

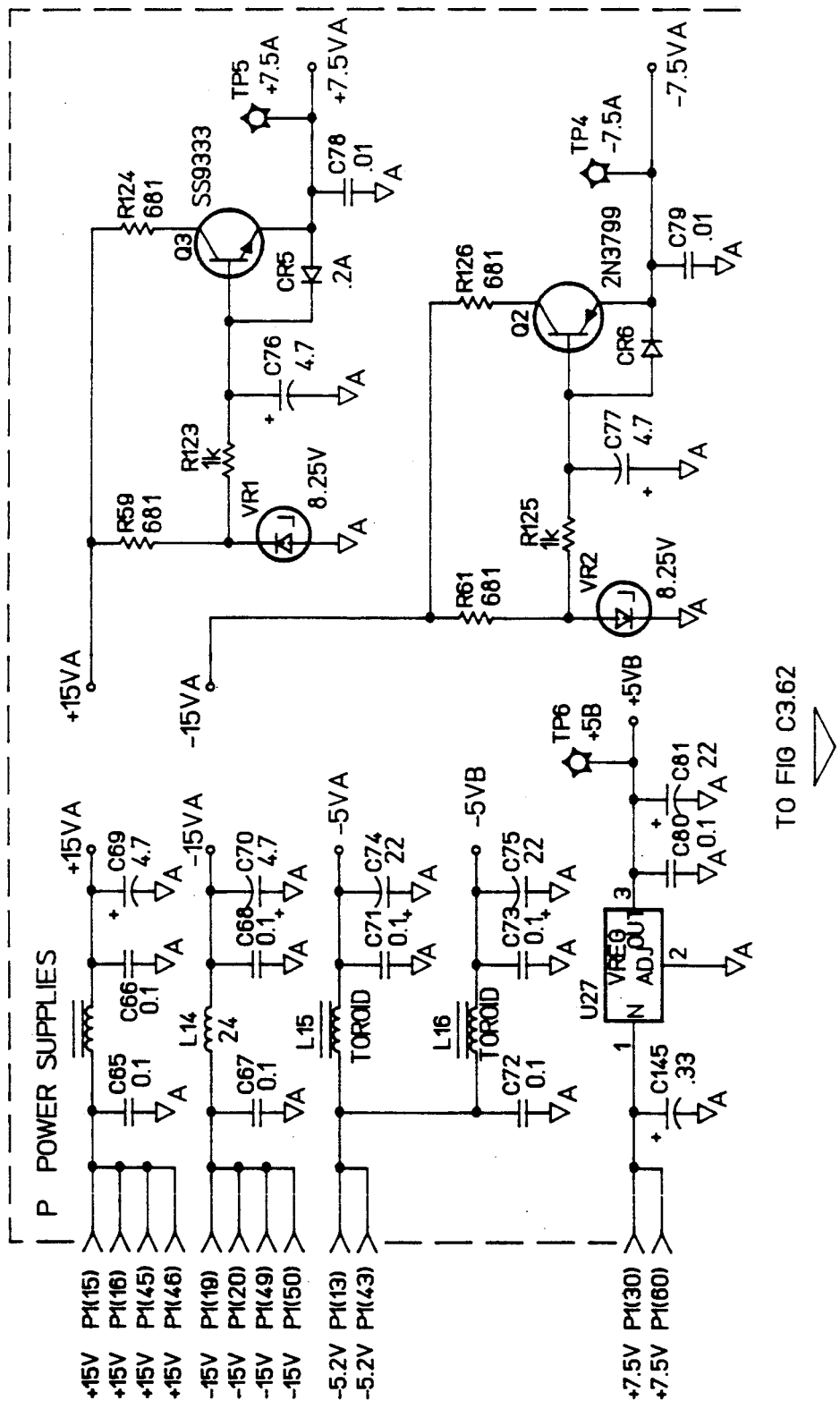
FIG 3C.61

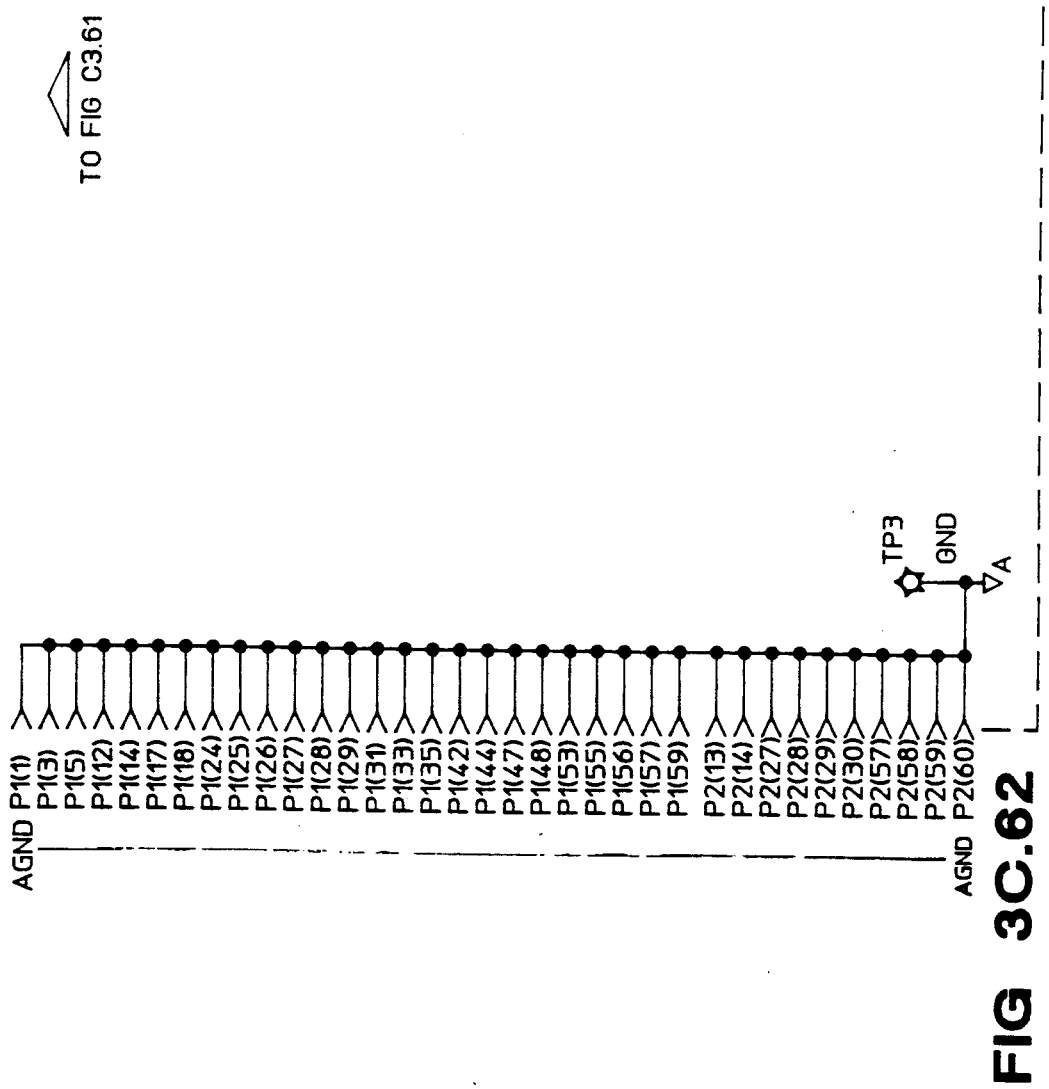

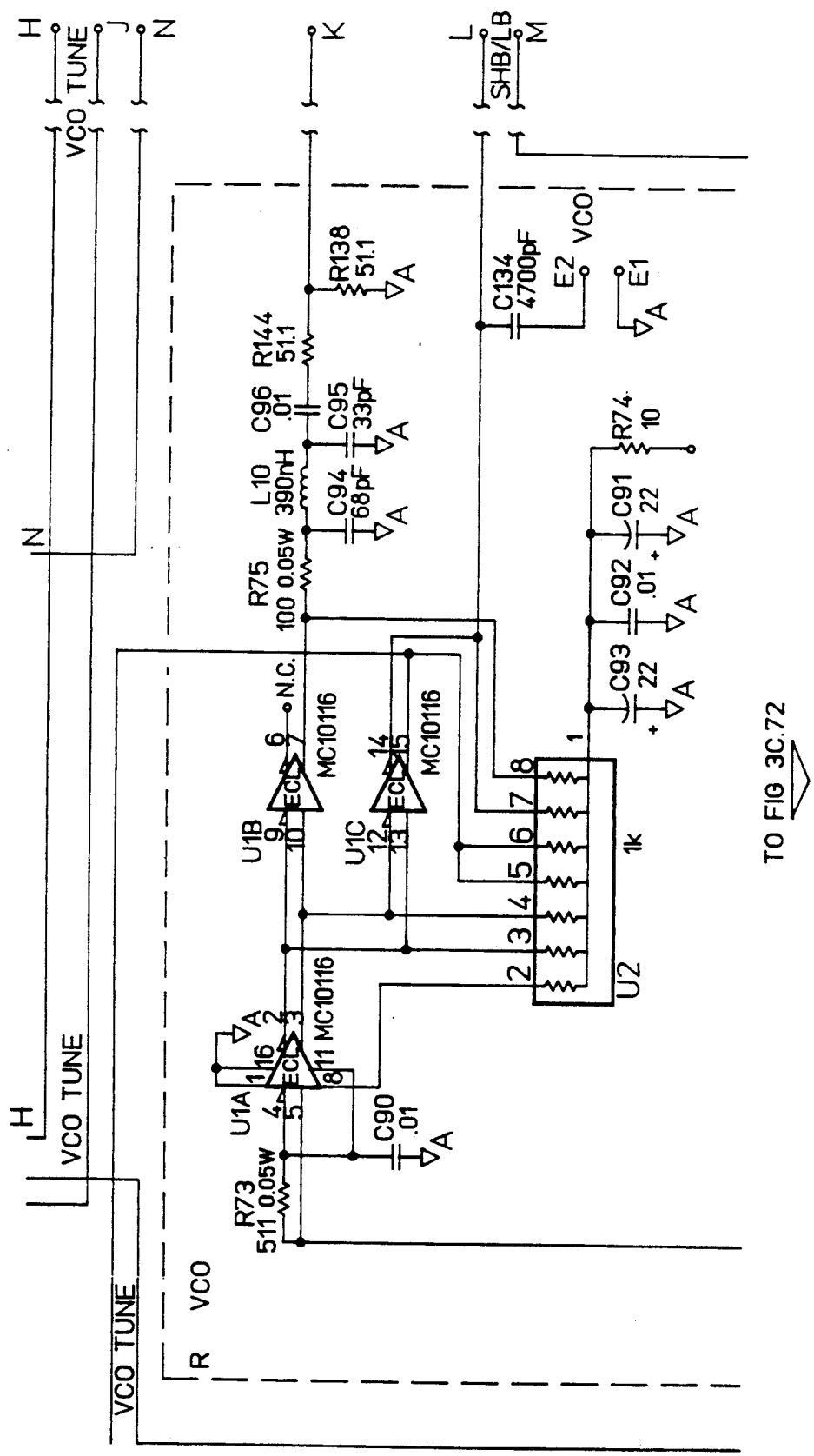
FIG 3C.71

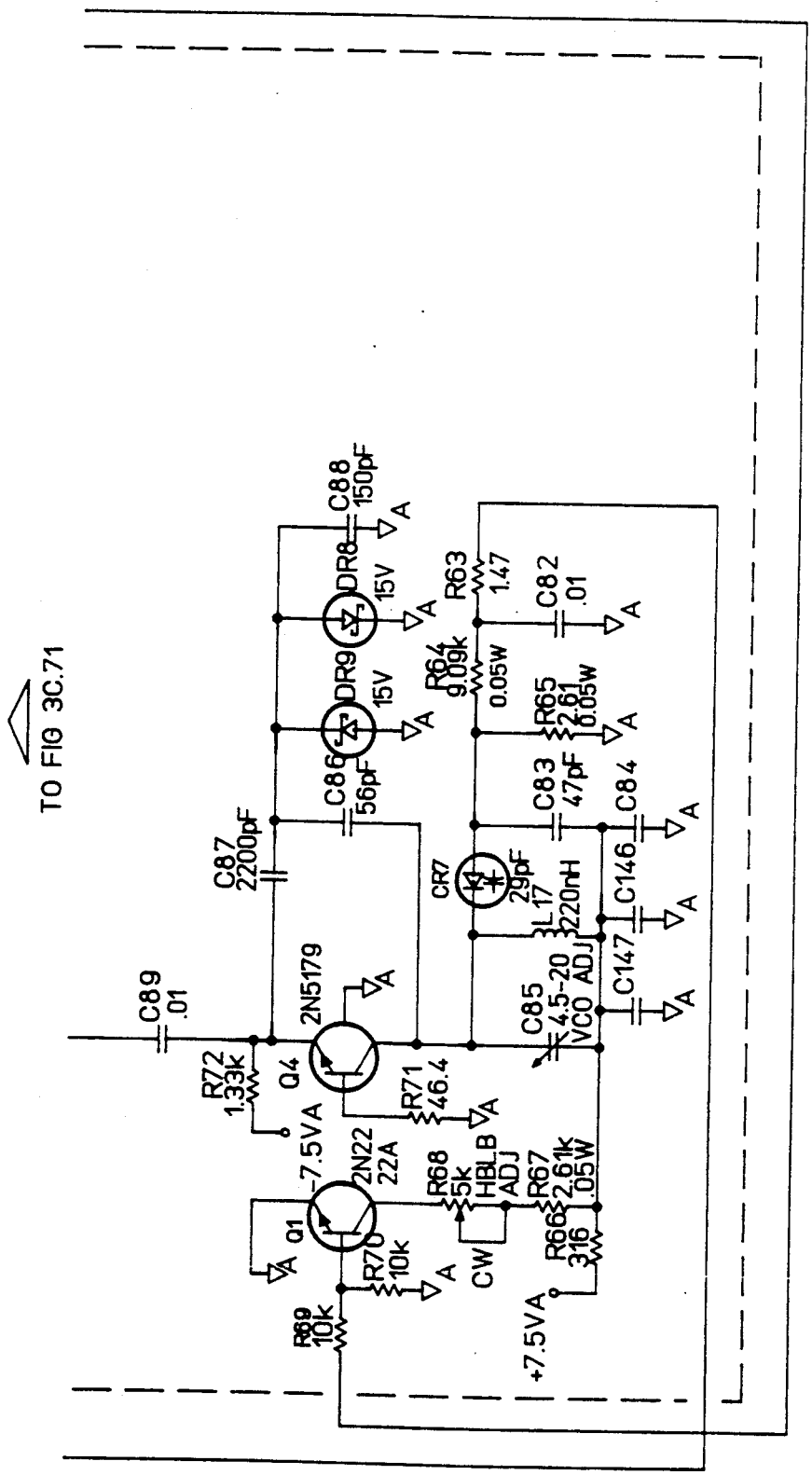
FIG 3C.72

NOTES: UNLESS OTHERWISE SPECIFIED.
1. ALL RESISTOR VALUES ARE IN OHMS.
2. ALL CAPACITOR VALUES ARE IN MICROFARADS.
3. ALL INDUCTOR VALUES ARE IN MICROHENRIES.
| REFERENCE DESIGNATORS | | |
|---|---|---|
| LAST USED | NOT USED | |
| C159 | C15, C60, C63, C64, <br> C118, C119, C122, C130, <br> C131, C148. | |
| R153 | R21, R22, R23, R24, <br> R26, R41, R52, R56, <br> R60, R62, R76, R77, <br> R78, R79, R81, R86, <br> R87, R88, R89, R105, <br> R118. | |
| L24 | L10. | L12. |
| CR15 | | |
| E8 | | |
| TP10 | TP6. | |
| J3 | | |
| P2 | | |
| Q12 | | |
| U36 | | |
| VR4 | | |
| W2 | | |
| Y1 | | |
NOT USED
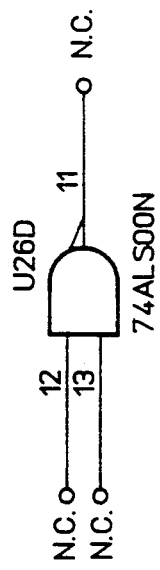
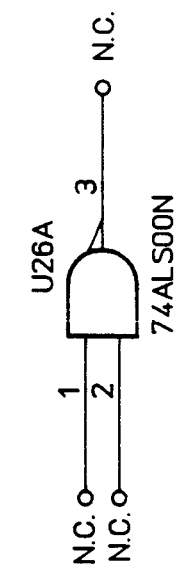
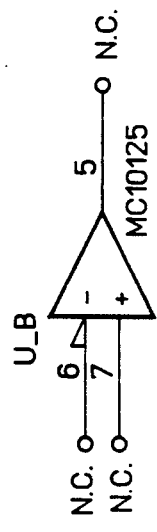
FIG 3C.8

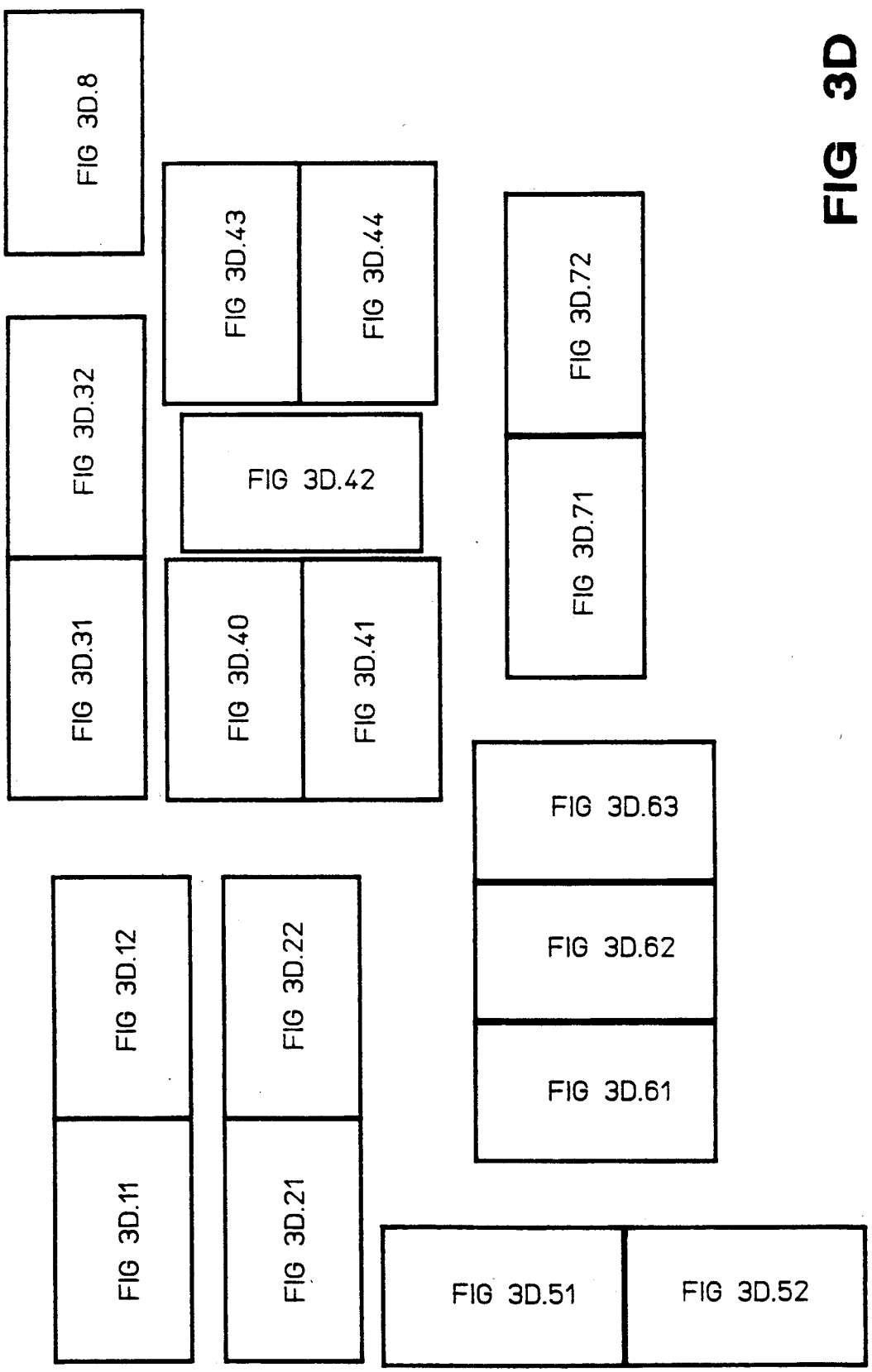

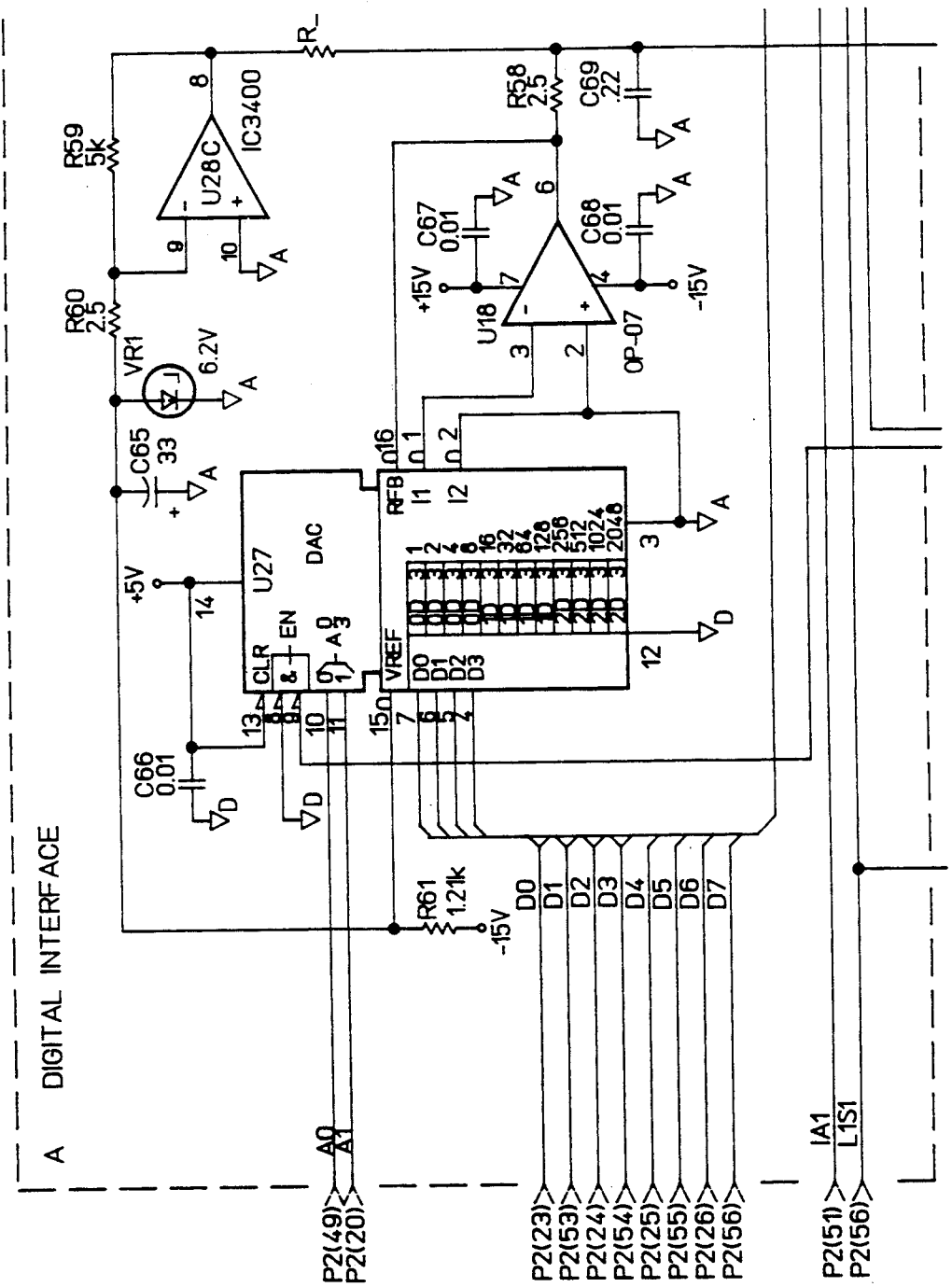
FIG 3D.11

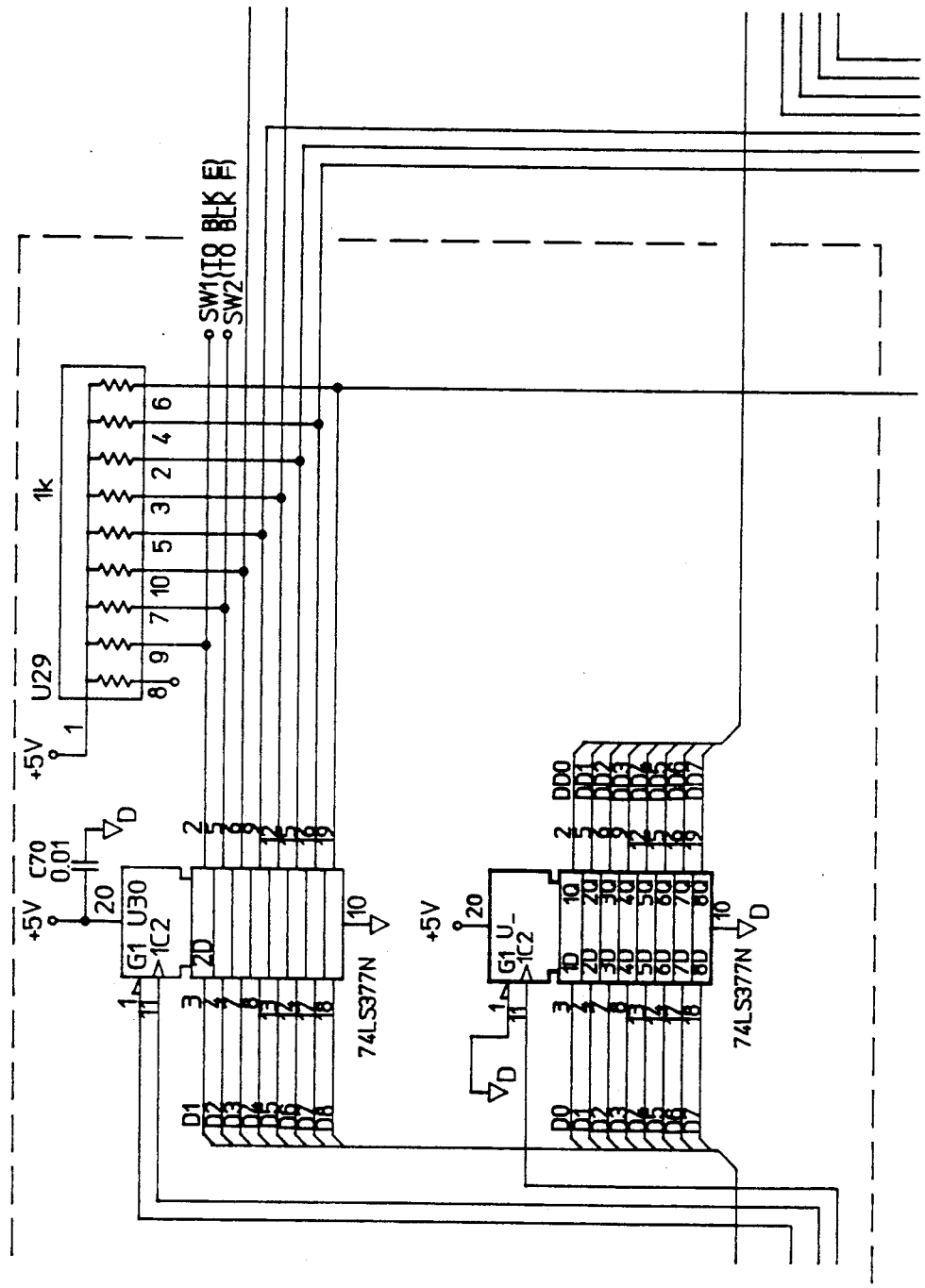
FIG 3D.12

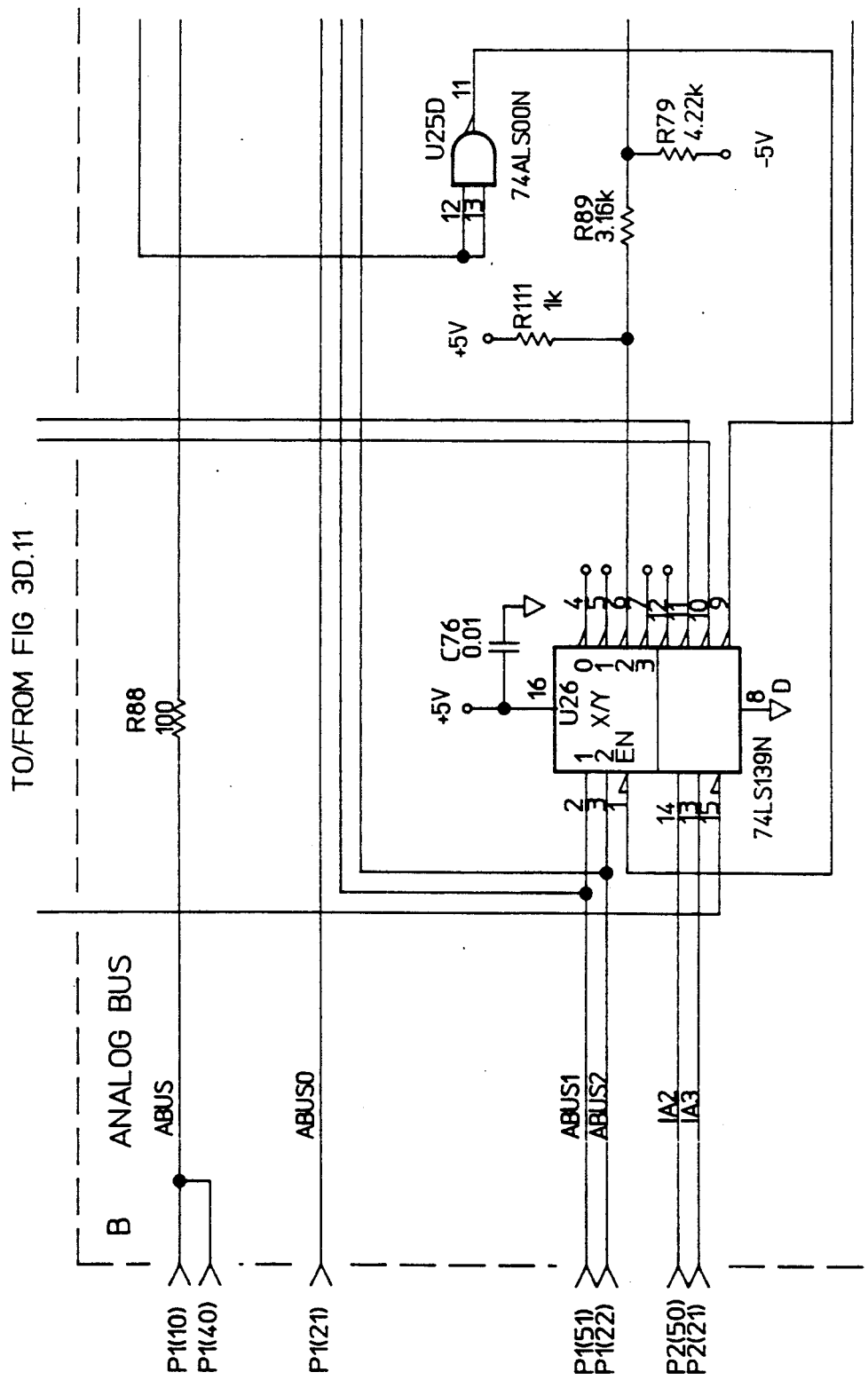
FIG 3D.21

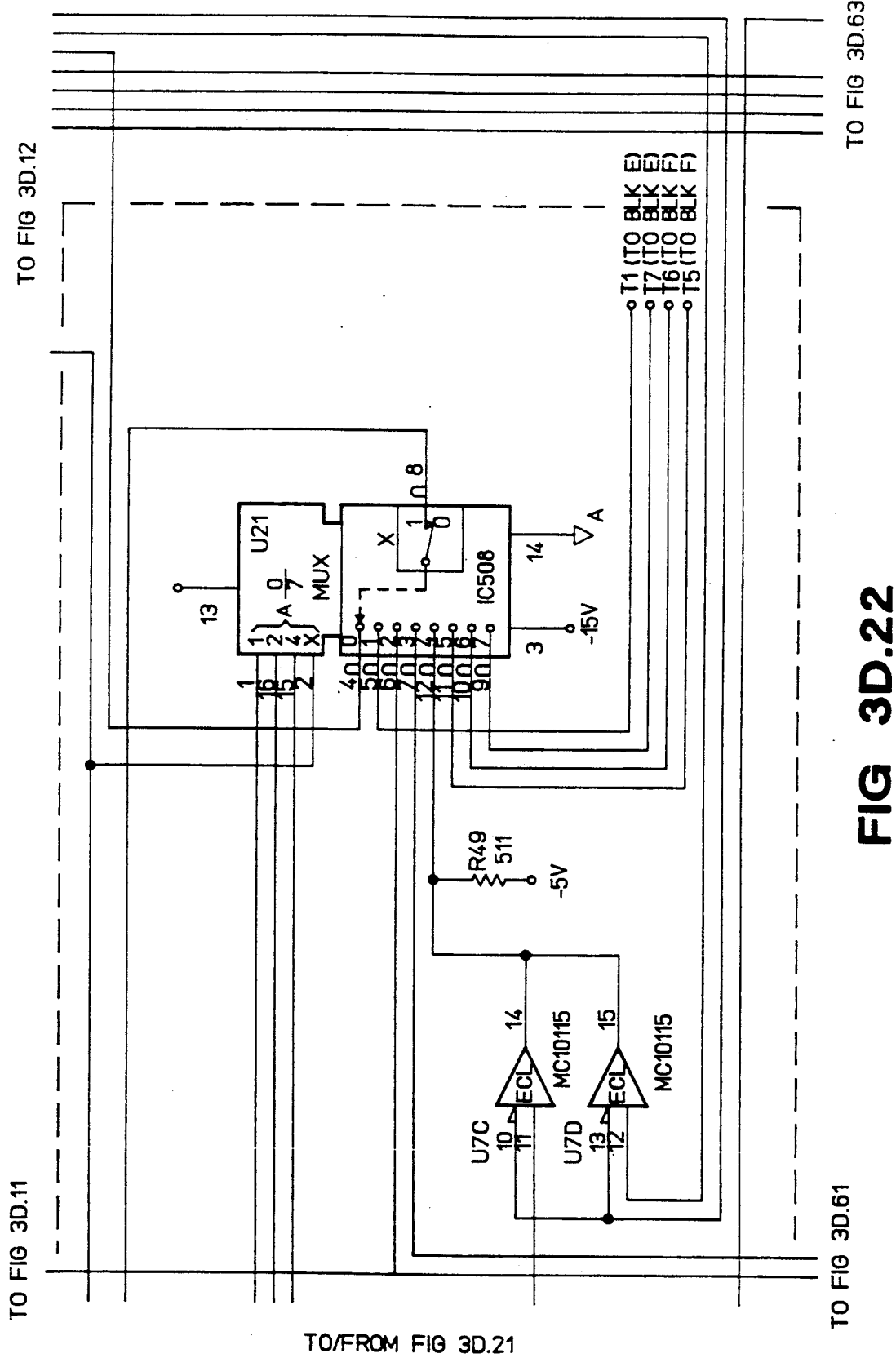
FIG 3D.22

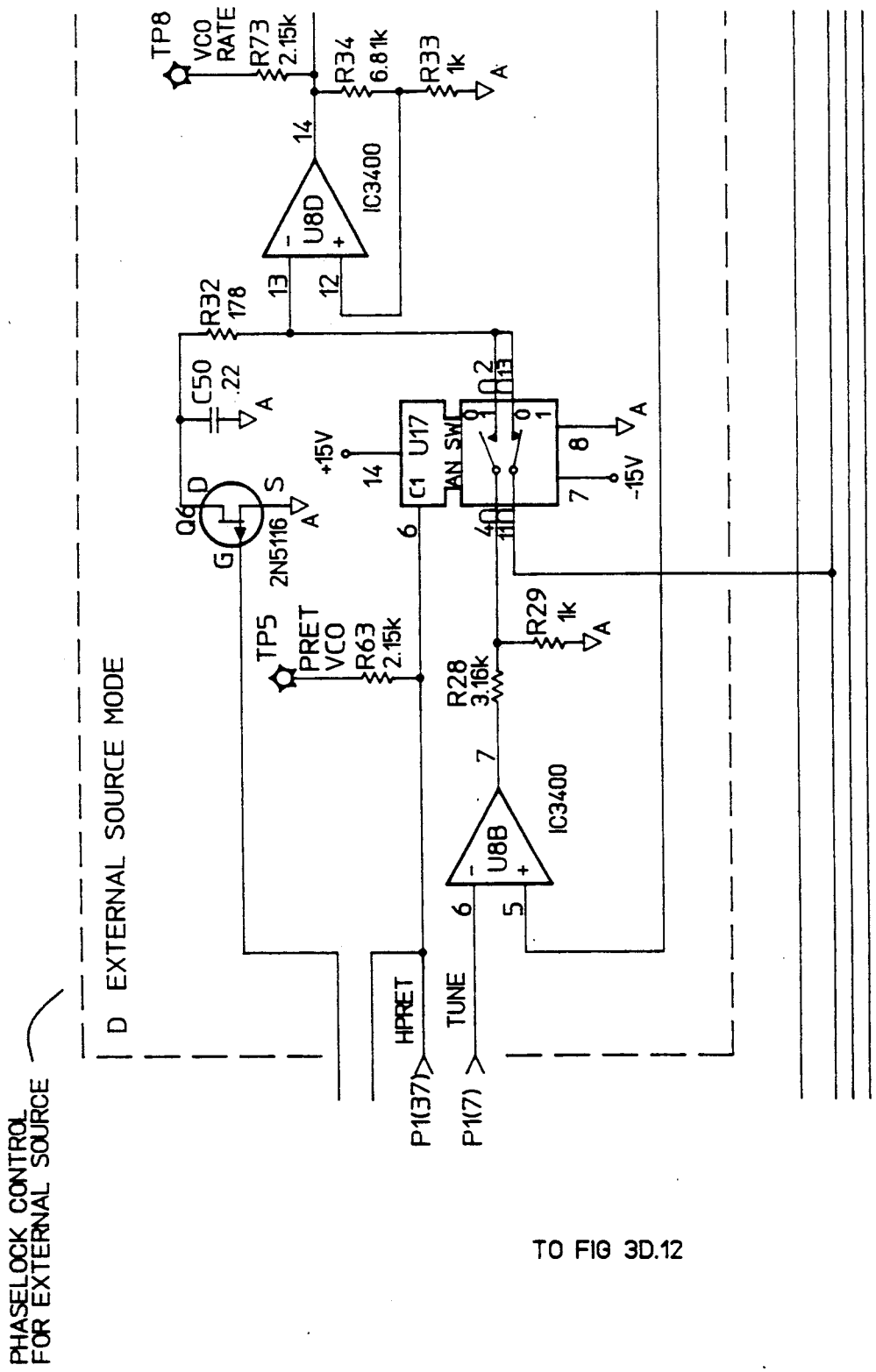
FIG 3D.31

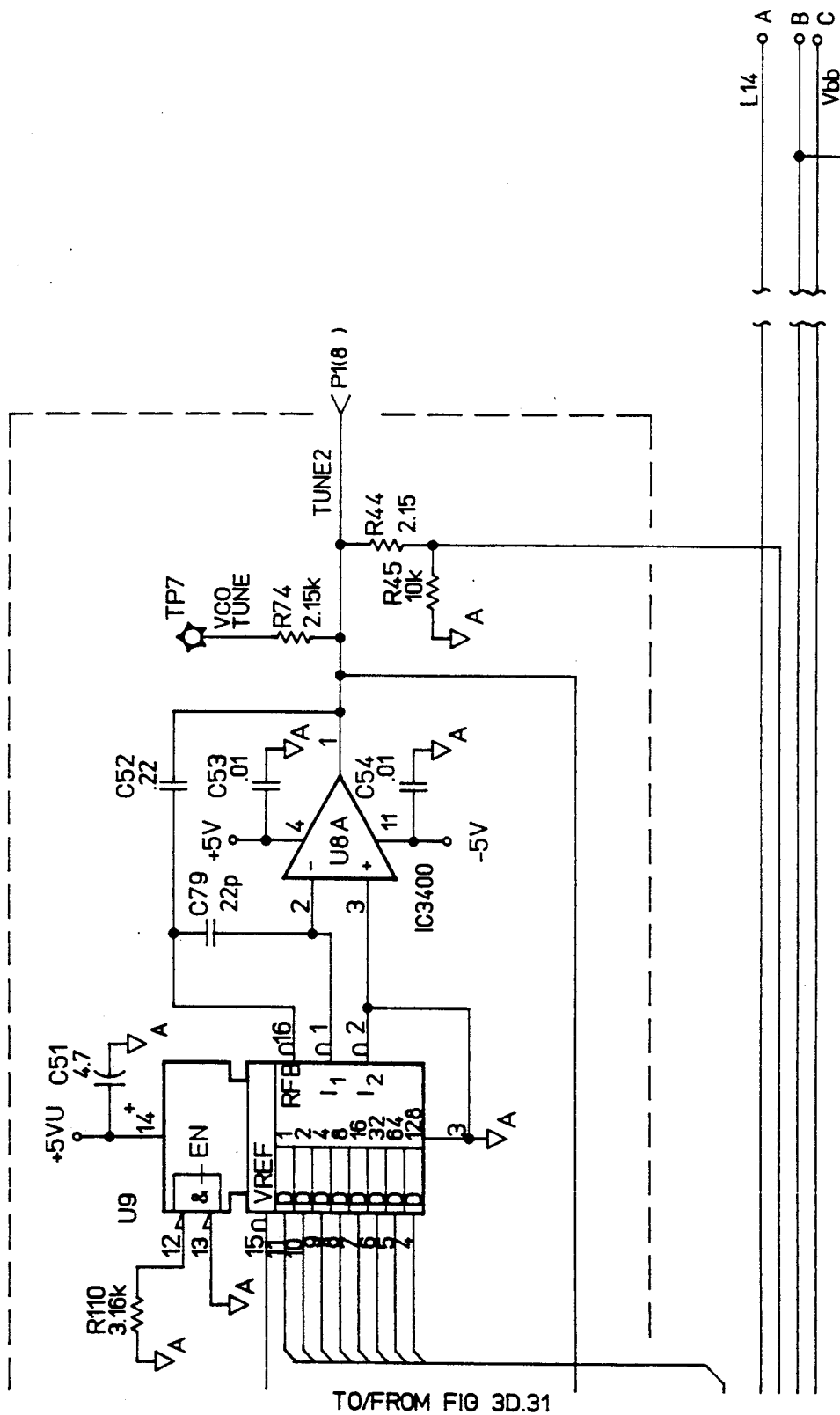
FIG 3D.32

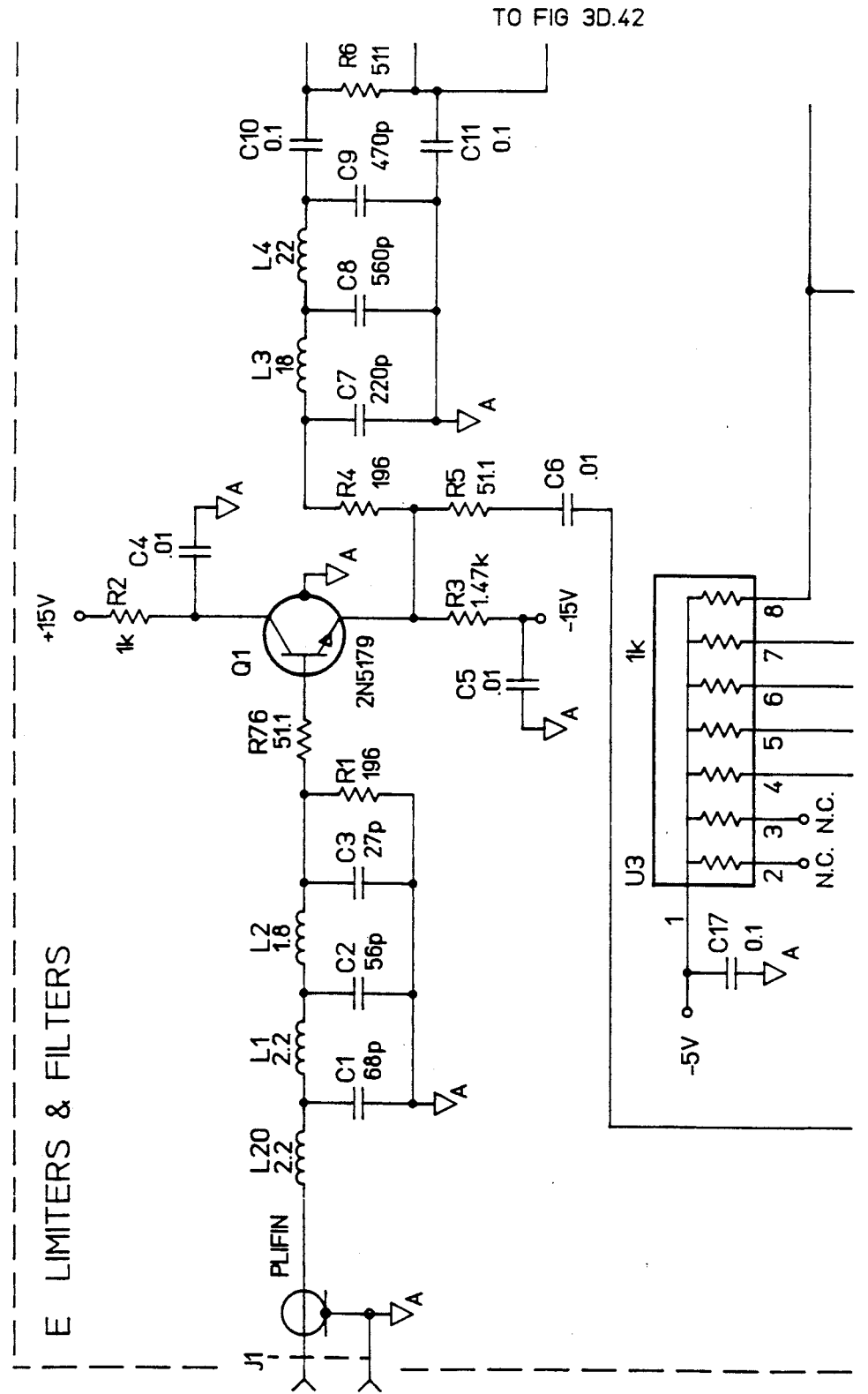
FIG 3D.40

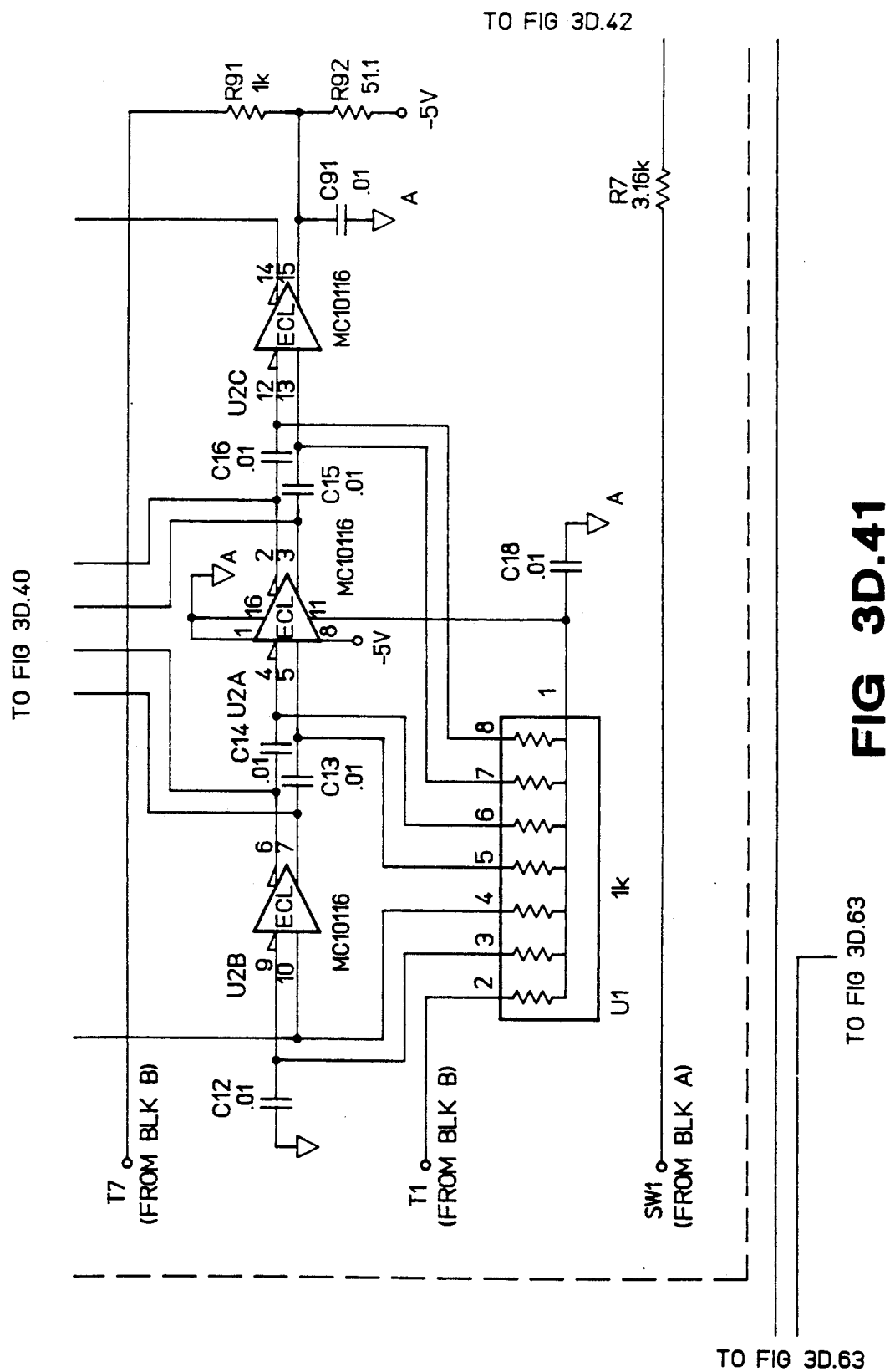
FIG 3D.41

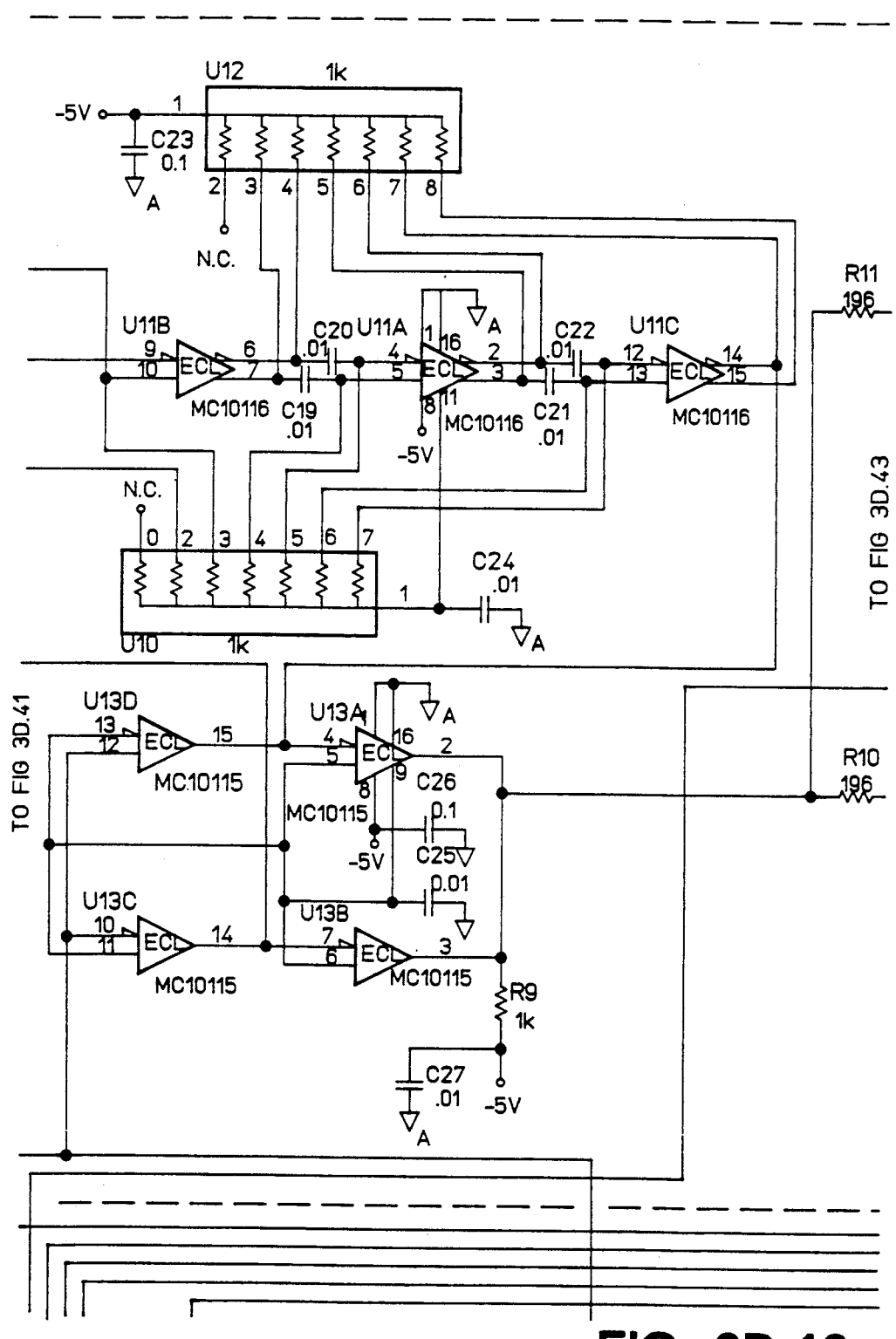
FIG 3D.42

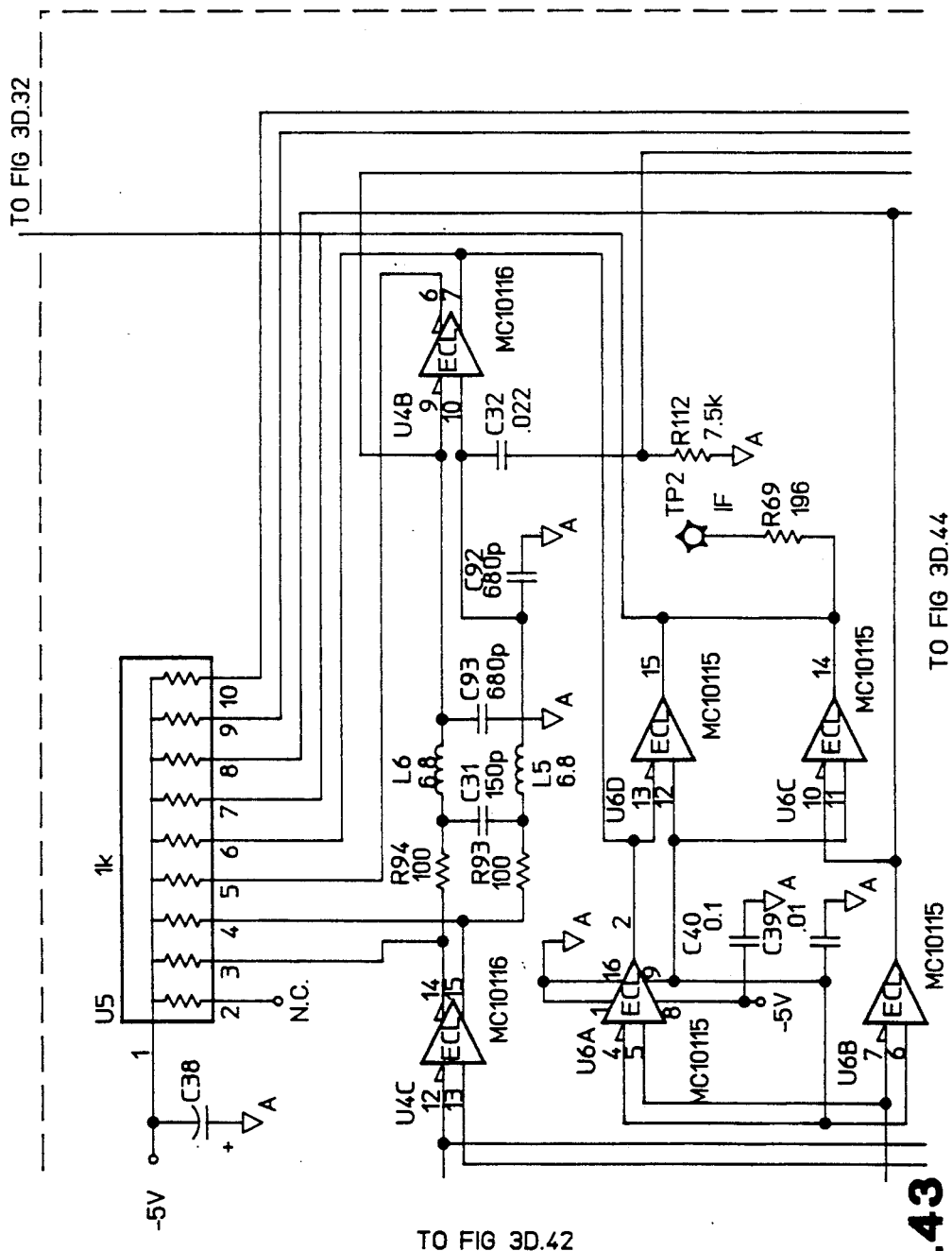
FIG 3D.43

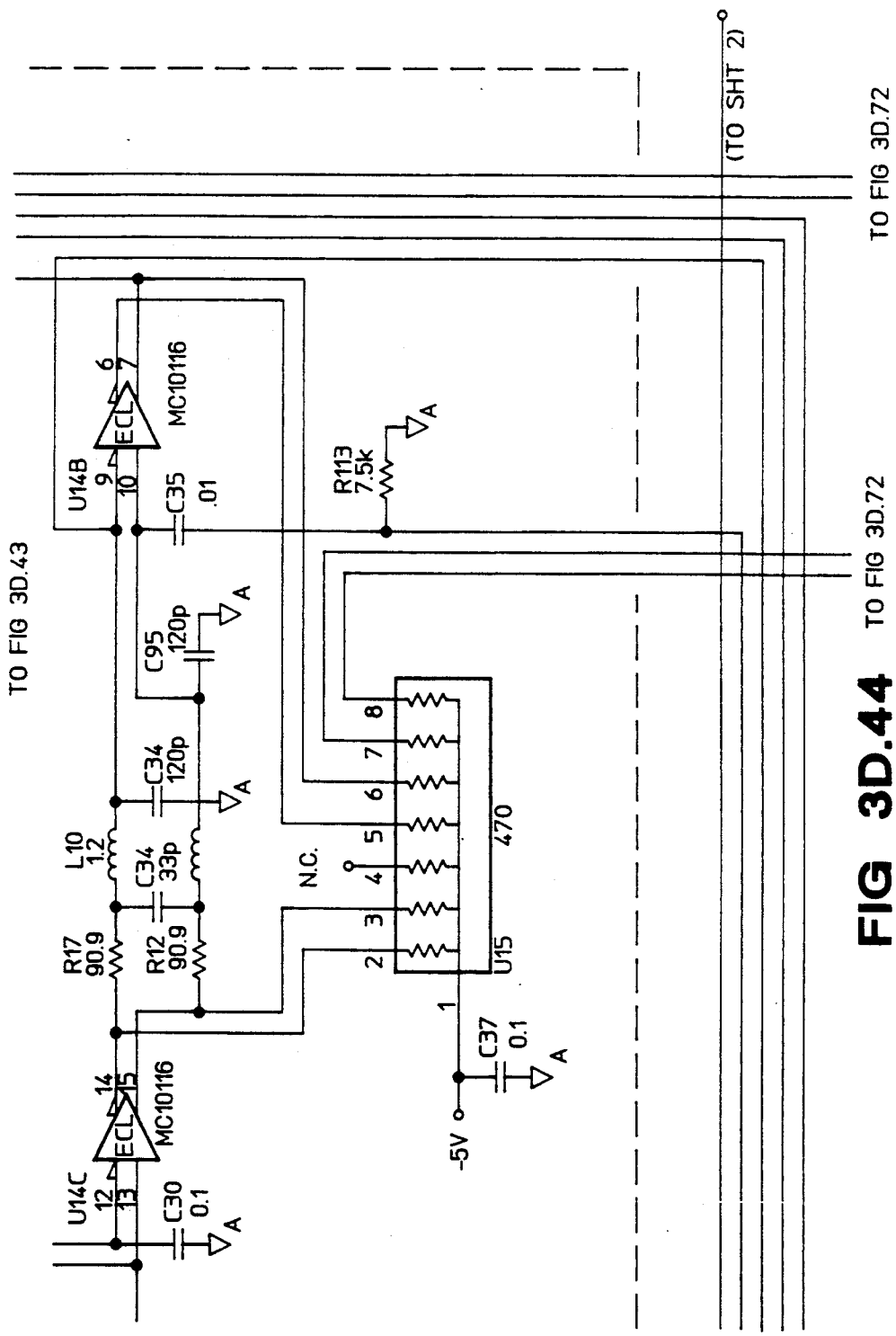
FIG 3D.44

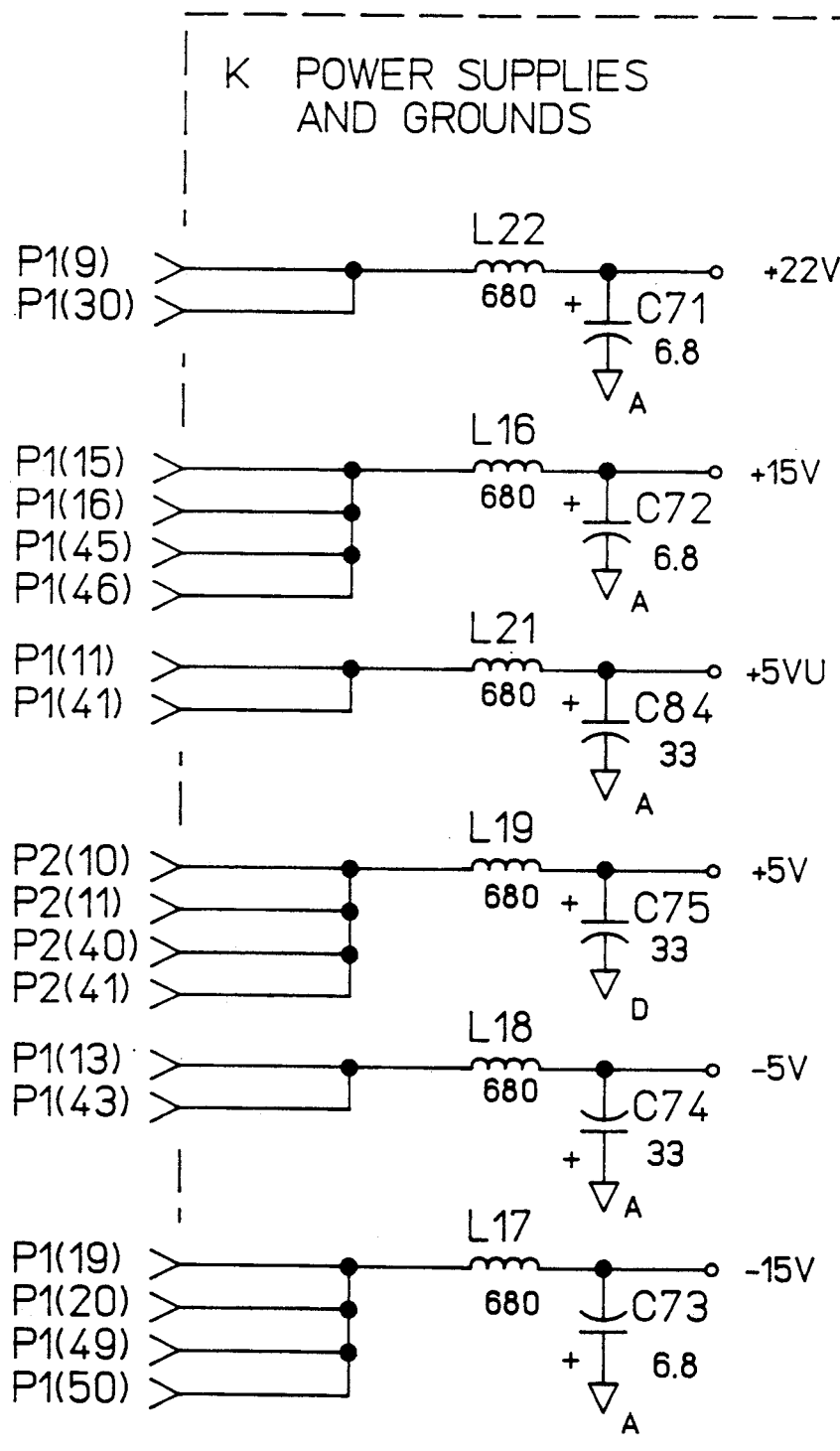
FIG 3D.51

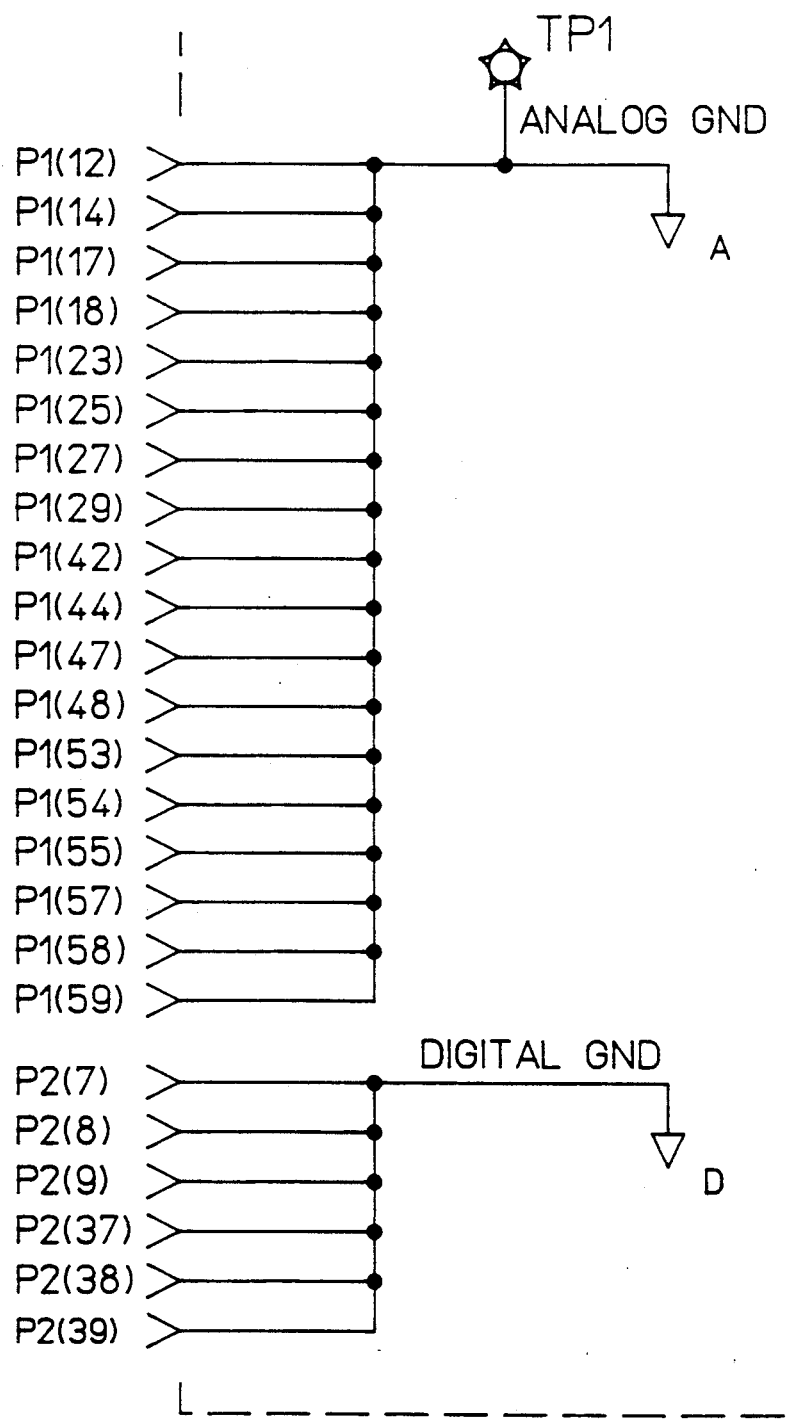
FIG 3D.52

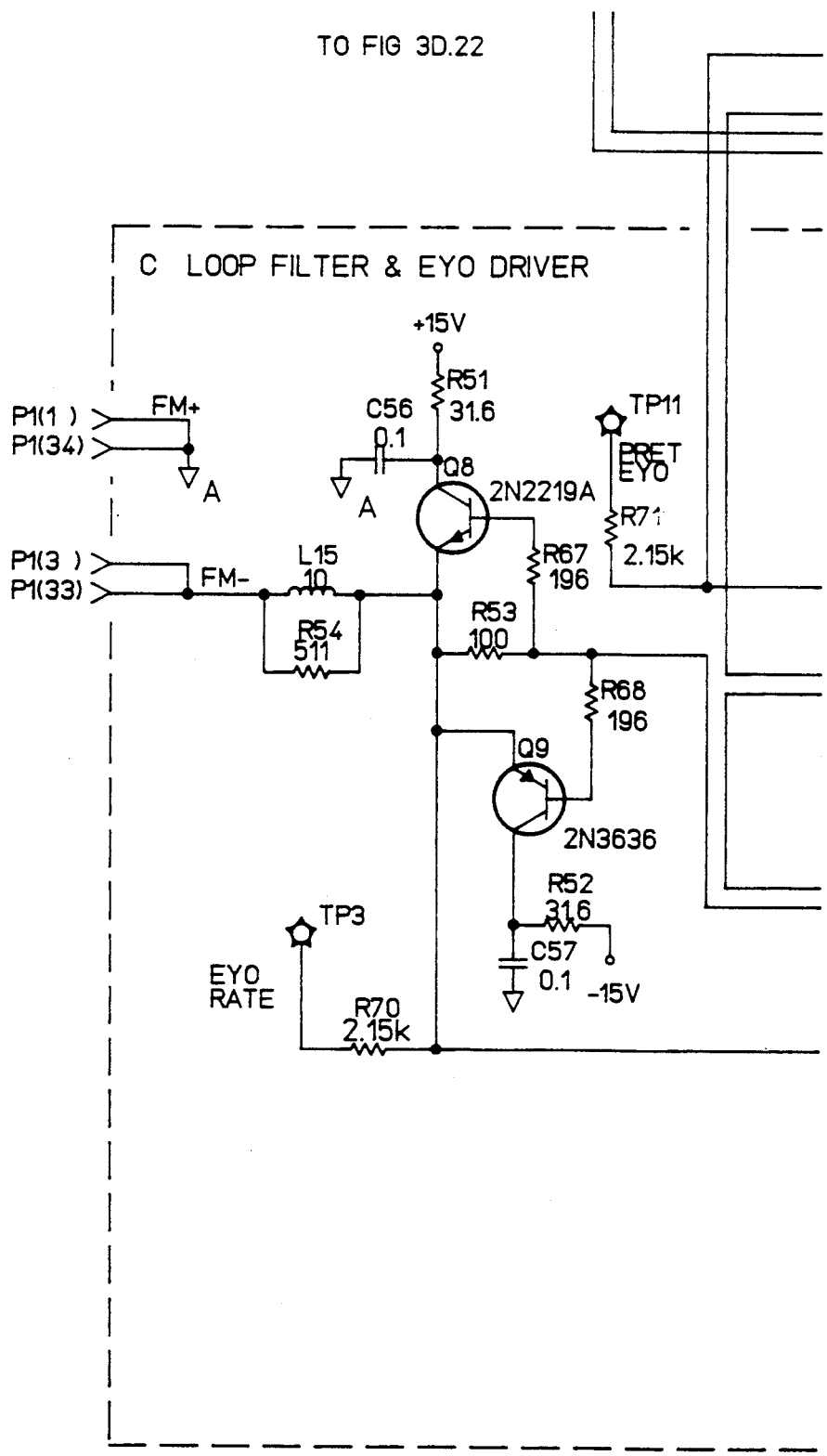
FIG 3D.61

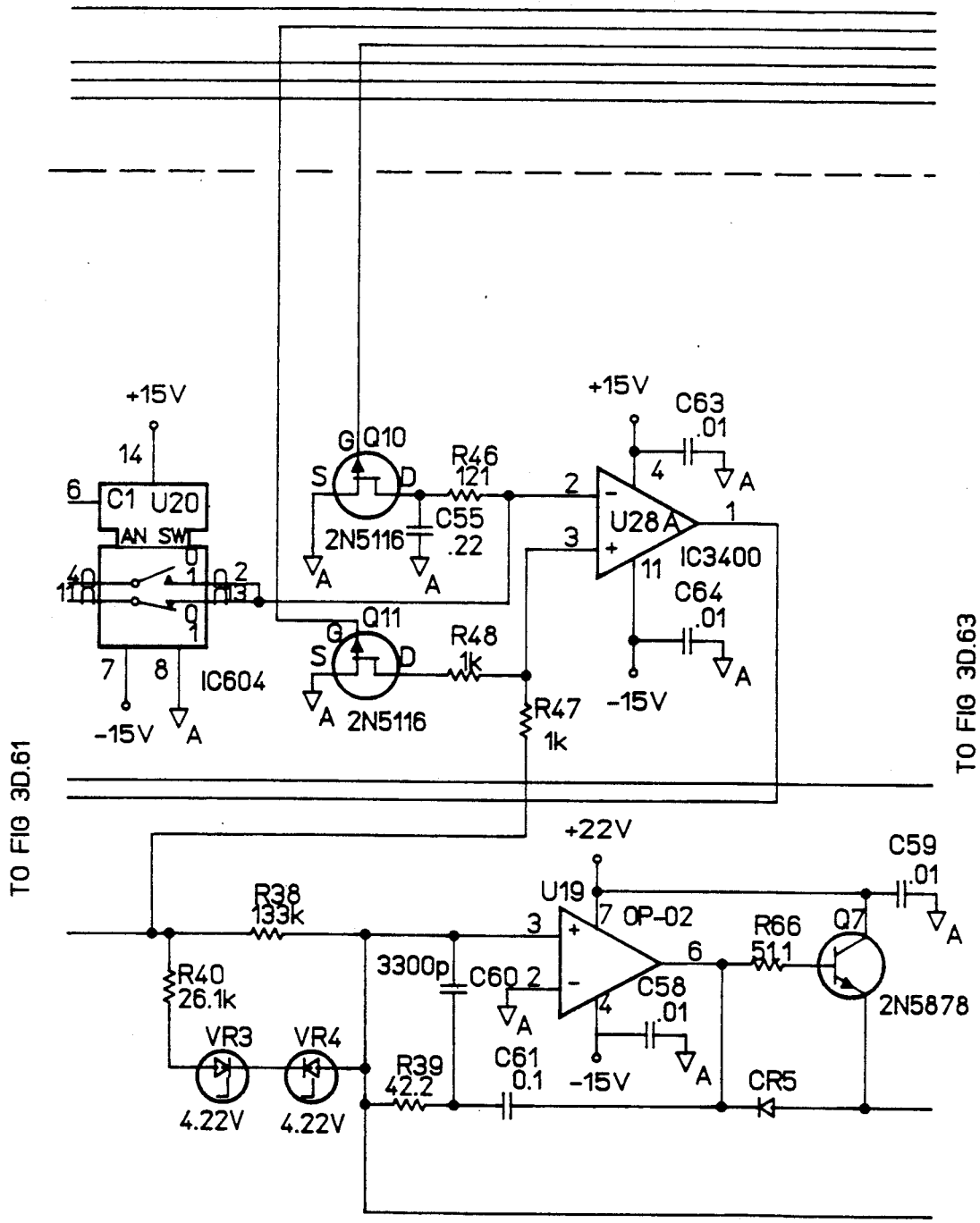
FIG 3D.62

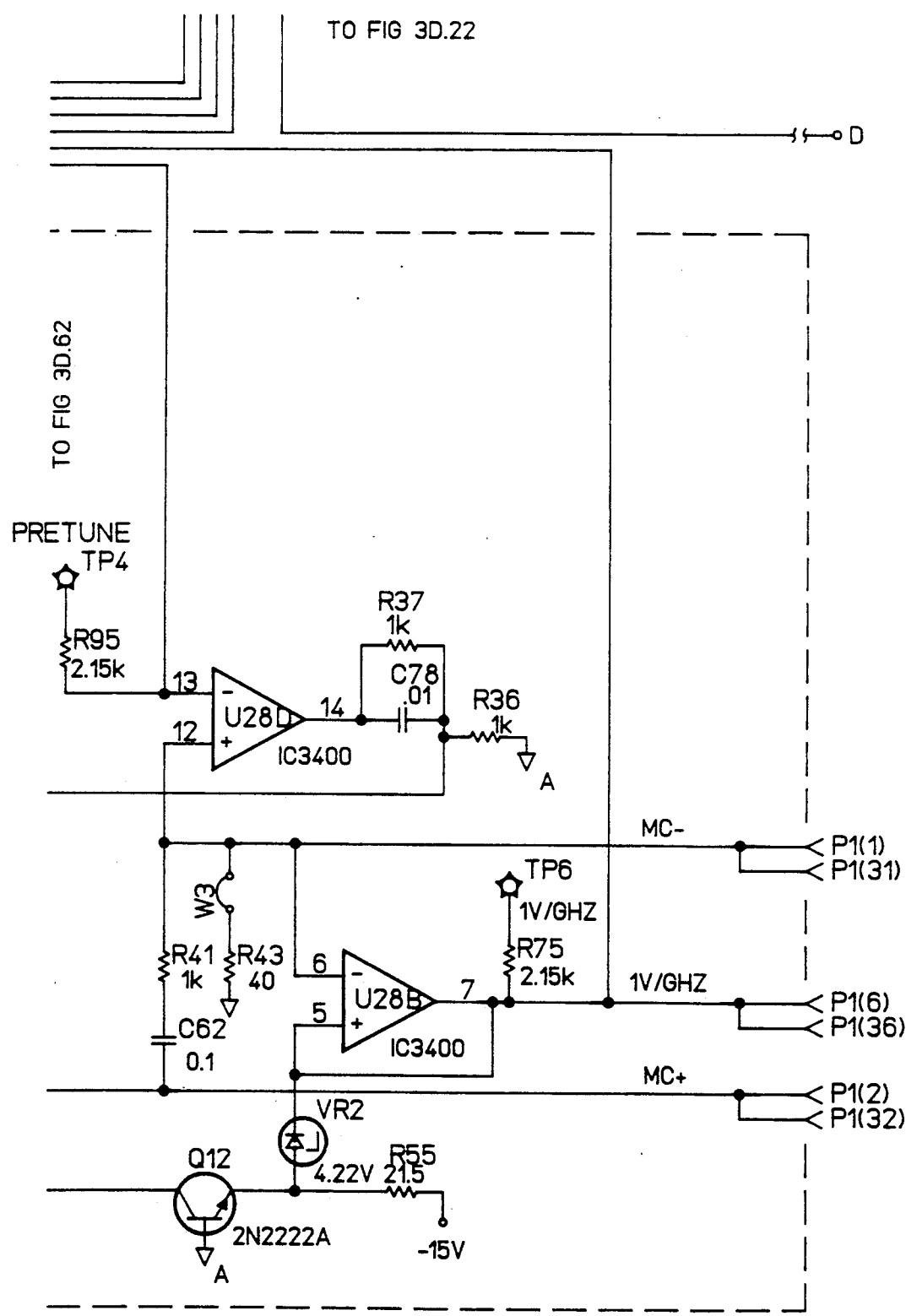
FIG 3D.63

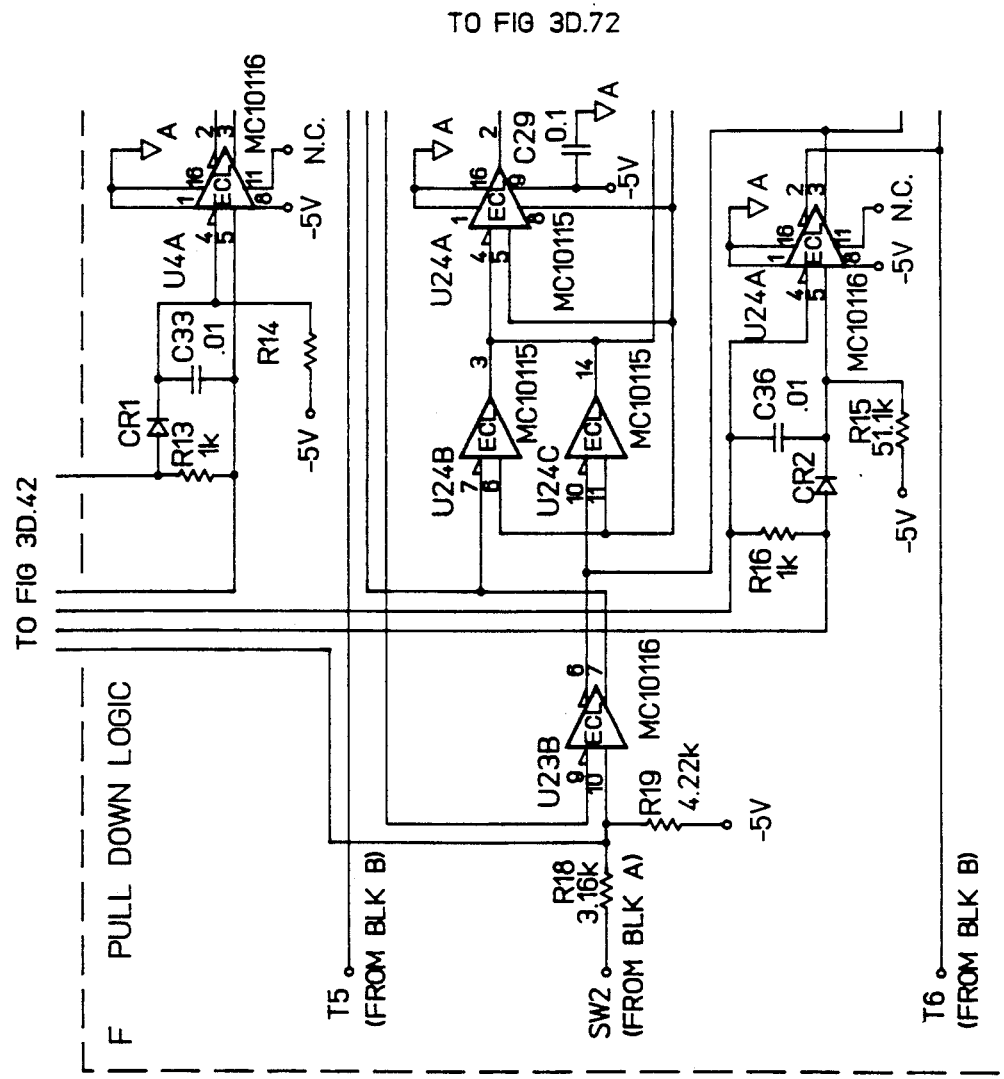
FIG 3D.71

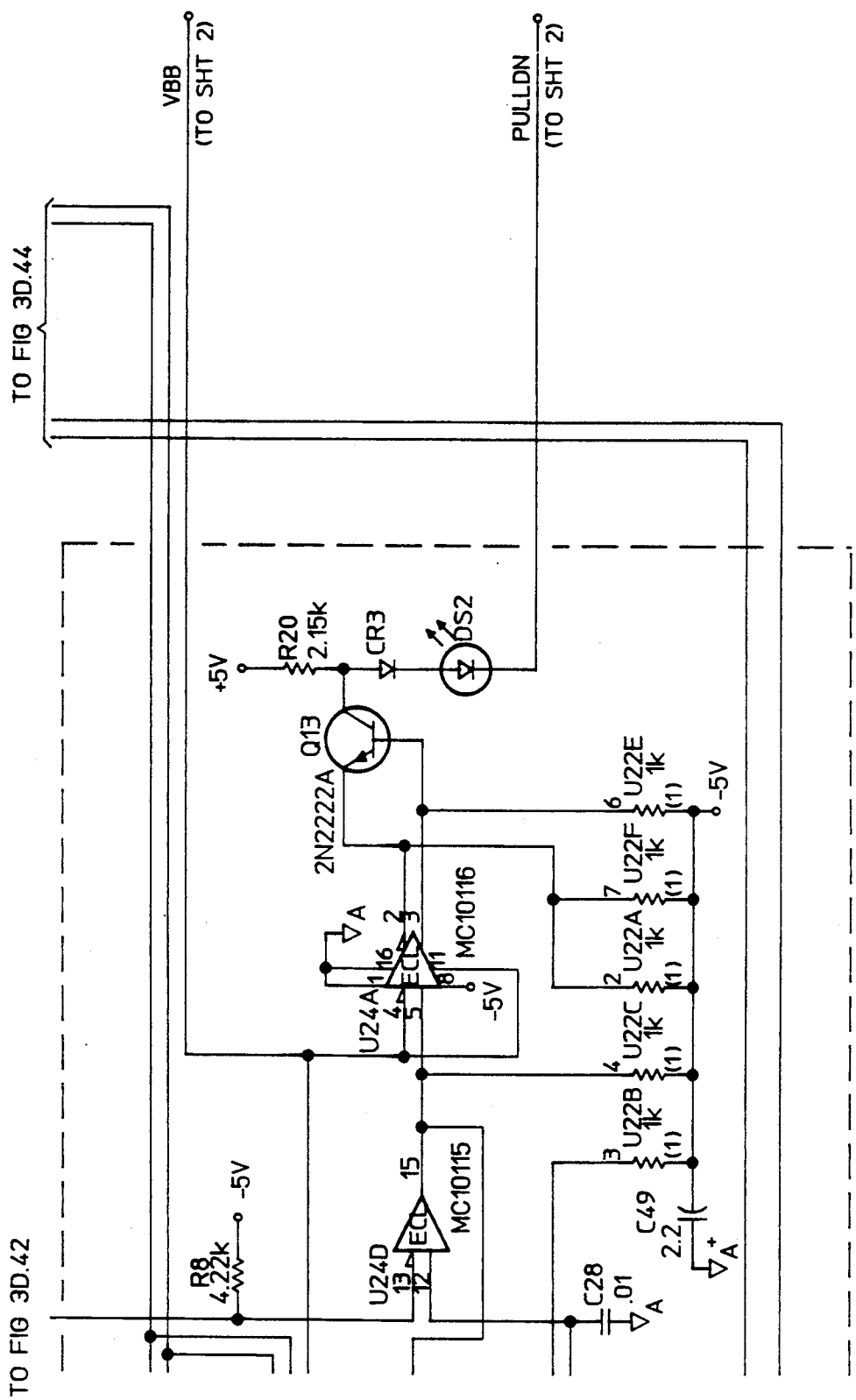
FIG 3D.72

| REFERENCE DESIGNATORS | |
|---|---|
| LAST USED | NOT USED |
| C97 | C81,89 |
| CR6 | |
| DS2 | |
| J1 | |
| L22 | L7,8,11,12 |
| P2 | |
| Q13 | |
| R113 | R30,31,35,42,56, 80-83,85,86,90 |
| TP11 | |
| U31 | |
| VR5 | |
| W3 | |

NOTES: UNLESS OTHERWISE SPECIFIED.
1. ALL RESISTOR VALUES ARE IN OHMS.
2. ALL CAPACITOR VALUES ARE IN MICROFARADS.
3. ALL INDUCTOR VALUES ARE IN MICROHENRIES.

FIG 3D.8

VECTOR NETWORK ANALYZER FOR SWEPT FREQUENCY HARMONIC AND MIXER CONVERSION LOSS MEASUREMENTS USING EITHER AN INTERNAL OR EXTERNAL SIGNAL SOURCE

This application is a continuation of application Ser. No. 07/327,284 filed Mar. 22, 1989, now abandoned.

BACKGROUND OF THE INVENTION

This invention relates to electronic test and measurement instruments and, more particularly, to electronic instrumentation for signal measurements during tests performed on radio frequency (RF) systems, subsystems, and associated components. Specifically, one embodiment of the invention is directed to a method and apparatus for measuring harmonics produced by RF devices, such as amplifiers, being tested, or for measuring conversion loss of mixers being tested, in response to swept frequency stimulii applied by either an internal or external signal source.

Active RF devices require both linear and non-linear characterization. When measuring linear and non-linear characteristics of a device under test (DUT), such as an amplifier or mixer, multiple test configurations are typically needed. This can be time-consuming, because each DUT must be moved between one test set-up to measure such characteristics as impedance, amplifier gain, and mixer conversion loss and another test set-up to measure harmonics.

Considered in more detail, the behavior of a DUT is linear when a sine wave input produces a sine wave output at the same frequency with only an amplitude and phase change. Examples of linear devices are filters and cables. Vector network analyzers have traditionally been used to measure the reflection and transmission characteristics of linear RF devices by applying a known swept frequency signal and then measuring the magnitude and phase of the transmitted and reflected signals. This requires a vector network analyzer configured in a first test set-up.

The output of a non-linear DUT is dependent on the power level of the input signal and is usually composed of multiple signal components at harmonically related frequencies. Examples of such non-linear RF devices are saturated amplifiers and mixers. The majority of measurements are linear, but many applications also require non-linear information. Today, the typical test set-up uses an external RF source to stimulate a DUT at a continuous wave (CW) frequency with a spectrum analyzer connected at the output of the DUT. The output spectrum of the DUT is then displayed. This technique provides high dynamic range and the ability to measure total harmonic distortion (including all harmonics, spurious and intermodulation products). However, in contrast to the use of a vector network analyzer for linear measurements, non-linear measurements are performed with a spectrum analyzer configured in a different test set-up.

SUMMARY OF THE INVENTION

One embodiment of the present invention provides a method and apparatus for swept frequency measurements of harmonics produced by non-linear RF devices, as well as mixer conversion loss, using either an internal or external signal source. A vector network analyzer in accordance with one embodiment of the invention dramatically simplifies and speeds linear and non-linear amplifier and mixer measurements on a device under test (DUT), such as impedance, amplifier gain, and mixer conversion loss, on the one hand, and measurement of harmonics, on the other hand.

Harmonic measurements require both a source and a receiver to be configured for the measurement. The source can be either an internal source incorporated into the vector network analyzer or an external source.

The source is preferably an internal source included in the vector network analyzer. In this case, the source oscillator is adjusted to produce a predetermined intermediate frequency (IF) over the entire range of the source. This is achieved by setting the local oscillator frequency, then pretuning the internal source and obtaining phase lock.

In the case of an external source, a local oscillator included in the vector network analyzer is adjusted to produce a predetermined IF. In contrast to the use of an internal source, this is limited to one octave of sweep, rather than over the entire range of the external source. In the case of the external source, the IF is measured with the local oscillator at one frequency. Then the frequency of the local oscillator is varied, and the IF is again measured by counting the difference in the IF. Depending on the change in the IF, the value of the local oscillator comb tooth can be determined. Also, based on the local oscillator frequency and a given comb tooth, the frequency of the external source can be calculated, which allows the vector network analyzer to be calibrated at the actual frequency of the external source, thereby obtaining accuracy comparable to that achieved when an internal source is used. Preferably, the external source is not swept until phase-locking is effected.

In the measurement of mixer conversion loss, plural sources are connected to the mixer, such as an internal source and an external source. The external source preferably generates the local oscillator signal input to the mixer, while the internal source, or another external source, supplies the RF stimulus. The signals fed to the mixer form a mixed product. The mixed product constitutes the output IF of the mixer connected to the vector network analyzer. In this case, the source of the vector network analyzer is offset from the receiver by the local oscillator frequency fed to the mixer being tested.

There is no longer a need for a conventional source/spectrum analyzer test set-up previously used to perform a harmonic or mixer conversion loss measurement at each CW frequency produced by the source. The present invention provides harmonic and mixer conversion loss measurements using an internal or external swept source which facilitates these measurements.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings. In the drawings:

FIGS. 3B-3D are schematic circuit diagrams of the vector network analyzer shown in FIGS. 3A and 4;

FIG. 6, comprising

DETAILED DESCRIPTION OF THE PREFERRED EMBODIMENTS

Figure 1:
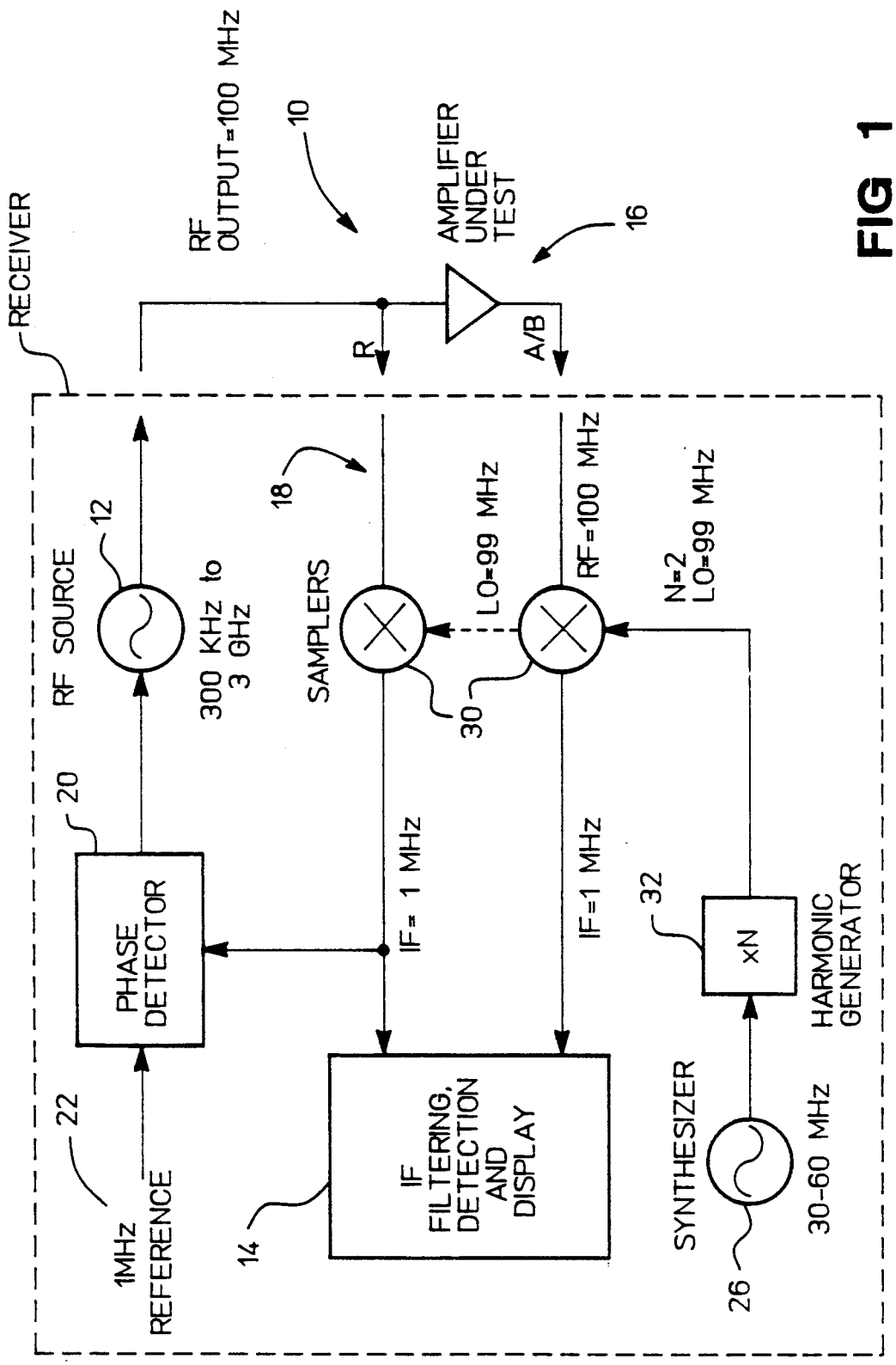
FIG. 1 is a functional block diagram of a vector network analyzer in accordance with one embodiment of the invention configured for conventional linear measurements.
Figure 2:
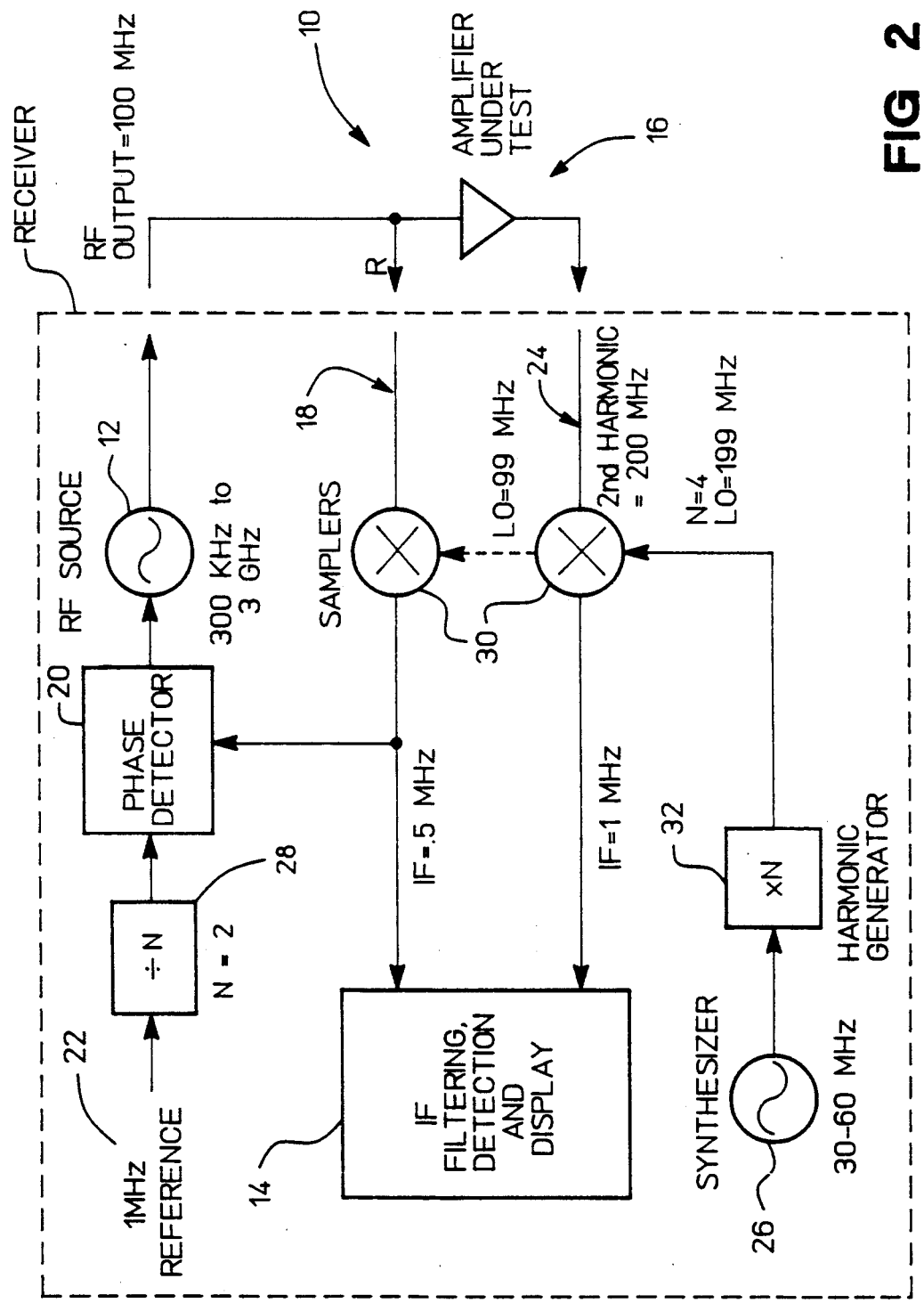
FIG. 2 is a functional block diagram of the vector network analyzer shown in FIG. 1 configured for 2nd harmonic measurements.

A vector network analyzer in accordance with one embodiment of the invention is shown in FIGS. 1 and 2, generally indicated by the numeral 10. The vector network analyzer 10 can comprise, for example, an HP 8753A vector network analyzer in which various improvements are incorporated, as described below.

The vector network analyzer 10 preferably comprises an internal RF signal source 12, whose frequency can be varied (swept) from 300 kHz to 3 or 6 GHz, for example. The output power of the RF signal source 12 is preferably varied under control of a processor means (not shown).

One embodiment of the invention provides the ability to measure harmonics over a frequency coverage from 300 kHz to 6 GHz. Preferably, the vector network analyzer 10 provides an integrated system that includes the internal swept synthesized RF signal source 12, receiver and display 14, and test set 16. A family of transmission/reflection and S-parameter test sets for 50 ohm (3 GHz) and 75 ohm (2 GHz) systems are preferably provided. Alternatively, a complete 6 GHz system can be configured including a 6 GHz S-parameter test set. This test set includes a frequency doubler that can be switched in to measure 3 MHzHz to 6 GHz in a single sweep or switched out to measure 300 kHz to 3 GHz. This test set exhibits less than 6 dB of insertion loss between the RF signal source 12 and the test port of the receiver 14 for as high as 14 dBm output power at the test port in the 3 GHz band. In the case of the 6 GHz S-parameter test set, optional 6 GHz receiver operation is added to any existing HP 8753A vector network analyzer. Overall performance is summarized in Table I below.

TABLE I

| Overall Performance Summary | |
|---|---|
| Frequency range (standard) | 300 kHz to 3 GHz |
| with Option 006 and HP 85047A test set | 300 kHz to 6 GHz |
| Frequency resolution | 1 Hz |
| Measurement range 300 kHz to 3 GHz | 0 dBm to −100 dBm |
| 3 GHz to 6 GHz | 0 dBm to −95 dBm |
| Dynamic accuracy (over a 40 dB range) | +/− .05 dB, +/− 0.3 deg |

FIG. 1 shows a functional block diagram which illustrates how the vector network analyzer 10 is typically configured to perform conventional linear measurements. The RF signal source 12 of the vector network analyzer 10 stimulates an amplifier, for example, under test (100 MHz in this example) connected to the test set 16. The incident and test signals are received and mixed down to a low frequency IF (1 MHz). The 1 MHz IF signal is filtered to remove unwanted signals and then measured by the receiver 14. The 1 MHz IF signal in a reference (R) channel 18 is also routed to one input of a phase detector 20. A second input of the phase detector 20 is fed by a stable 1 MHz frequency reference 22. The phase detector 20 produces an output voltage which is proportional to the phase difference between the two input signals. This voltage is used to fine tune the RF signal source 12 to a precisely specified frequency. This particular functional block diagram is capable of measuring the signals only at the RF signal source frequency.

The functional block diagram shown in FIG. 1 must be changed in order to measure non-linear behavior. For example, to measure output harmonics produced by the amplifier, it is necessary to measure an output frequency which is a multiple of the input frequency. The modified functional block diagram, shown in FIG. 2, illustrates one embodiment of the vector network analyzer 10 in accordance with the invention used to measure 2nd harmonics, for example.

To measure non-linear performance, such as the 2nd harmonic output level of the amplifier, the incident stimulus frequency is used as the reference signal (again, 100 MHz), while a test channel 24 is at two times the fundamental frequency to measure the 2nd harmonic. By multiplying a synthesized local oscillator (LO) 26 frequency (99.5 MHz) in the output test channel by two (2×LO=199 MHz), the 2nd harmonic (200 MHz) is mixed down to the desired 1 MHz IF of the receiver 14. In the Reference (R) channel 18, the fundamental (100 MHz) is mixed down (LO=99.5 MHz) to 0.5 MHz. When measuring the 2nd harmonic, the phase detector 20 reference signal is also 0.5 MHz due to the incorporation of a divide-by-N frequency divider 28 between the 1 MHz frequency reference 22 and the second input of the phase detector. Measurement of either the fundamental or 2nd harmonic signal, individually or as ratios (dBc), can be displayed. Harmonic measurement performance is summarized in Table II below.

TABLE II

| Harmonic Measurement | |
|---|---|
| Frequency range | 16 MHz to 3 or 6 GHz |
| Dynamic range | 40 dBc |

Figure 3A:
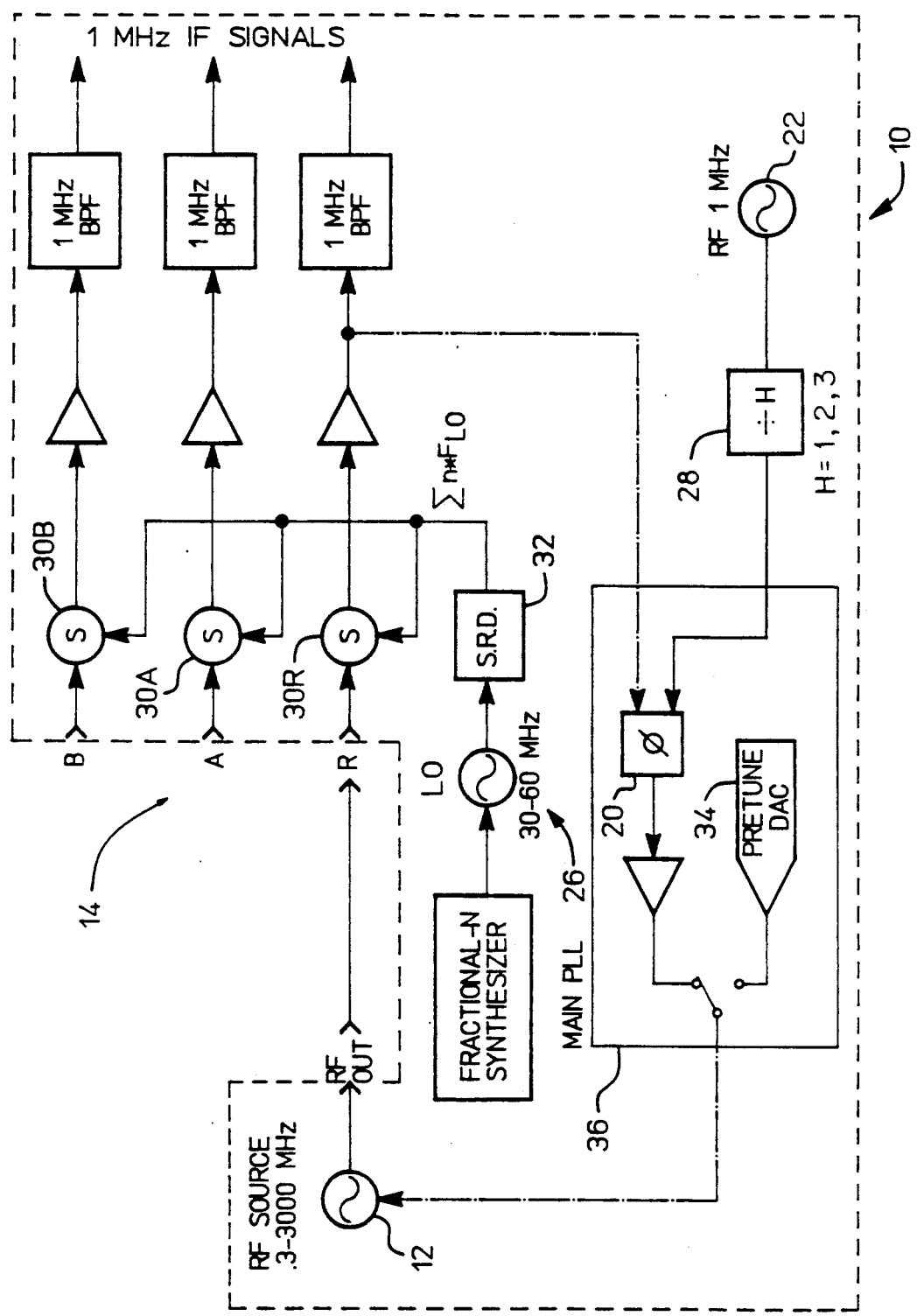
FIG. 3A is a more detailed block diagram of the vector network analyzer shown in FIG. 2.
Figure 3B:
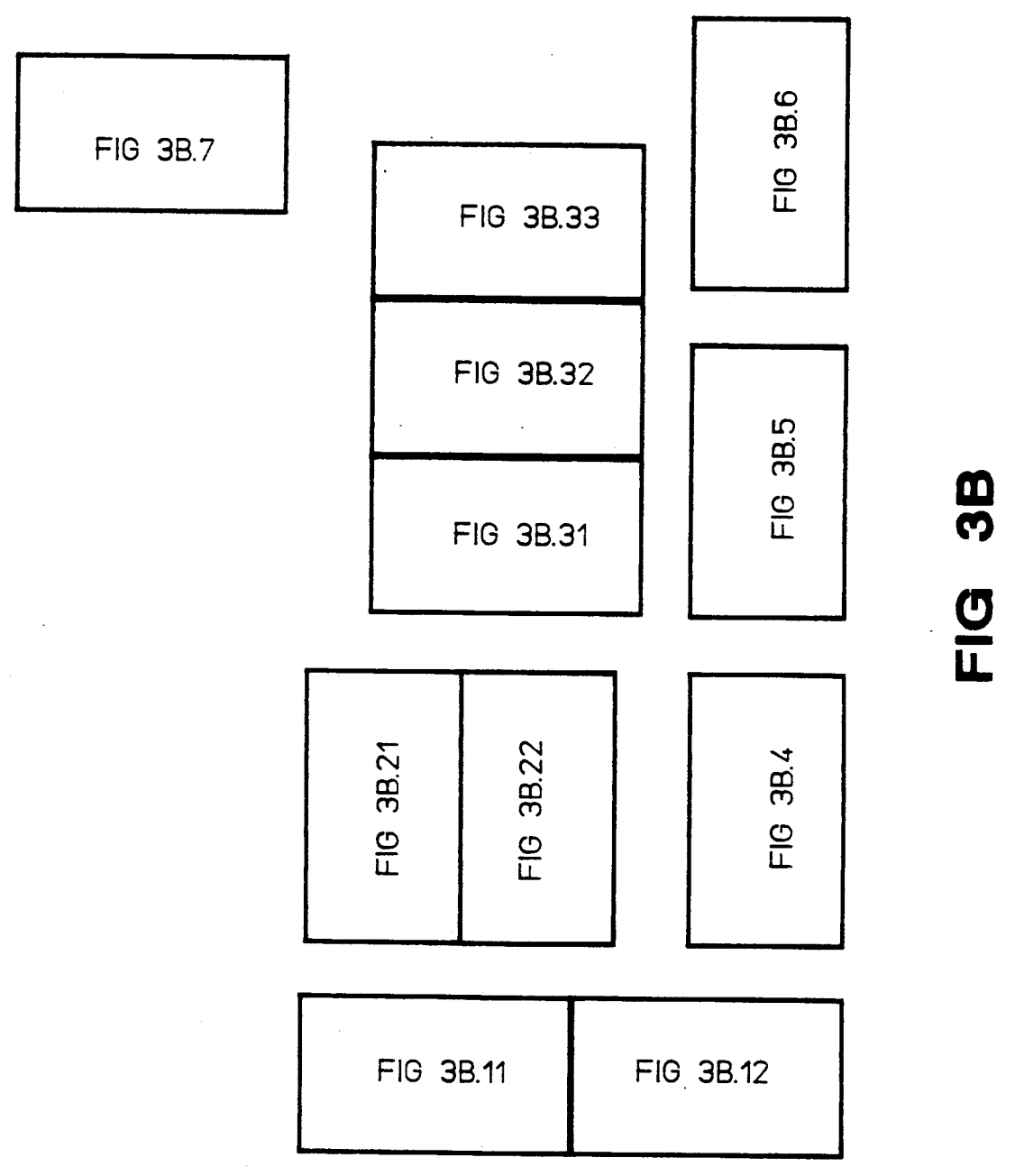
Figure 3C:
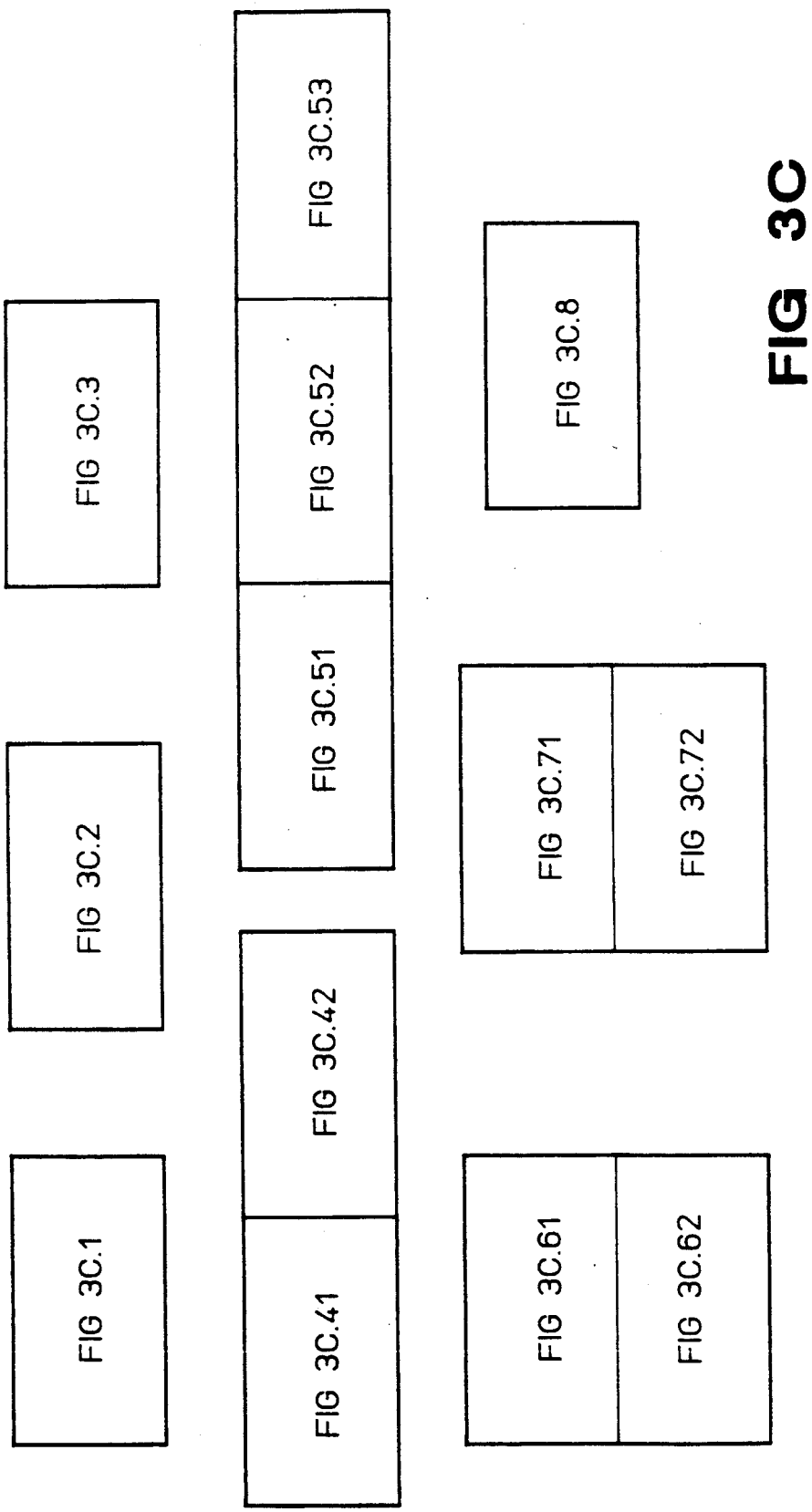

Considered in more detail, the three channels (R, A, B) of the receiver of the vector network analyzer 10 are connected to samplers 30R, 30A, and 30B that downconvert the RF signal to a 1 MHz IF signal, for example, as shown in FIG. 3A. These signals can then be amplified, filtered, and fed to IF detectors that further process these signals, with the digital signal processing capability of the processor means, to extract their fundamental amplitude and phase information, as shown in FIG. 3. This amplitude and phase information can then be further processed and displayed on a display (not shown) to the user in a variety of formats.

The local oscillator (LO) signal for the sampler downconverters 30 is derived from a pulse generator 32 that is driven from a low frequency (30 to 60 MHz) fractional-N synthesizer. This synthesizer 26 is controlled by the processor means and can be programmed to linearly sweep. The frequency of the integral RF signal source 12 is preferably controlled by phase locking it to an appropriate harmonic of this low frequency synthesizer 26. This is accomplished by first roughly pretuning the RF signal source 12 using a pretune DAC 34 to a frequency slightly above the desired RF frequency.

The IF signal from the R sampler 30R is then compared with the 1 MHz reference signal in a main phase lock loop 36, and the error signal is used to accurately phase lock the RF signal source 12 to the desired frequency. This frequency relationship then is described as:

$$Frf = N*Flo + Fif \qquad (1)$$

where Frf is the desired RF output frequency, Flo is the frequency of the low frequency synthesizer 26, N is the local oscillator harmonic number (comb tooth) being used, and Fif is the frequency of the downconverted IF signal. By sweeping the low frequency synthesizer 26, the processor means can sweep the RF output frequency.

The measurement of harmonics produced by a device under test (DUT) in accordance with the embodiment of the invention shown in FIGS. 2 and 3 is performed as follows. This embodiment enables the measurement of harmonics present on the three signal channels (R, A, B). To understand how the vector network analyzer 10 operates, Equation 1 can be generalized to show how the harmonics of the input frequency are downconverted.

$$H*Frf = H*N*Flo + H*Fif \qquad (2)$$

This shows that the RF signal fundamental and its harmonics are replicated in the IF (i.e., the second RF harmonic appears as a second IF harmonic). With no changes in the fundamental IF frequency, filters and IF detectors would be needed that worked at all the harmonic frequencies (i.e., 2 MHz, 3 MHzHz, etc.). This is both an expensive and potentially inaccurate technique.

The vector network analyzer 10 instead reduces the fundamental IF frequency by 1/H when measurement of the Hth harmonic is desired. This entails putting the frequency divider 28 between the 1 MHz reference frequency and the phase comparator 20 in the main phase lock loop 36. This means that the desired harmonic component is positioned at the 1 MHz frequency required by the IF filters and detectors. Because the reference frequency to the main phase lock loop can be changed from 1 MHz to 500 KHz to 333.333 KHz, etc., the fundamental IF frequency also changes from 1 MHz to 500 KHz to 333.333 KHz, etc., when changing from the normal fundamental measurement to the 2nd or 3rd harmonic, etc. This achieves the desired results.

When the fundamental IF is at 500 KHz, the second harmonic is at 1 MHz, so it can be accurately processed by the same IF filters and detectors with which the 1 MHz fundamental was processed. Likewise, for 3rd harmonic measurements, the fundamental IF is 333.333 KHz. The 3rd harmonic of the IF, which is determined by the 3rd harmonic of the RF input signal, is now at 1 MHz and can be processed, detected, and displayed.

The vector network analyzer 10 can be used up to the Hth harmonic, although the specific implementation shown in FIGS. 2 and 3 only supports the 2nd and 3rd harmonic measurements. Although FIGS. 2 and 3 show the harmonic measurement in the normal internal RF signal source mode of operation, the same structure can and does work to make harmonic measurements with an external source as well. It combines in one instrument the advantages of an integral synthesized source (low cost, high speed, swept synthesized accuracy) with the advantages of being able to lock to an internal or external swept source.

It should also be realized that the Hth harmonic of the RF harmonic is downconverted by the Hth harmonic or comb tooth of the local oscillator 26. The downconversion efficiency (or gain) will not be the same at the 2Nth comb tooth as it was at the Nth comb, so a different calibration factor is computed and used for the harmonic measurement than is used for the fundamental measurement. These calibration factors are determined, at instrument calibration time, by comparing the measurements from a power meter with the analyzer measurements when measuring a fundamental at frequency H*Frf and compensating for the slight shift in Flo due to the change in IF frequency from Fif to Fif/H. By using built-in calibration firmware, the amplitude of these harmonic measurements can be calibrated and referenced to a power meter standard and then corrected in "real-time," that is, measurements are performed and traces are displayed in a period of time short enough that they appear to the user to be performed substantially instantaneously.

The goal of harmonic calibration is to measure the frequency response at the frequencies and under the conditions used by the harmonic measurement mode, but without relying on an external ideal or known harmonic generator. The assumption made is that the R, A, and B channels are linear, i.e., the frequency response to the harmonic is no different with or without a fundamental frequency present.

This is achieved by setting up the vector network analyzer 10 for a harmonic measurement, but then offsetting the RF signal source 12 by 1× (2× in 3rd harmonic mode) the fundamental, and setting the reference frequency divider 28 to the divide-by-one setting. Now the local oscillator 26 and the control settings are the same as for a harmonic measurement, but the RF signal source 12 is at the frequency where the harmonic should be, and the IF phase-locked to is the same as in a harmonic measurement. Thus, the vector network analyzer 10 is phase-locked to and measuring the RF signal source fundamental, but executing the firmware as if setting up a harmonic measurement.

The following source code applies to calibration of 2nd and 3rd harmonic measurements. Section A executes the setup of power and channel for channel R. Section B shows the loop for measuring the power for linear mode and "pltype"=normh2 and normh3 (for 2nd and 3rd harmonics) for channel R. Section C shows the setup for each band to turn on the harmonic measurement mode and to turn on frequency offset to move the RF signal source 12 away from the nominal center frequency. Section D enters for each frequency, the actual frequency offset (=1× or 2× the frequency). Section E shows the bypassing of the reference divided setup if pltype is either harmonic measurement mode type (for 2nd and 3rd harmonic measurements). Finally, Sections F, G, and H repeat this procedure for channels A and B.

```
#EJECT;
COMMENT
  Main procedure begins here.
;

dummytest := test_done;
   warn (check_eeprom_write);
   IF wait_for_resp (yes_abort) = abort_response THEN
      dummytest := test_not_done
   ELSE
      BEGIN  & ok to write to eeprom &
      chk_ee_jmp;
      option2 := NOT TBIT( option_num, 2 ) ;
      option6 := NOT TBIT( option_num, 1 ) ;
      optiontest:=NOT TBIT( option_num, 3 );
      chk_dbl;
      s_preset;
      s_off( Csampler_cal );
      IF do_dbl_cal AND
                eeByte(ts_85047) = 0 THEN    & really is 85047 &
         BEGIN
         IF pl_tbl_length = 0 THEN                  & if table empty &
            BEGIN
            source_power := 6.0;
            dblsource_power := 20.0;
            END
         ELSE
            BEGIN
            source_power := 6.0
                  + real_power_comp (QUAD (def_freq_50),1);
            IF source_power >20.0 THEN source_power := 20.0;
            dblsource_power := 20.0
                  + real_power_comp (QUAD (def_freq_50),1);
            IF dblsource_power >20.0 THEN source_power := 20.0;
            END;
         END
      ELSE
         BEGIN
         IF pl_tbl_length = 0 THEN                  & if table empty &
            source_power := target_power + 6.0     & assume only split&
         ELSE
            source_power := target_power
                  + real_power_comp (QUAD (def_freq_50),1);
         dblsource_power := 20.0; & must be 'fake' 85047, but still dbler&
         END;
      s_cmd (Csweep_time);  s_entry (1.0);        & for pm settling &
      s_cmd (Ccontinuous);

measurement := r_mag;
      s_off(Csensor);   & setup ch A sensor &
      IF option6 THEN s_off(Cdoubler);
      s_cmd (Catten_port2); s_entry(10);
      s_cmd (Cs12);
      s_swp (1);  & to get switched to port 2 and thus the attenuator &
      s_cmd (Csource_power);  s_entry (source_power);
```

```
         s_cmd (Cr);
         s_cmd (Clinear_mag);
         s_cmd (Cscale);  s_entry (200.0a-3);            & appearances only &
         s_cmd (Cref_pos); s_entry_int (1);        & appearances only &
         s_cmd (Cref_val); s_entry_int (0);           & appearances only &
         s_cmd (Cmarker_1); s_entry( 2.3a9 ); & must be done after format ? &
      IF do_dbl_cal THEN
          prompt (connect_s_to_rpx2)
      ELSE
          prompt (connect_s_to_rp);
      IF wait_for_resp (cont_abort) = abort_response THEN
          dummytest := test_not_done
      ELSE
          BEGIN  & connections done (for R) &
          clear_r_eep;   & not necessary, helps debugging &
          FOR pltype := normpl TO normh3 DO
              IF pltype=normpl OR
                  (pltype=vvpl OR option2) THEN
                  cover_bands;   & for R & pltype := normpl;

IF do_dbl_cal THEN
         BEGIN
         IF e_ch_bit(Cmeter_addr) THEN
             prompt(new_sensor)
         ELSE
             prompt(new_sensor_438);
         IF wait_for_resp(cont_abort) = abort_response THEN
             dummytest := test_not_done
         ELSE
             BEGIN
             s_on (Cdoubler);
             s_on(Csensor);    & choose sensor in ch B &
             s_cmd (Csource_power);  s_entry (dblsource_power);
             FOR pltype:= normpl TO normh3 DO
                 IF pltype=normpl OR
                     (pltype=vvpl OR option2) THEN
                     cover_dbl_bands;
             pltype := normpl;
             get_extra_dbler_val;
             s_off(Cdoubler);
             END;
         END; & do doubler cal &

IF dummytest <> test_not_done THEN
         BEGIN  & did not abort when getting new sensor &
      & NOW DO A and B & clear_ab_eep;
      s_on( Csampler_cal );
      FOR measurement := a_mag TO b_mag DO
         BEGIN     & do A and B &
         s_cmd (IF measurement = a_mag THEN Car
             ELSE                         Cbr);
```

```
COMMENT
The following lines are important, they turn off the odd functions
so the autodelay can be used to minimize the A/R phase shift and
keep the sampler cal phase values from being so large that the
real and imaginary interpolation doesn't give wierd answers.
;
    s_cmd (Cfreq_o_val);s_entry(0);
    s_off(Cfreq_offset);
    IF option2 THEN s_cmd(Charm_off);

s_cmd (Csource_power);  s_entry (source_power);&off by Cdoubler&
    s_cmd (Clog_polar);     & actually does lin polar &
    s_cmd (Cpolar_lin_mkr);
    s_cmd( CIF_bw ); s_entry_int( 3000 );
    s_cmd( Cnumber_pts ); s_entry_int( 201 );
    &  s_full_swp  &
    s_cmd (Clin_freq);
    s_cmd (Cstart);   s_entry (300.0a3);
    s_cmd (Cstop);    s_entry (3.0a9);
    s_swp (1);

s_cmd (Ccontinuous);
    IF do_dbl_cal THEN
        prompt (IF measurement = a_mag THEN connect_s_to_rax2
            ELSE                         connect_s_to_rbx2)
    ELSE
        prompt (IF measurement = a_mag THEN connect_s_to_ra
            ELSE                         connect_s_to_rb);
    IF wait_for_resp (cont_abort) = abort_response THEN
        dummytest := test_not_done
    ELSE
    BEGIN     & connections to A,B done &
    FOR pltype:= normpl TO normh3 DO
        BEGIN
        IF pltype=normpl OR
           (pltype=vvpl OR option2) THEN
            BEGIN
            s_cmd (Cfreq_o_val);s_entry(0);
            s_off(Cfreq_offset);
            IF option2 THEN s_cmd(Charm_off);
            s_cmd( CIF_bw ); s_entry_int( 3000 );
            s_cmd( Cnumber_pts ); s_entry_int( 201 );
            &  s_full_swp  &
            s_cmd (Clin_freq);
            s_cmd (Cstart);   s_entry (300.0a3);
            s_cmd (Cstop);    s_entry (3.0a9);
            s_swp (1);

s_cmd ( Cauto_delay );
            s_swp( 1 );
            COMMENT
             this auto delay is needed to minimize the
             phase length which screws up the sampler cal
             when actually used, and interpolated by real and
             imaginary components. But for pltype for the
             harmonics, the actual measured freq is 2 or 3 times
```

```
                    the CW freq entered, thus the electrical delay needs
                    to be adjusted by a factor of 2 or 3.
                    Also, the number is stored so it can be used by the
                    doubler loop.
                    ;
              ┌── elec_delay[pltype] := ( elecDelay[getParamIndex(
                                            curr_e_ch),curr_e_ch])*
         G    │                              (pltype-normpl+1);
              │   elecDelay[getParamIndex(curr_e_ch),curr_e_ch] :=
              │                              elec_delay[pltype];
              └── s_cmd (Cnumber_pts); s_entry_int (11);
                  s_cmd (CIF_bw); s_entry_int (100);
          s_cmd (Csweep_time); s_entry (0.140); & needs>137,7May86,dse&

H    ┌── cover_bands;
              └── END; & if do this pltype &
              END; & for each pl type & pltype := normpl;

IF do_dbl_cal THEN
           BEGIN
           IF eeByte(ts_85047) <> 0 THEN
              BEGIN
              prompt(add_doubler);
              IF wait_for_resp (cont_abort) = abort_response THEN
                 dummytest := test_not_done;
              END;
           IF dummytest <> test_not_done THEN
           BEGIN
           s_on (Cdoubler);
           s_cmd (Csource_power);  s_entry (dblsource_power);
           FOR pltype := normpl TO normh3 DO
              IF pltype=normpl OR
                 (pltype=vvpl OR option2)  THEN
                 BEGIN
                 elecDelay[getParamIndex(curr_e_ch),curr_e_ch] :=
                                         elec_delay[pltype];
                 IF pltype=normpl THEN get_extra_dbler_val;
                 cover_dbl_bands;
                 END;
           pltype := normpl;
           s_off(Cdoubler);    & turn doubler off (for next chan) &
           END;
           END;

END; & connections to A,B done &

END;    & FOR A TO B DO    &

END; & if used new sensor &
  END; & connections done (for R) &
 END;  & ok to write to eeprom &

IF dummytest <> test_partial THEN test_result := dummytest
 ELSE
     test_result := test_not_done;
 pltype := normpl;

END rf_if_alignment;
```

```
    accum := 3;
    cover_start_band;
 END;

SUBROUTINE cover_bands;
  BEGIN
  min_freq:= minf[pltype];
  IF do_dbl_cal THEN
      max_freq:= maxf_dbl[pltype]
  ELSE
      max_freq:= maxf[pltype];
  CASE pltype OF
      BEGIN
      & normpl & BEGIN
                s_off(Cfreq_offset);
                IF option2 THEN s_cmd(Charm_off);
                END;
      & normh2 & BEGIN
                s_on (Cfreq_offset);
                s_cmd(Charm_2 );
                END;
      & normh3 & BEGIN
                s_on (Cfreq_offset);
                s_cmd(Charm_3 );
                END;
      & vvpl   & BEGIN
                s_off(Cfreq_offset);
                IF option2 THEN s_cmd(Charm_off);
                END;
      & vvh2   & BEGIN
                s_on (Cfreq_offset);
                s_cmd(Charm_2 );
                END;
      & vvh3   & BEGIN
                s_on (Cfreq_offset);
                s_cmd(Charm_3 );
                END;
      END; & case &
  FOR band := startband[pltype] TO dblband[pltype] DO
    BEGIN
    IF NOT (do_dbl_cal AND (band=dblband[pltype])) THEN
    BEGIN
    s_term_int ("Band", band);
    IF pltype <= normh3 THEN
       BEGIN
       band_start :=start_freq_of_band [band];
       band_stop  := start_freq_of_band [band+1];
       END
    ELSE
       BEGIN
       band_start :=vvSFreqsrvc[band];
       band_stop  :=vvSFreqsrvc[band+1];
       END;
    IF band_start < min_freq THEN band_start := min_freq;
```

```
       band_start := band_start + band_margin;
    IF band_stop > max_freq THEN band_stop := max_freq;
    band_stop := band_stop - band_margin;

IF band = first_band THEN
       cover_first_band        & only happens for pltype=normpl,vvpl &
    ELSE
     BEGIN IF band=dblband[pltype]  THEN
          do_multband
       ELSE
          BEGIN
          accum := 0;
          cover_start_band;

cover_stop_band;
          END;

END; & cover bands > first &

END; &if do_dbl_cal&
    END; & for/to band &
END cover_bands;

SUBROUTINE cover_dbl_bands;
  BEGIN
  min_freq:= minf[pltype];
    max_freq:= maxf_dbl[pltype];
  CASE pltype OF
     BEGIN
  & normpl & BEGIN
             s_off(Cfreq_offset);
             IF option2 THEN s_cmd(Charm_off);
             END;
  & normh2 & BEGIN
             s_on (Cfreq_offset);
             s_cmd(Charm_2 );
             END;
  & normh3 & BEGIN
             s_on (Cfreq_offset);
             s_cmd(Charm_3 );
             END;
  & vvpl   & BEGIN
             s_off(Cfreq_offset);
             IF option2 THEN s_cmd(Charm_off);
             END;
  & vvh2   & BEGIN
             s_on (Cfreq_offset);
             s_cmd(Charm_2 );
             END;
  & vvh3   & BEGIN
             s_on (Cfreq_offset);
             s_cmd(Charm_3 );
```

```
#EJECT;
COMMENT
    This subroutine is responsible for all frequency-dependent
    and band-dependent data.
    If extra points per band are added, put them at the end.
;
COMMENT
    For the last band, a special modification of the basic band edge
    straight line correction is done. Its purpose is split the error
    equally between the band edge and a the mid band frequency of 2.3Ghz.
    This was required since the sampler performance in the last band has
    some peaking at 3 Ghz, leaving excessive error droop throughout
    the middle portion of the band. The formula used for predicting the
    modified end of band target point is y(stored) = y0 + ( y1 + y2 - 2*y0)*(x2 - x0)/(x1 + x2 - 2*x0 )

where 0, 1, and 2 are the first, middle and second point.
    The same linear averaging is done on magnitude and phase.
    No compensation is done to improve the mag/phase vs x,y
    interpolation errors.
    This is simplified into the form y(stored) = (1 - 2*k)*y0 + k*y1 + k*y2

For low band, the measurements are done in reverse order to
    allow the same averaging algorithm to be used.

********
    The 87538 only uses this stuff for low band !!!!
********
;

SUBROUTINE do_meas_store;
    BEGIN
        s_cmd(Cfreq_o_val);s_entry(0);
        s_cw (freq );
        s_term_real ("Freq",freq);
        CASE pItype OF
            BEGIN
            & normpl  & harmfreq := freq;
            & normh2  & BEGIN
                        harmfreq := 2*freq;
                        s_cmd(Cfreq_o_val);s_entry(freq);
                        END;
            & normh3  & BEGIN
                        harmfreq := 3*freq;
                        s_cmd(Cfreq_o_val);s_entry(2*freq);
                        END;
            & vvpl    & harmfreq := freq;
            & vvh2    & BEGIN
                        harmfreq := 2*freq;
                        s_cmd(Cfreq_o_val);s_entry(freq);
                        END;
            & vvh3    & BEGIN
                        harmfreq := 3*freq;
```

```
                    s_cmd(Cfreq_o_val);s_entry(2*freq);
                  END;
        END; & case &
    s_swp(1);
    IF measurement = r_mag  THEN
        r_meas_store
    ELSE
        ab_meas_store;
  END;

SUBROUTINE cover_mult_band;
  BEGIN
    freq := band_start;
    offset := measurement;
    do_meas_store;
    freq := midfreq;
    offset := measurement + s_rec_size;
    do_meas_store;
    freq := band_stop;
    offset := measurement + s_rec_size + s_rec_size;
    do_meas_store;
  END;

SUBROUTINE do_multband;
   BEGIN
   midfreq:= midfreqtbl[3*pltype+(band-dblband[pltype])];
   IF (pltype = normh3) AND (pltype = vvh3)   & 3rd harmonic, last &
              AND                              & band only goes to 1GHz&
        (NOT do_dbl_cal)                       & so use lower mid freq &
      THEN
        midfreq := .95a9;
   cover_mult_band;
  END;

SUBROUTINE cover_stop_band;
  BEGIN
    freq := band_stop;
    offset := measurement + s_rec_size;
    do_meas_store;
  END;

SUBROUTINE cover_start_band;
  BEGIN
    freq := band_start;
    offset := measurement;
    do_meas_store;
  END;

SUBROUTINE cover_first_band;
  BEGIN
    accum := 1;
    cover_stop_band;

accum := 2;
    freq := 750000.;
    do_meas_store;
```

```
#EJECT;
COMMENT
**************************************************************
*            SPECIFICATION FOR  set_up_ref
*
* FUNCTION:  Sets up the reference board for the proper main phaselock
*            reference frequency.  IF not in vector voltmeter mode,
*            THEN use the sweep table to determine what band type we're
*            in.  Otherwise use vv_band local global.  Assumes the
*            sweep table pointers are positioned.
**************************************************************
;
PROCEDURE set_up_ref(chan);
VALUE chan;
INTEGER chan;
BEGIN
  INTEGER inst_mode, band_type;

inst_mode := chBitmap(Cmode_NA, chan);

IF (inst_mode = 0) OR (inst_mode = 3) THEN
    BEGIN  & ** network analyzer or tuned receiver ** &
      IF (swp_tbl_int_ptr[band] >= 2) OR (harmMode[chan] <> 1) THEN
        band_type := high_band
      ELSE
        band_type := low_band;
    END    & ** network analyzer or tuned receiver ** &
  ELSE
    BEGIN  & ** vector voltmeter mode ** &
      IF vv_band < 2 THEN
        band_type := low_band      & ** low band or low low band ** &
      ELSE
        band_type := high_band;    & ** mid band or high band ** &
    END;   &  vector voltmeter mode  & ref_set_vco_div(band_type);
IF band_type = high_band THEN
  BEGIN  & ** high band ** &
    set_sampler_hb;
    turn_off_samplers(acq_param,chan);
    IF last_band = low_band THEN
                &delay is contents of eeprom loc. in ms&
                  &minimum total delay of 1.5ms&
      cntrlWait(150 + INTEGER(eeByte(lb_to_hb_dly))*100);

END    & ** high band ** &
ELSE
  set_sampler_lb;

last_band := band_type;   &can be eliminated with code noted above&

IF pltype <> normpl  THEN    & must be a service test &
  ref_set_pll_ref_div(1)
ELSE
  ref_set_pll_ref_div(harmMode[chan]);

END set_up_ref;
```

Figure 4:
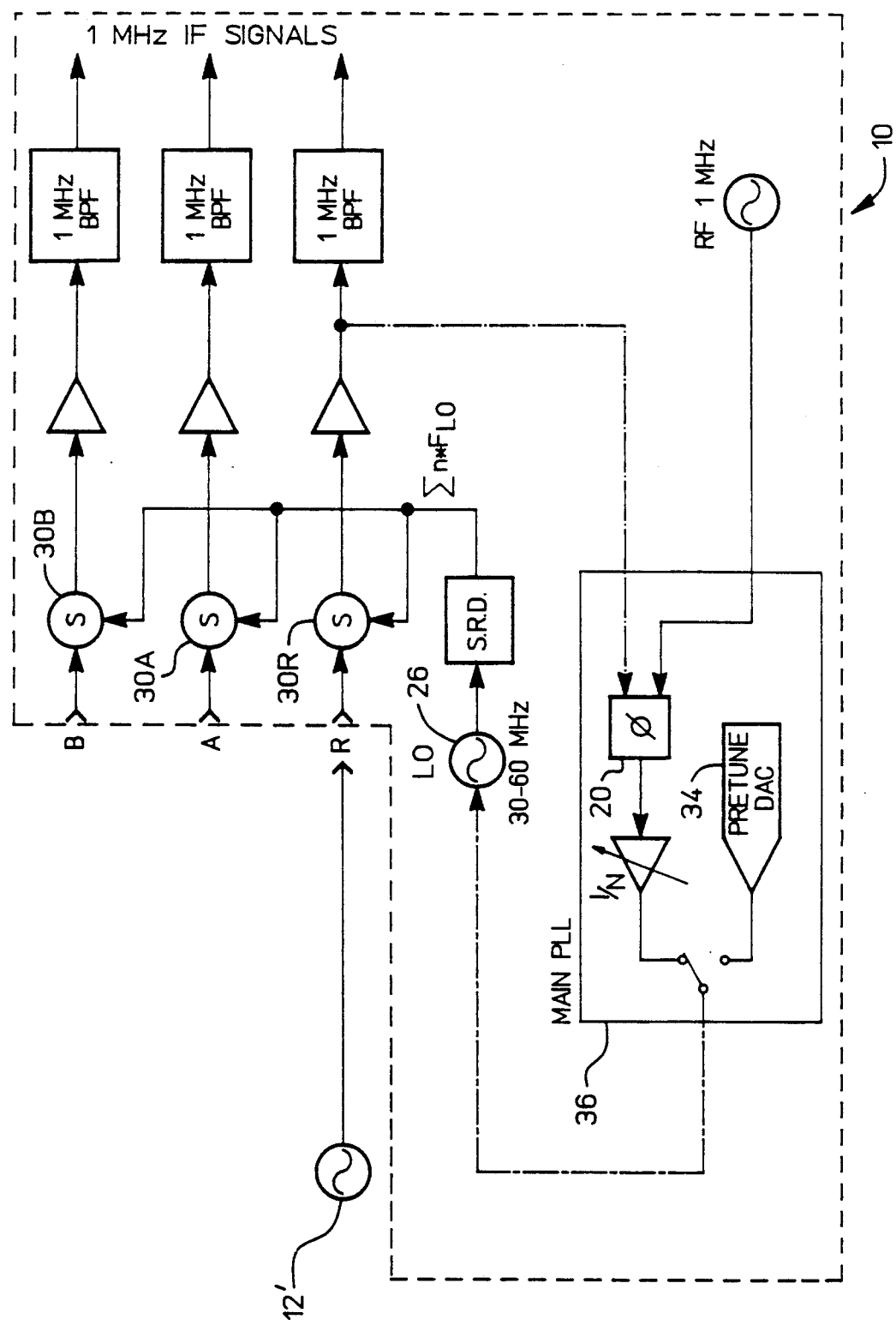
FIG. 4 illustrates a modification of the vector network analyzer shown in FIG. 2.
Figure 5:
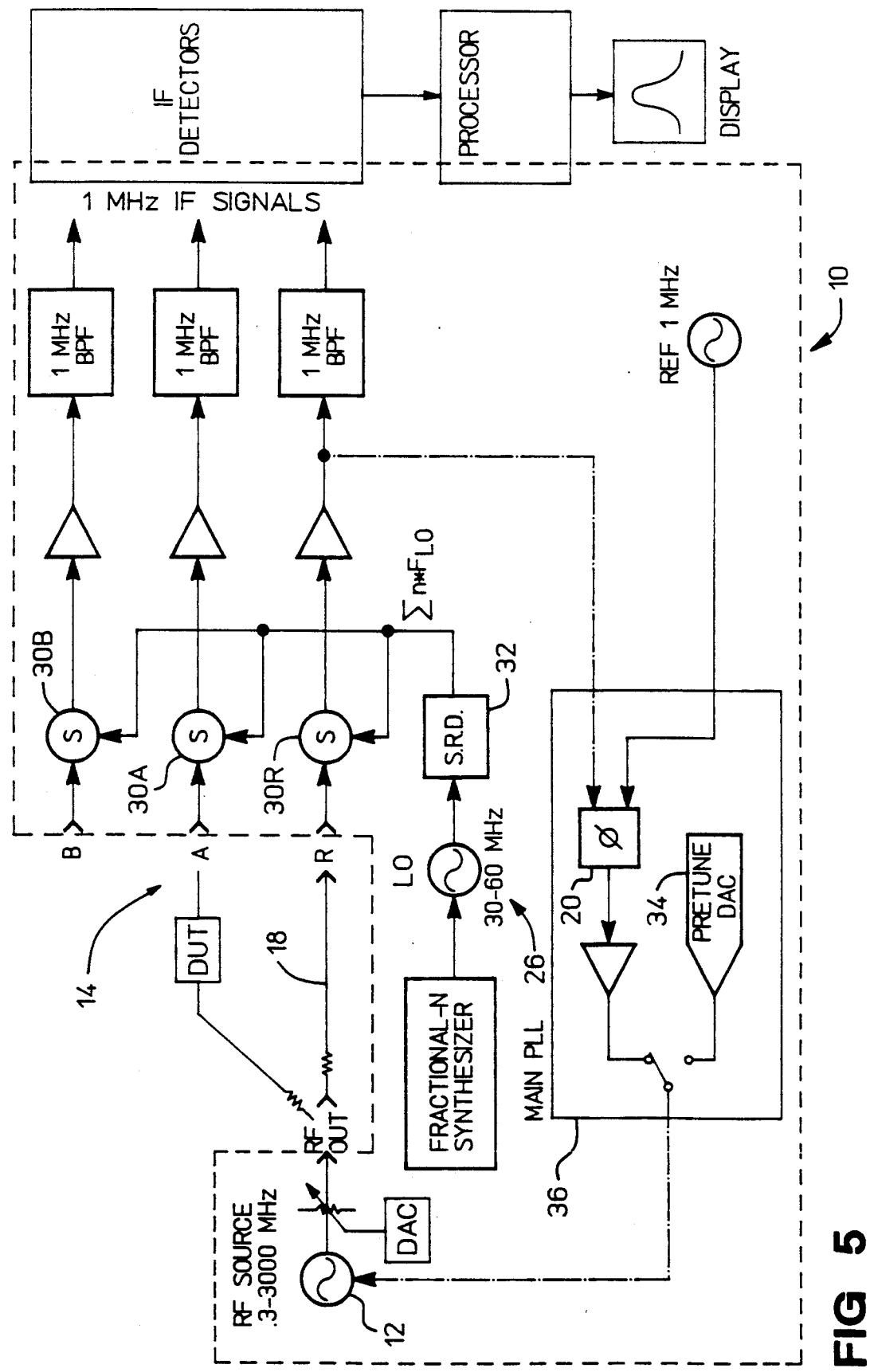
FIG. 5 is a more detailed block diagram of the vector network analyzer shown in FIG. 1.

One basic modification to the embodiment of FIGS. 1 and 2 is shown in FIG. 4. In the standard mode (FIG. 1, shown in more detail in FIG. 5), the signal from the RF signal source 12 is split, as shown in FIG. 5. A portion of the signal is fed directly to the reference (R) channel 18 of the vector network analyzer 10. The other part of the signal is applied to the DUT. The output of the DUT is then connected to channel A of the vector network analyzer 10. A third channel B is also available for more elaborate measurements, such as measuring the input characteristics of the DUT, or the gain characteristics of a second DUT.

In FIG. 4, the local oscillator 26 is no longer controlled by the fractional-N synthesizer, but is instead controlled by the output of the main phase lock loop 36. This means that the user can use an arbitrary external source 12' and connect it, either directly or through various DUTs, to the inputs of the vector network analyzer 10. The main phase lock loop 36, still operating off the R input IF signal, will now drive the local oscillator until Equation 1 is again satisfied. Only now, instead of Flo determining the Frf, the external Frf determines the Flo.

The main advantages of the vector network analyzer 10 are as follows. It can measure the amplitude of the harmonic components of the RF signals coming into one of the three receiver channels. And it can perform this measurement in "real-time" over a broad range of frequencies. If the analyzer is used in its power sweep mode, then the harmonics generated by a DUT can be quickly measured as a function of the incident power. Since the harmonic measurement capability works in both the typical vector network analyzer mode and the external source mode, the harmonics of an external source can also be directly measured, as well as the harmonics generated by a DUT being driven by the internal source. These are all advantages over the traditional measurement using a source/spectrum analyzer, which is typically limited to a single channel measurement and requires multiple sweeps to characterize harmonic content over a range of frequencies. The addition of this harmonic measurement capability to a vector network analyzer is also a relatively small additional cost, compared to the cost of an additional source/spectrum analyzer.

Since the vector network analyzer 10 utilizes the same narrow band IF detection system as a typical network analyzer, it can measure using IF bandwidths as narrow as 10 Hz. This permits a very wide dynamic range of measurements, limited at the high end by the input sampler distortion and at the low end by the 10 Hz noise floor. This provides a significant advantage over a system designed around a scalar network analyzer that would also require multiple RF filters and be limited by a broad band noise floor. A scalar network analyzer system, due to the filtering requirements, would also be severely frequency range limited (<<octave).

Also, the vector network analyzer 10 can measure multiple channels simultaneously. Therefore, it can measure the ratio of the harmonic content between two different signals. It can also measure the relative phase of the harmonic components, a capability neither spectrum analyzers nor scalar network analyzers have. By putting a known standard nonlinearity in the reference path, the complete harmonic distortion characteristics of a DUT (both amplitude and phase) can be measured.

Since the switching in and out of harmonic measurement mode is internal and simple and requires no user altering of measurement configuration, filters, etc., it is possible to display, using a dual display mode of the vector network analyzer 10, both the fundamental gain of a DUT, as well as the harmonic distortion. Alternatively, a display of different harmonics can be provided.

Figure 6A:
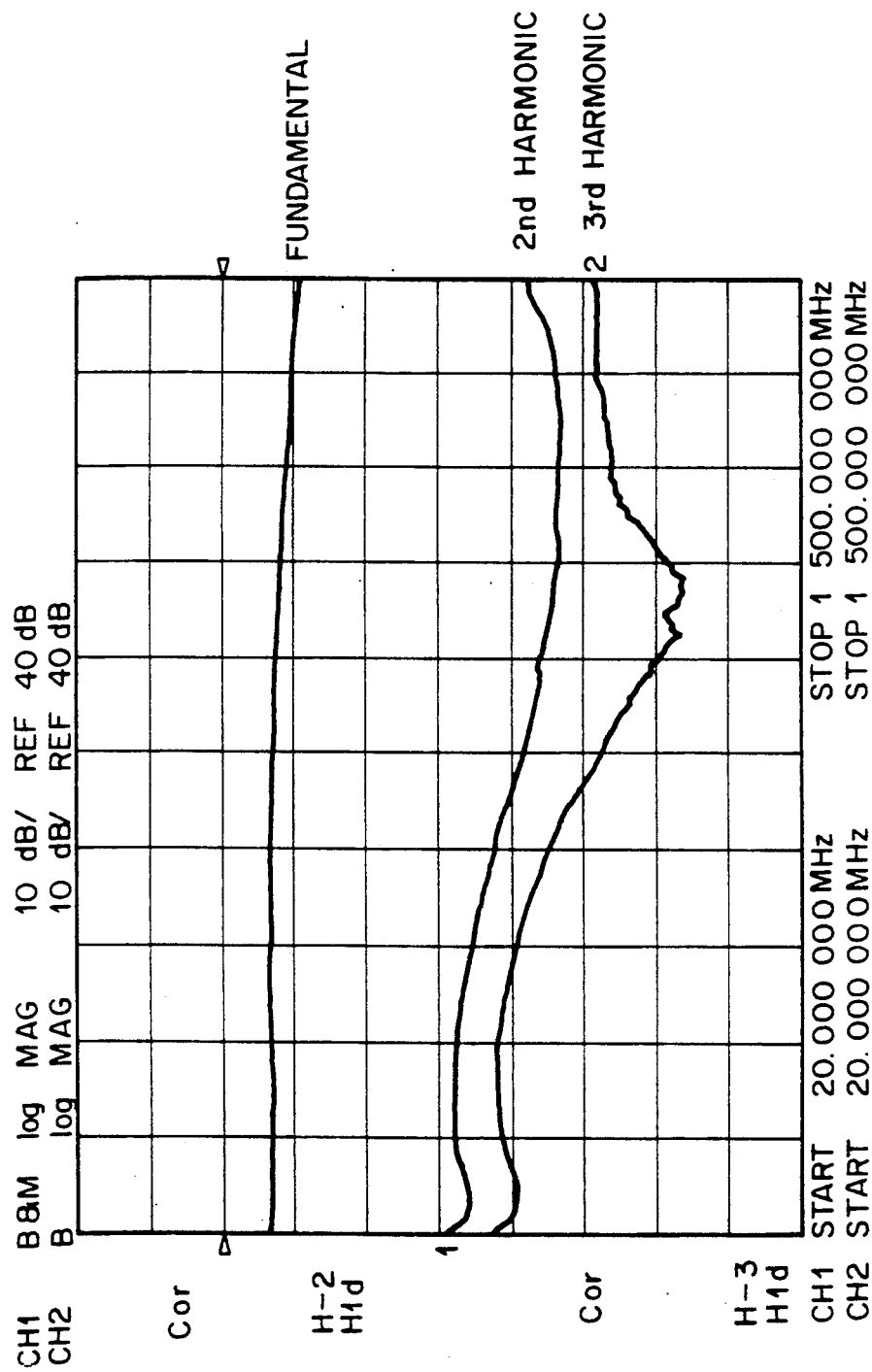
FIGS. 6A and 6B, illustrates a swept frequency amplifier measurement of absolute fundamental, 2nd, and 3rd harmonic output level (FIG. 6A) and 2nd and 3rd harmonic distortion in dBc (FIG. 6B)
Figure 6B:
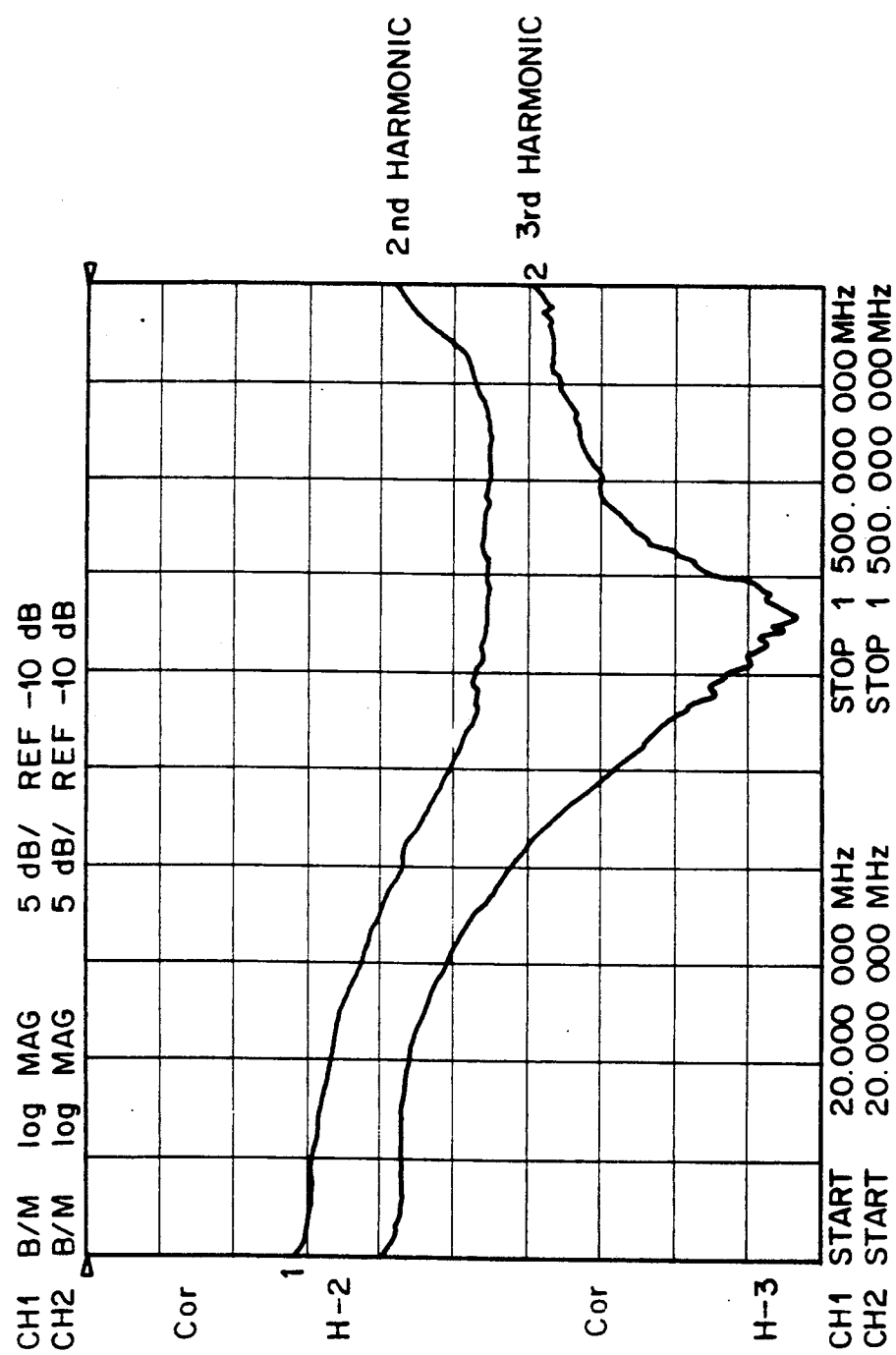

For example, with the vector network analyzer 10, a swept frequency measurement of the 2nd or 3rd harmonic of an amplifier can be performed, as shown in FIG. 6A. The difference between the harmonic to the fundamental level can also be measured. The 2nd/3rd harmonic response can be displayed directly in dBc, or dB below the fundamental or carrier, as shown in FIG. 6B.

The ability to display harmonic level versus frequency or RF power allows "real-time" tuning of harmonic distortion. Further, this swept harmonic measurement, as well as all of the traditional linear amplifier measurements, can be performed without reconnecting the DUT to a different test configuration.

Sometimes it is desired to quantify the harmonic distortion itself. When measuring a DUT that is very sensitive to absolute power level, it is important to be able to accurately set the power level at either the input or output of the DUT.

Power meters are typically used to accurately monitor absolute power level. This presents an additional level of complexity, because the RF signal source must be re-adjusted to provide the correct signal level at the input or output of the DUT. In automated production test areas, an external computer is often used to control both the vector network analyzer and the power meter.

Figure 7:
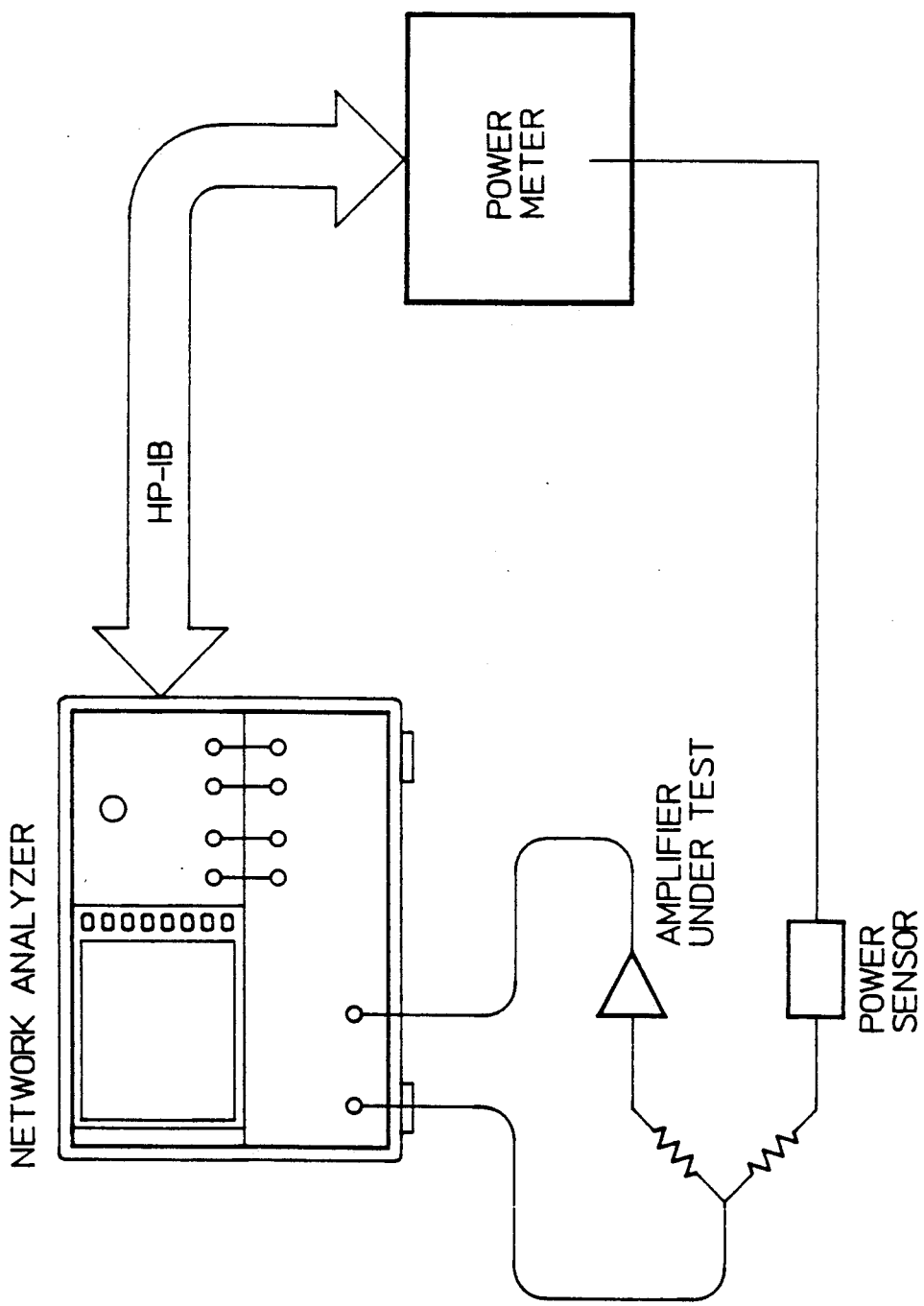
FIG. 7 shows a test configuration for setting RF input using automatic power meter calibration.
Figure 8:
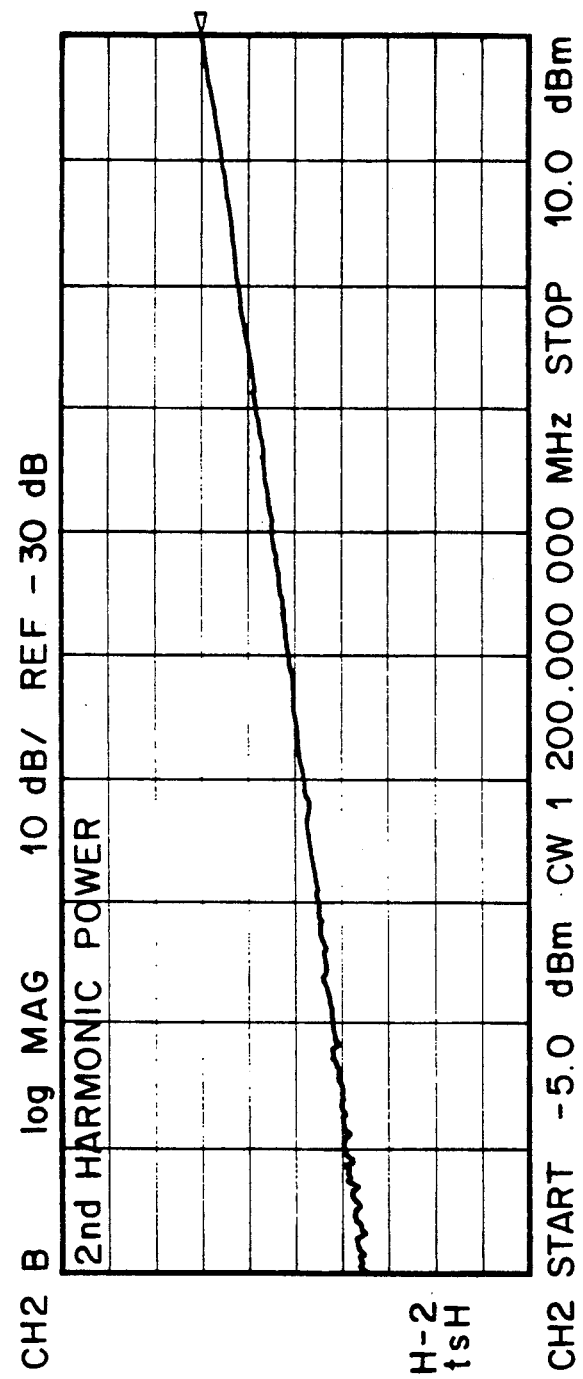
FIG. 8 illustrates a swept power measurement of a 2nd harmonic output level of an amplifier.

The vector network analyzer 10 preferably utilizes an external HP-IB power meter and controls source power directly. FIG. 7 shows a typical test configuration for setting a precise leveled input power at the input of the DUT. FIG. 8 illustrates a measurement of 2nd harmonic power as a function of input power. Alternatively, a precise leveled output power at the output of the DUT can be set. This is often desirable, since distortion primarily occurs in the final stages of a DUT.

Figure 9:
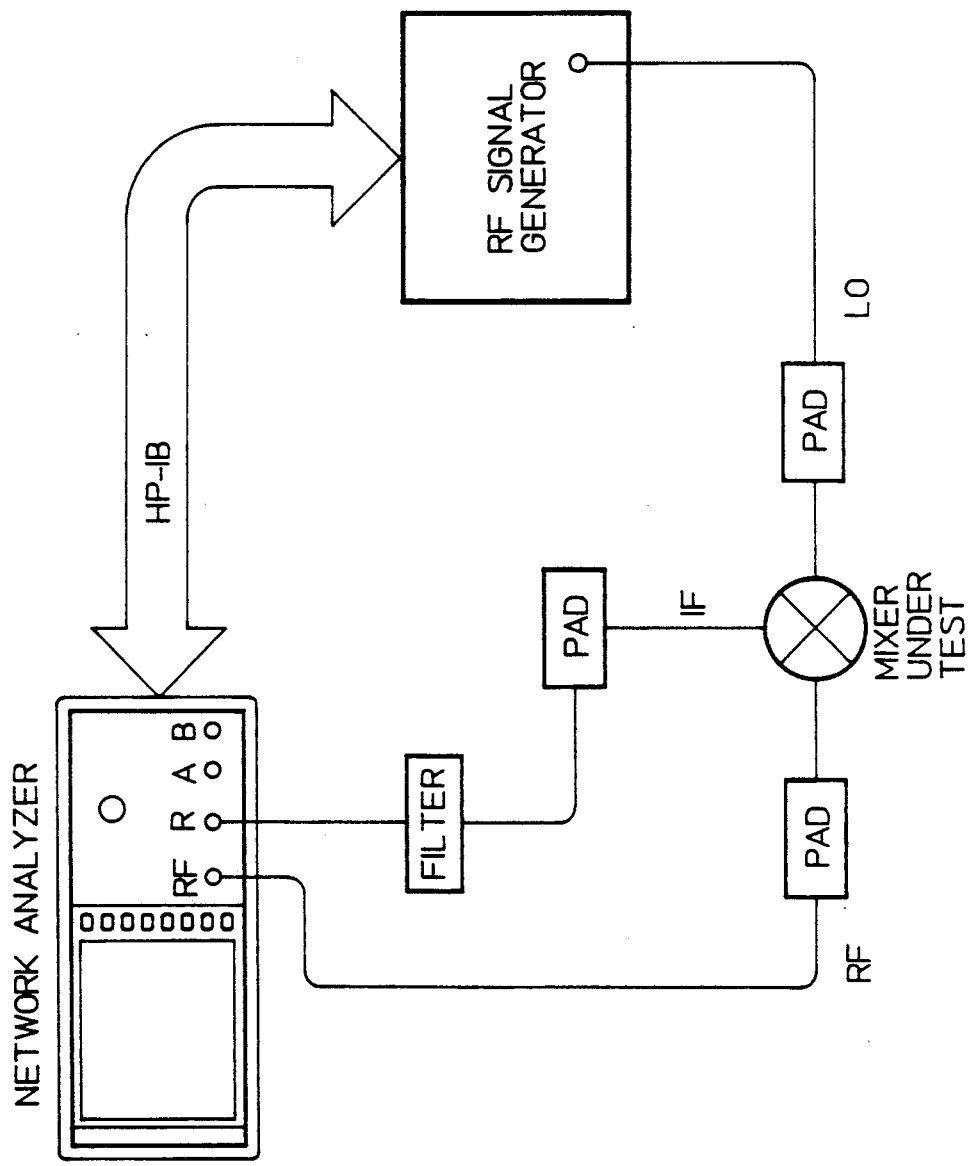
FIG. 9 shows a test set-up for measurement of conversion loss of a mixer.
Figure 10:
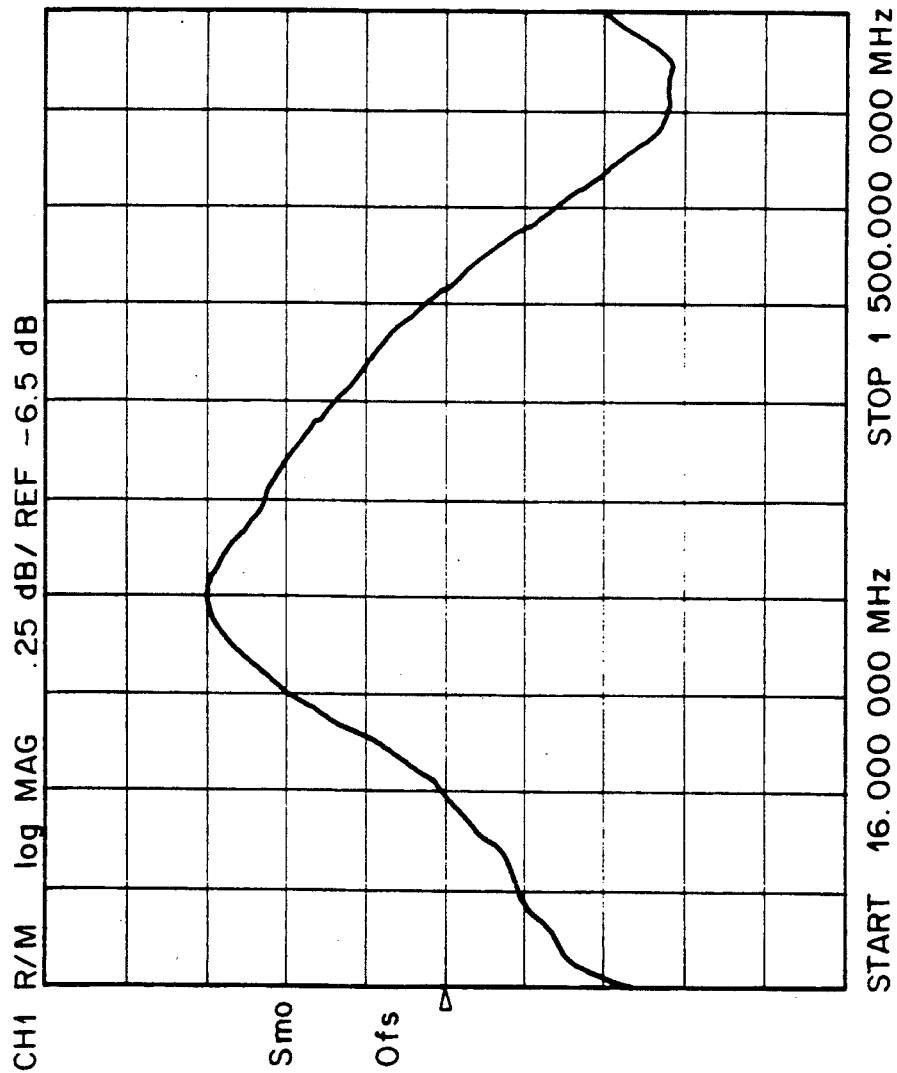
FIG. 10 shows a conversion loss measurement.
Figure 11:
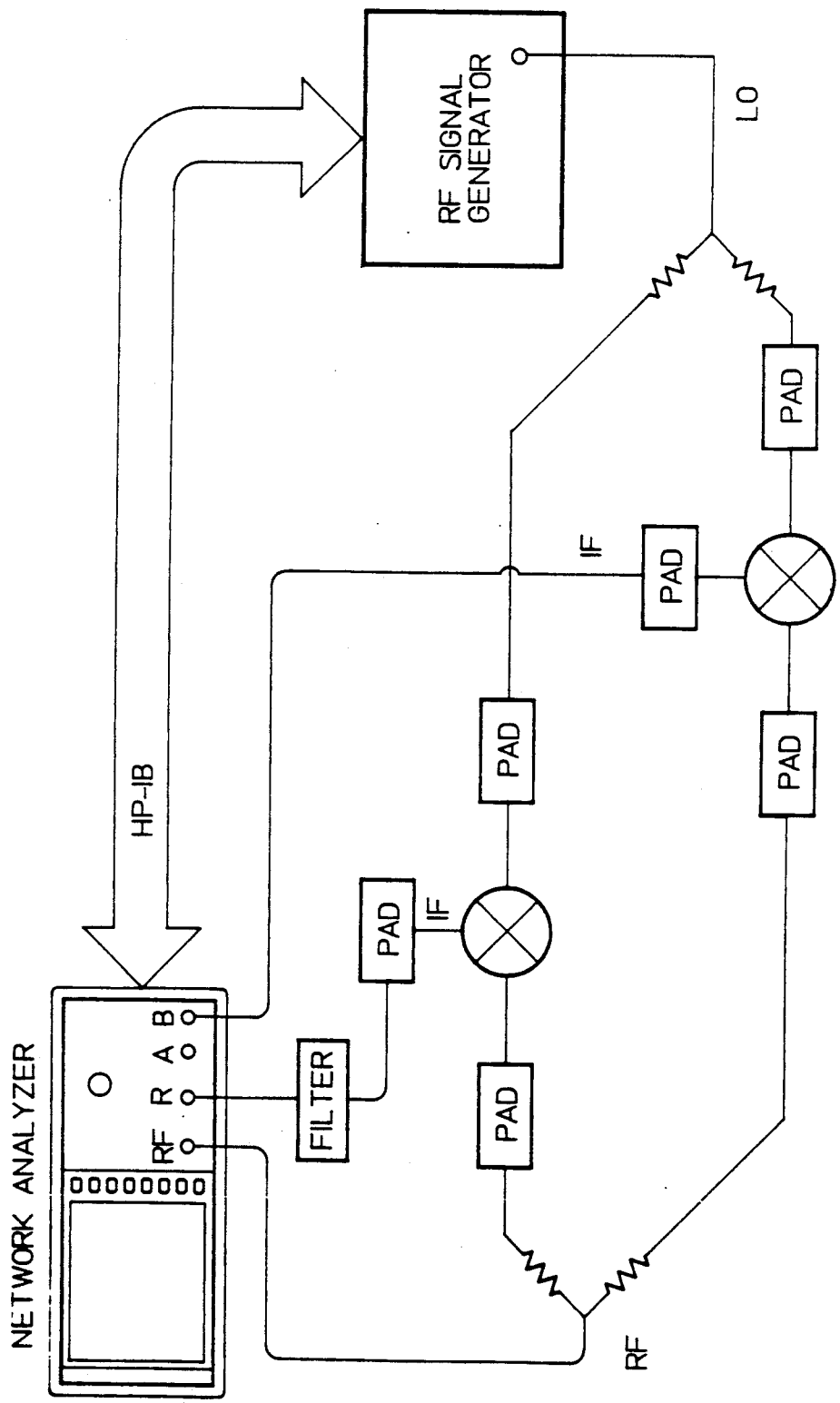
FIG. 11 shows a test set-up for measurement of tracking between two mixers.

A different modification to the vector network analyzer shown in FIG. 1 is needed to measure a frequency translating device, such as a mixer. Such a configuration is shown in FIG. 9. An external frequency source is needed to generate the local oscillator signal of the mixer. The internal source of the vector network analyzer 10 can be used as the RF stimulus for the mixer with all of the receiver input channels tuned to the output IF of the mixer (RF minus LO product only). In this case, the RF signal source of the vector network analyzer 10 is offset from the receiver by the local oscillator frequency fed to the mixer. FIG. 10 shows the resulting mixer conversion loss measurement. FIG. 11 shows how to use this invention to measure tracking between 2 mixers, both magnitude and phase.

The frequency relationship used with frequency translation devices is:

$$F_{MIXERIF} = F_{RF} - F_{EXTLO} = N*F_{LO} + F_{IF} \qquad (3)$$

When the internal RF signal source is used to supply $F_{RF}$ to the DUT, the $F_{EXTLO}$ frequency is entered into the vector network analyzer 10 as the offset frequency. This allows the analyzer to pretune the internal RF signal source properly such that the comb tooth number N is precisely known.

The foregoing description is offered primarily for purposes of illustration. While a variety of embodiments has been disclosed, it will be readily apparent to those skilled in the art that numerous other modifications and variations not mentioned above can still be made without departing from the spirit and scope of the invention as claimed below.

What is claimed is:

1. A method for detecting harmonics produced by a device under test (DUT) having at least one input and at least one output, comprising the steps of:
generating a stimulus;
applying the stimulus to the at least one input of the DUT;
applying the stimulus to a reference channel to provide a reference channel signal;
generating a local oscillator signal;
generating harmonics of the local oscillator signal frequency;
downconverting the reference channel signal to a predetermined intermediate frequency signal in response to a predetermined harmonic frequency of the local oscillator signal frequency, the predetermined harmonic frequency having a harmonic number N corresponding to the Nth harmonic of the stimulus appearing in the response at the at least one output of the DUT;
generating a reference frequency;
dividing the reference frequency by the harmonic number N;
detecting a phase of the divided reference frequency with respect to a phase of the predetermined intermediate frequency signal in the reference channel to generate an error signal;
using the error signal to accurately phase lock the stimulus to a predetermined harmonic frequency of the local oscillator frequency; and
determining the presence of an Nth harmonic appearing in the response of the DUT by downconverting the response appearing at the at least one output of the DUT in response to the Nth harmonic of the local oscillator signal to detect the presence of an intermediate frequency corresponding to:

$$Fif = Frf - N*Flo$$

where Fif is the intermediate frequency of the downconverted response, Frf is the frequency of the stimulus, Flo is the local oscillator signal frequency, and N is the harmonic number of the local oscillator signal frequency being used for downconverting the response appearing at the at least one output of the DUT.

2. The method of claim 1, further comprising the step of:
sweeping the frequency of the local oscillator signal;
thereby causing the frequency of the stimulus to be swept over a range of frequencies from a start frequency to a stop frequency.

3. The method of claim 2 wherein the swept frequency stimulus is adjusted to produce the predetermined intermediate frequency over the entire range of the swept frequency stimulus by the steps of:
setting the local oscillator signal frequency to an initial frequency;
pretuning the swept frequency stimulus to a frequency approximately equal to the start frequency of the range of the swept frequency stimulus; and
obtaining phase lock between the swept frequency stimulus and the local oscillator signal.

4. The method of claim 1, further comprising the step of:
measuring a magnitude of a detected intermediate frequency signal corresponding to a harmonic of the stimulus appearing in the response at the at least one output of the DUT.

5. The method of claim 1, further comprising the step of:
measuring a phase of a detected intermediate frequency signal corresponding to a harmonic of the stimulus appearing in the response at the at least one output of the DUT with respect to a phase of the stimulus.

6. The method of claim 4, further comprising:
comparing measurements from a power meter with measurements when measuring a fundamental at a frequency N*Frf and compensating for a shift in Flo due to change in intermediate frequency from Fif to Fif/N.

7. The method of claim 1, further comprising the steps of:
offsetting the stimulus by N times the fundamental frequency of the stimulus so that the local oscillator signal is the same as for a harmonic measurement; and
dividing the reference frequency by one so that the stimulus is at the frequency where the harmonic will be detected so that the stimulus and the local oscillator signal are phase-locked to and detecting the fundamental to provide a harmonic measurement calibration.

8. A network analyzer system for performing harmonic measurements on a device under test (DUT) having at least one input and at least one output, the network analyzer system comprising:
a receiver having a reference channel and at least one test channel;
a source for generating a stimulus, the source having a control input and an output connected to the at least one input of the DUT and to the reference channel of the receiver;
a local oscillator for generating a local oscillator signal, the local oscillator having an output;
a harmonic generator having an input connected to the output of the local oscillator for generating multiple harmonics of the local oscillator signal frequency, the harmonic generator having an output;
reference channel downconverter means having a first input connected to the output of the source and a second input connected to the harmonic generator for producing a reference channel intermediate frequency signal, the reference channel downconverter means having an output;
test channel downconverter means having a first input connected to the at least one output of the DUT and a second input connected to the output of the harmonic generator for producing a test channel intermediate frequency signal, the test channel downconverter means having an output;
frequency reference means for generating a reference frequency, the frequency reference means having an output;
frequency divider means having an input connected to the output of the frequency reference means for dividing the reference frequency by a number N correlated to the harmonic number of the harmonic distortion caused by the DUT in response to the stimulus;

phase locking means having a first input connected to the output of the reference channel downconverter means and a second input connected to the output of the frequency divider means and responsive to the reference channel intermediate frequency signal and to the divided reference frequency for phaselocking the source by producing an error signal fed to the control input of the source;

whereby the reference channel intermediate frequency signal equals a sub-harmonic of the reference frequency so that the test channel intermediate frequency signal is fixed at a predetermined intermediate frequency; and means connected to the output of the test channel downconverter means for measuring the magnitude of the predetermined intermediate frequency.

9. The network analyzer system of claim 8, further comprising means for setting the number N as the divisor for the reference frequency.

10. The network analyzer system of claim 8 wherein the local oscillator is a swept oscillator.

11. The network analyzer system of claim 10 wherein the local oscillator is a swept fractional-N synthesizer.

12. The network analyzer system of claim 8 wherein the reference channel downconverter means and the test channel downconverter means are samplers.

13. The network analyzer system of claim 8 wherein the stimulus is swept frequency stimulus, further comprising:

means for setting the local oscillator signal frequency to an initial frequency;

means for pretuning the swept frequency stimulus to a frequency approximately equal to a start frequency of a range of the swept frequency stimulus; and means for obtaining phase lock between the swept frequency stimulus and the local oscillator signal.

14. A method for detecting harmonics produced by a device under test (DUT) having at least one input and at least one output, comprising the steps of:

generating a stimulus;

applying the stimulus to the at least one input of the DUT;

applying the stimulus to a reference channel to provide a reference channel signal;

generating a local oscillator signal;

generating harmonics of the local oscillator signal frequency;

downconverting the reference channel signal to a predetermined intermediate frequency signal in response to a predetermined harmonic frequency of the local oscillator signal frequency, the predetermined harmonic frequency having a harmonic number N corresponding to an Nth harmonic of the stimulus appearing in the response at the at least one output of the DUT;

generating a reference frequency;

detecting a phase of the reference frequency with respect to a phase of the predetermined intermediate frequency signal in the reference channel to generate an error signal;

using the error signal to accurately phase lock a predetermined harmonic frequency of the local oscillator frequency to the stimulus; and predetermining the presence of an Nth harmonic appearing in the response of the DUT by downconverting the response appearing at the at least one output of the DUT in response to the Nth harmonic of the local oscillator signal to detect the presence of an intermediate frequency corresponding to:

$$Fif = Frf - N \cdot flo$$

where Fif is the intermediate frequency of the downconverted response, Frf is the frequency of the stimulus, Flo is the local oscillator signal frequency, and N is the harmonic number of the local oscillator signal frequency being used for downconverting the response appearing at the at least one output of the DUT.

15. The method of claim 14, further comprising the step of:

sweeping the frequency of the stimulus.

16. The method of claim 14, further comprising the step of:

measuring a magnitude of a detected intermediate frequency signal corresponding to a harmonic of the stimulus appearing in the response at the at least one output of the DUT.

17. The method of claim 14, further comprising the step of:

measuring a phase of a detected intermediate frequency signal corresponding to a harmonic of the stimulus appearing in the response at the at least one output of the DUT with respect to a phase of the stimulus.

18. A network analyzer system for performing harmonic measurements on a device under test (DUT) having at least one input and at least one output, the network analyzer system comprising:

a receiver having a reference channel and at least one test channel;

a source for generating a stimulus, the source having an output connected to the at least one input of the DUT and to the reference channel of the receiver;

a local oscillator for generating a local oscillator signal, the local oscillator having a control input and an output;

a harmonic generator having an input connected to the output of the local oscillator for generating multiple harmonics of the local oscillator signal frequency, the harmonic generator having an output;

reference channel downconverter means having a first input connected to the output of the source and a second input connected to the harmonic generator for producing a reference channel intermediate frequency signal, the reference channel downconverter means having an output;

test channel downconverter means having a first input connected to the at least one output of the DUT and a second input connected to the output of the harmonic generator for producing a test channel intermediate frequency signal, the test channel downconverter means having an output;

frequency reference means for generating a reference frequency, the frequency reference means having an output;

phase locking means having a first input connected to the output of the reference channel downconverter means and a second input connected to the output of the frequency reference means and responsive to the reference channel intermediate frequency signal and to the reference frequency for phaselocking the local oscillator by producing an error signal fed to the control input of the local oscillator;

whereby the reference channel intermediate frequency signal equals a sub-harmonic of the reference frequency so that the test channel intermediate frequency signal is fixed at a predetermined intermediate frequency; and means connected to the output of the test channel downconverter means for measuring the magnitude of the predetermined intermediate frequency.

19. The network analyzer system of claim 18 wherein the stimulus is a swept frequency stimulus, further comprising:

means for setting the stimulus frequency to an initial frequency;

means for pretuning the local oscillator signal frequency to a frequency approximately equal to a start frequency of a range of the swept frequency stimulus; and means for obtaining phase lock between the swept frequency stimulus and the local oscillator signal.

20. A method for measuring conversion loss of a mixer having an RF input, an LO input, and an output, comprising the steps of:

generating an RF stimulus having a frequency $F_{RF}$;

applying the RF stimulus to the RF input of the mixer;

generating an external local oscillator signal having a frequency $F_{EXTLO}$;

applying the local oscillator signal to the LO input of the mixer;

providing a receiver having at least one input channel;

entering the value of the frequency $F_{EXTLO}$ into the receiver;

tuning the at least one input channel of the receiver to a predetermined mixed product intermediate frequency produced by the mixer in response to the stimulus and the local oscillator signal so that the stimulus frequency $F_{RF}$ is offset from the receiver by the local oscillator signal frequency $F_{EXTLO}$ fed to the mixer to establish a frequency relationship:

$$F_{MIXERIF} = F_{RF} - F_{EXTLO} = N^*F_{LO} + F_{IF}$$

where $F_{MIXERIF}$ is the mixed product intermediate frequency produced by the mixer, $F_{RF}$ is the frequency of the RF stimulus applied to the RF input of the mixer, $F_{EXTLO}$ is the local oscillator signal frequency applied to the LO input of the mixer, N is a harmonic of a local oscillator in the receiver, $F_{LO}$ is the frequency of the local oscillator in the receiver, and $F_{IF}$ is a predetermined intermediate frequency produced by the receiver in response to the mixed product intermediate frequency produced by the mixer;

thereby allowing the RF stimulus frequency to be pretuned so that the comb tooth number N is precisely known for determining the mixed product intermediate frequency produced by the mixer in the receiver.

* * * * *